United States Patent
Kato et al.

(10) Patent No.: US 8,951,347 B2
(45) Date of Patent: *Feb. 10, 2015

(54) FILM DEPOSITION APPARATUS

(75) Inventors: Hitoshi Kato, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 944 days.

This patent is subject to a terminal disclaimer.

(21) Appl. No.: 13/128,908

(22) PCT Filed: Nov. 13, 2009

(86) PCT No.: PCT/JP2009/069398
§ 371 (c)(1),
(2), (4) Date: May 12, 2011

(87) PCT Pub. No.: WO2010/055926
PCT Pub. Date: May 20, 2010

(65) Prior Publication Data
US 2011/0214611 A1  Sep. 8, 2011

(30) Foreign Application Priority Data

Nov. 14, 2008  (JP) .................................. 2008-292508
Oct. 7, 2009  (JP) .................................. 2009-233047
Nov. 12, 2009  (JP) .................................. 2009-258644

(51) Int. Cl.
*C23C 16/455*  (2006.01)
*C23C 16/458*  (2006.01)
(Continued)

(52) U.S. Cl.
CPC ..... *C23C 16/45551* (2013.01); *C23C 16/45519* (2013.01); *C23C 16/45578* (2013.01); *C23C 16/45591* (2013.01)
USPC ........... 118/715; 118/719; 118/728; 118/729; 118/730; 156/345.33; 156/345.51; 156/345.54; 156/345.55

(58) Field of Classification Search
CPC .................... C23C 16/45574; C23C 16/45568
USPC ........................ 118/715, 728, 50, 730, 719; 156/345.31–345.32, 345.29, 345.33, 156/345.34, 345.35, 345.36, 345.26, 156/345.51, 345.55

See application file for complete search history.

(56) References Cited

U.S. PATENT DOCUMENTS 4,579,080 A * 4/1986 Martin et al. .................. 118/500
4,596,208 A * 6/1986 Wolfson et al. ............... 118/712
(Continued)

FOREIGN PATENT DOCUMENTS

JP  63-000112  1/1988
JP  1-249694  10/1989
(Continued)

OTHER PUBLICATIONS

International Search Report mailed on Dec. 22, 2009.

*Primary Examiner* — Rudy Zervigon
(74) *Attorney, Agent, or Firm* — IPUSA, PLLC

(57) ABSTRACT

A film deposition apparatus is provided with a gas nozzle in which ejection holes that eject a reaction gas are formed along a longitudinal direction of the gas nozzle, and a flow regulation member that protrudes from the gas nozzle in either one of upstream and downstream directions of a rotation direction of a turntable. In such a configuration, a separation gas flowing from an upstream side of the rotation direction to the gas nozzle is restricted from flowing between the gas nozzle and the turntable on which a substrate is placed, and the reaction gas flowing upward from the turntable is restricted by the separation gas, thereby impeding a reaction gas concentration in a process area from being lowered.

15 Claims, 30 Drawing Sheets

(51) Int. Cl.

| | |
|---|---|
| *H01L 21/306* | (2006.01) |
| *C23F 1/00* | (2006.01) |
| *C23C 16/06* | (2006.01) |
| *C23C 16/22* | (2006.01) |

(56) References Cited

U.S. PATENT DOCUMENTS

| | | | | |
|---|---|---|---|---|
| 4,681,773 | A * | 7/1987 | Bean | 427/255.5 |
| 4,858,557 | A * | 8/1989 | Pozzetti et al. | 118/725 |
| 4,879,970 | A * | 11/1989 | Barkalow et al. | 118/719 |
| 5,002,011 | A * | 3/1991 | Ohmine et al. | 118/725 |
| 5,095,300 | A * | 3/1992 | Alexander et al. | 340/686.5 |
| 5,266,119 | A * | 11/1993 | Taniguchi et al. | 118/730 |
| 5,302,209 | A * | 4/1994 | Maeda et al. | 118/719 |
| 5,314,574 | A * | 5/1994 | Takahashi | 438/706 |
| 5,338,362 | A * | 8/1994 | Imahashi | 118/719 |
| 5,540,821 | A * | 7/1996 | Tepman | 204/192.13 |
| 5,807,792 | A * | 9/1998 | Ilg et al. | 438/758 |
| 5,855,681 | A * | 1/1999 | Maydan et al. | 118/719 |
| 5,902,088 | A * | 5/1999 | Fairbairn et al. | 414/217 |
| 5,909,994 | A * | 6/1999 | Blum et al. | 414/217 |
| 5,911,834 | A * | 6/1999 | Fairbairn et al. | 134/1.3 |
| 6,120,609 | A * | 9/2000 | Selyutin et al. | 118/728 |
| 6,143,082 | A * | 11/2000 | McInerney et al. | 118/719 |
| 6,203,619 | B1 * | 3/2001 | McMillan | 118/719 |
| 6,235,656 | B1 * | 5/2001 | Clarke | 438/800 |
| 6,291,800 | B1 * | 9/2001 | Shirakawa et al. | 219/390 |
| 6,319,553 | B1 * | 11/2001 | McInerney et al. | 427/250 |
| 6,413,321 | B1 * | 7/2002 | Kim et al. | 118/725 |
| 6,562,141 | B2 * | 5/2003 | Clarke | 118/719 |
| 6,576,062 | B2 * | 6/2003 | Matsuse | 118/719 |
| 6,591,850 | B2 * | 7/2003 | Rocha-Alvarez et al. | 137/9 |
| 6,634,314 | B2 * | 10/2003 | Hwang et al. | 118/723 R |
| 6,635,115 | B1 * | 10/2003 | Fairbairn et al. | 118/719 |
| 6,752,874 | B2 * | 6/2004 | Shim et al. | 118/719 |
| 6,812,157 | B1 * | 11/2004 | Gadgil | 438/763 |
| 6,843,882 | B2 * | 1/2005 | Janakiraman et al. | 156/345.29 |
| 6,869,641 | B2 * | 3/2005 | Schmitt | 427/248.1 |
| 6,872,421 | B2 * | 3/2005 | Hwang et al. | 427/248.1 |
| 6,962,644 | B2 * | 11/2005 | Paterson et al. | 156/345.28 |
| 6,972,055 | B2 * | 12/2005 | Sferlazzo | 118/719 |
| 7,052,576 | B2 * | 5/2006 | Park et al. | 156/345.24 |
| 7,153,542 | B2 * | 12/2006 | Nguyen et al. | 427/248.1 |
| 7,276,122 | B2 * | 10/2007 | Devine et al. | 118/719 |
| 7,276,125 | B2 * | 10/2007 | Miyamoto et al. | 118/725 |
| 7,314,526 | B1 * | 1/2008 | Preti et al. | 118/715 |
| 7,422,636 | B2 * | 9/2008 | Ishizaka | 118/719 |
| 7,435,445 | B2 * | 10/2008 | Shin et al. | 427/248.1 |
| 7,566,891 | B2 * | 7/2009 | Rocha-Alvarez et al. | 250/504 R |
| 7,589,336 | B2 * | 9/2009 | Kaszuba et al. | 250/504 R |
| 7,655,092 | B2 * | 2/2010 | Fairbairn et al. | 118/719 |
| 7,663,121 | B2 * | 2/2010 | Nowak et al. | 250/455.11 |
| 7,763,115 | B2 * | 7/2010 | Hatanaka et al. | 118/719 |
| 7,777,198 | B2 * | 8/2010 | Rocha-Alvarez et al. | 250/455.11 |
| 7,794,546 | B2 * | 9/2010 | Li | 118/733 |
| 7,828,900 | B2 * | 11/2010 | Hatanaka et al. | 118/719 |
| 7,909,595 | B2 * | 3/2011 | Kaszuba et al. | 425/174.4 |
| 7,964,858 | B2 * | 6/2011 | Yang et al. | 250/504 R |
| 8,034,723 | B2 * | 10/2011 | Ohizumi et al. | 438/758 |
| 8,043,432 | B2 * | 10/2011 | Dip | 118/719 |
| 8,066,815 | B2 * | 11/2011 | Devine et al. | 118/719 |
| 8,100,081 | B1 * | 1/2012 | Henri et al. | 118/723 R |
| 8,187,679 | B2 * | 5/2012 | Dickey et al. | 427/569 |
| 8,197,636 | B2 * | 6/2012 | Shah et al. | 156/345.32 |
| 8,465,592 | B2 * | 6/2013 | Kato et al. | 118/719 |
| 8,721,790 | B2 * | 5/2014 | Kato et al. | 118/715 |
| 8,746,170 | B2 * | 6/2014 | Orito et al. | 118/663 |
| 8,845,857 | B2 * | 9/2014 | Ohizumi et al. | 156/345.55 |
| 8,895,456 | B2 * | 11/2014 | Tachibana et al. | 438/783 |
| 2001/0007244 | A1 * | 7/2001 | Matsuse | 118/719 |
| 2002/0000194 | A1 * | 1/2002 | Clarke | 118/715 |
| 2002/0034595 | A1 * | 3/2002 | Tometsuka | 427/569 |
| 2002/0056414 | A1 * | 5/2002 | Shim et al. | 118/719 |
| 2002/0088547 | A1 * | 7/2002 | Tomoyasu et al. | 156/345.47 |
| 2003/0113451 | A1 * | 6/2003 | Mayer et al. | 427/255.28 |
| 2003/0139035 | A1 * | 7/2003 | Yim et al. | 438/643 |
| 2003/0194493 | A1 * | 10/2003 | Chang et al. | 427/248.1 |
| 2004/0052972 | A1 * | 3/2004 | Schmitt | 427/569 |
| 2004/0055636 | A1 * | 3/2004 | Rocha-Alvarez et al. | 137/9 |
| 2004/0187784 | A1 * | 9/2004 | Sferlazzo | 118/719 |
| 2005/0084610 | A1 * | 4/2005 | Selitser | 427/248.1 |
| 2005/0241579 | A1 * | 11/2005 | Kidd | 118/715 |
| 2005/0247265 | A1 * | 11/2005 | Devine et al. | 118/719 |
| 2005/0268852 | A1 * | 12/2005 | Hatanaka et al. | 118/723 VE |
| 2006/0021574 | A1 * | 2/2006 | Armour et al. | 118/715 |
| 2006/0073276 | A1 | 4/2006 | Antonissen | |
| 2006/0177579 | A1 * | 8/2006 | Shin et al. | 427/248.1 |
| 2006/0213439 | A1 * | 9/2006 | Ishizaka | 118/715 |
| 2006/0249175 | A1 * | 11/2006 | Nowak et al. | 134/1 |
| 2006/0251827 | A1 * | 11/2006 | Nowak et al. | 427/558 |
| 2007/0116873 | A1 * | 5/2007 | Li et al. | 427/248.1 |
| 2007/0209590 | A1 * | 9/2007 | Li | 118/719 |
| 2007/0212484 | A1 * | 9/2007 | Li | 427/248.1 |
| 2007/0218701 | A1 | 9/2007 | Shimizu et al. | |
| 2007/0218702 | A1 * | 9/2007 | Shimizu et al. | 438/758 |
| 2007/0286963 | A1 * | 12/2007 | Rocha-Alvarez et al. | 427/508 |
| 2008/0026162 | A1 * | 1/2008 | Dickey et al. | 427/569 |
| 2008/0075858 | A1 * | 3/2008 | Koh | 427/255.28 |
| 2008/0202423 | A1 * | 8/2008 | Hatanaka et al. | 118/723 VE |
| 2008/0241384 | A1 * | 10/2008 | Jeong et al. | 427/255.29 |
| 2009/0324826 | A1 * | 12/2009 | Kato et al. | 427/255.28 |
| 2009/0324828 | A1 * | 12/2009 | Kato et al. | 427/255.28 |
| 2010/0050942 | A1 * | 3/2010 | Kato et al. | 118/730 |
| 2010/0050943 | A1 * | 3/2010 | Kato et al. | 118/730 |
| 2010/0050944 | A1 * | 3/2010 | Kato et al. | 118/730 |
| 2010/0055297 | A1 * | 3/2010 | Kato et al. | 427/8 |
| 2010/0055312 | A1 * | 3/2010 | Kato et al. | 427/255.26 |
| 2010/0055314 | A1 * | 3/2010 | Kato et al. | 427/255.28 |
| 2010/0055315 | A1 * | 3/2010 | Honma | 427/255.28 |
| 2010/0055316 | A1 * | 3/2010 | Honma | 427/255.28 |
| 2010/0055317 | A1 * | 3/2010 | Kato et al. | 427/255.28 |
| 2010/0055319 | A1 * | 3/2010 | Kato et al. | 427/255.28 |
| 2010/0055320 | A1 * | 3/2010 | Honma | 427/255.28 |
| 2010/0055351 | A1 * | 3/2010 | Kato et al. | 427/595 |
| 2010/0116210 | A1 * | 5/2010 | Kato et al. | 118/730 |
| 2010/0122710 | A1 * | 5/2010 | Kato et al. | 134/1 |
| 2010/0124610 | A1 * | 5/2010 | Aikawa et al. | 427/255.28 |
| 2010/0132614 | A1 * | 6/2010 | Kato et al. | 118/723 R |
| 2010/0132615 | A1 * | 6/2010 | Kato et al. | 118/725 |
| 2010/0136795 | A1 * | 6/2010 | Honma | 438/758 |
| 2010/0151131 | A1 * | 6/2010 | Obara et al. | 427/255.28 |
| 2010/0227046 | A1 * | 9/2010 | Kato et al. | 427/10 |
| 2010/0227059 | A1 * | 9/2010 | Kato et al. | 427/255.28 |
| 2010/0229797 | A1 * | 9/2010 | Kato et al. | 118/730 |
| 2010/0260935 | A1 * | 10/2010 | Kato et al. | 427/255.28 |
| 2010/0260936 | A1 * | 10/2010 | Kato et al. | 427/255.28 |
| 2010/0291319 | A1 * | 11/2010 | Yamashita et al. | 427/575 |
| 2011/0100489 | A1 * | 5/2011 | Orito et al. | 137/560 |
| 2011/0104395 | A1 * | 5/2011 | Kumagai et al. | 427/554 |
| 2011/0126985 | A1 * | 6/2011 | Ohizumi et al. | 156/345.55 |
| 2011/0139074 | A1 * | 6/2011 | Kato et al. | 118/730 |
| 2011/0151122 | A1 * | 6/2011 | Kato et al. | 427/255.23 |
| 2011/0155056 | A1 * | 6/2011 | Kato et al. | 118/719 |
| 2011/0155057 | A1 * | 6/2011 | Kato et al. | 118/719 |
| 2011/0159187 | A1 * | 6/2011 | Kato et al. | 427/255.26 |
| 2011/0159188 | A1 * | 6/2011 | Kato et al. | 427/255.394 |
| 2011/0159702 | A1 * | 6/2011 | Ohizumi et al. | 438/778 |
| 2012/0075460 | A1 * | 3/2012 | Aikawa et al. | 348/87 |
| 2012/0076937 | A1 * | 3/2012 | Kato et al. | 427/248.1 |
| 2012/0094011 | A1 * | 4/2012 | Hishiya et al. | 427/8 |
| 2013/0047923 | A1 * | 2/2013 | Kato et al. | 118/723 AN |
| 2013/0061804 | A1 * | 3/2013 | Enomoto et al. | 118/719 |
| 2013/0074770 | A1 * | 3/2013 | Honma | 118/719 |
| 2013/0180452 | A1 * | 7/2013 | Kato et al. | 118/719 |
| 2013/0203268 | A1 * | 8/2013 | Kato et al. | 438/778 |
| 2013/0206067 | A1 * | 8/2013 | Kato et al. | 118/719 |
| 2013/0276705 | A1 * | 10/2013 | Kato et al. | 118/725 |
| 2014/0004713 | A1 * | 1/2014 | Igeta et al. | 438/775 |
| 2014/0011369 | A1 * | 1/2014 | Kato et al. | 438/771 |
| 2014/0011370 | A1 * | 1/2014 | Kato et al. | 438/782 |
| 2014/0017905 | A1 * | 1/2014 | Kato et al. | 438/782 |
| 2014/0087564 | A1 * | 3/2014 | Shimizu et al. | 438/710 |
| 2014/0109833 | A1 * | 4/2014 | Ito et al. | 118/730 |

(56) References Cited

U.S. PATENT DOCUMENTS

| | | | |
|---|---|---|---|
| 2014/0123895 A1* | 5/2014 | Kato et al. | 118/697 |
| 2014/0199856 A1* | 7/2014 | Kato et al. | 438/782 |
| 2014/0209028 A1* | 7/2014 | Oshimo et al. | 118/730 |
| 2014/0220260 A1* | 8/2014 | Yamawaku et al. | 427/569 |
| 2014/0290578 A1* | 10/2014 | Wamura et al. | 118/725 |

FOREIGN PATENT DOCUMENTS

| | | | | |
|---|---|---|---|---|
| JP | 06053142 A | * | 2/1994 | H01L 21/205 |
| JP | 10-226599 | | 8/1998 | |
| JP | 2001-254181 | | 9/2001 | |
| JP | 2006057162 A | * | 3/2006 | |
| JP | 2007-247066 | | 9/2007 | |
| JP | 2008-516428 | | 5/2008 | |
| JP | 2010056477 A | * | 3/2010 | |
| JP | 2010059495 A | * | 3/2010 | |
| JP | 2010059496 A | * | 3/2010 | |
| JP | 2010059498 A | * | 3/2010 | |
| JP | 2010059499 A | * | 3/2010 | |
| JP | 2010062370 A | * | 3/2010 | |
| JP | 2010062371 A | * | 3/2010 | |
| JP | 2010080924 A | * | 4/2010 | |
| JP | 2010087467 A | * | 4/2010 | |
| JP | 2010135420 A | * | 6/2010 | |
| JP | 2010153805 A | * | 7/2010 | |
| JP | 2010206025 A | * | 9/2010 | |
| JP | 2010212627 A | * | 9/2010 | |
| JP | 2010219125 A | * | 9/2010 | |
| JP | 2010239102 A | * | 10/2010 | |
| JP | 2010245448 A | * | 10/2010 | |
| JP | 2010263245 A | * | 11/2010 | |
| JP | 2011103495 A | * | 5/2011 | |
| JP | 2011103496 A | * | 5/2011 | |
| JP | 2011119408 A | * | 6/2011 | |
| JP | 2011124384 A | * | 6/2011 | |
| JP | 2011134996 A | * | 7/2011 | |
| JP | 2011135003 A | * | 7/2011 | |

* cited by examiner

FIG.8
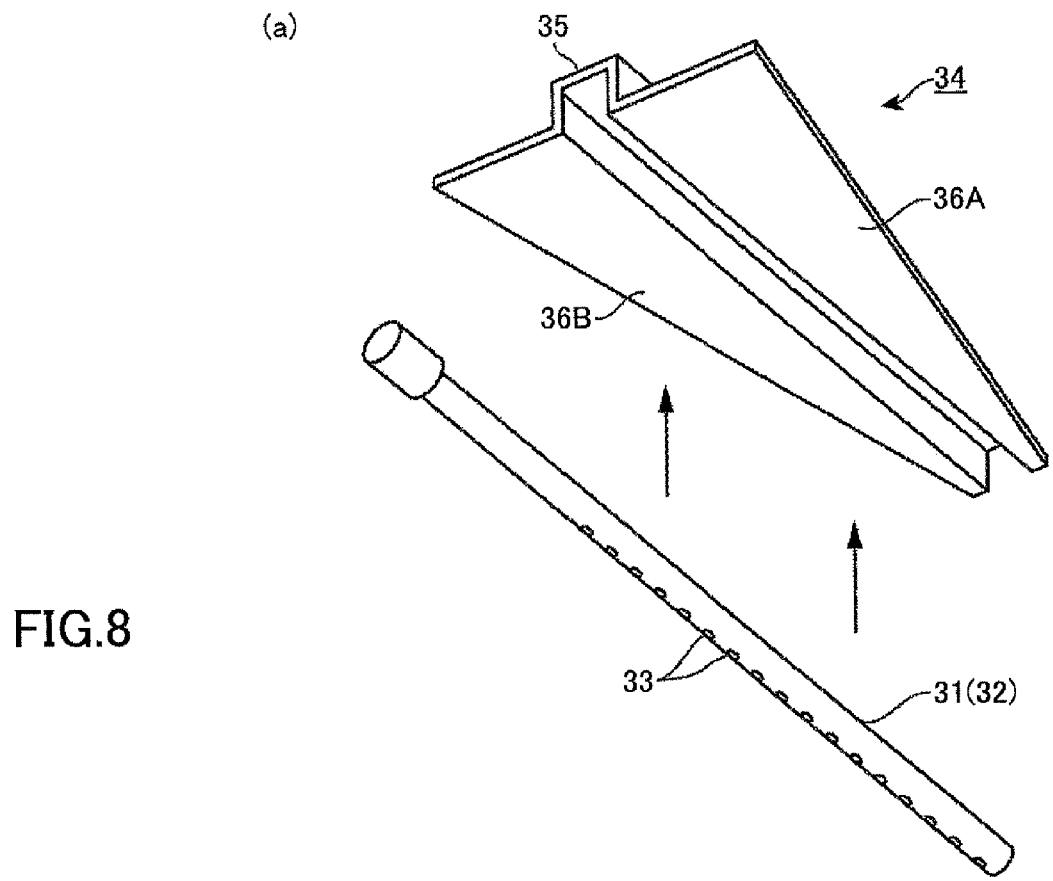
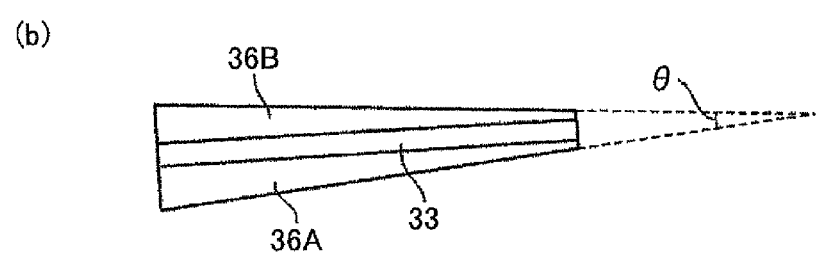

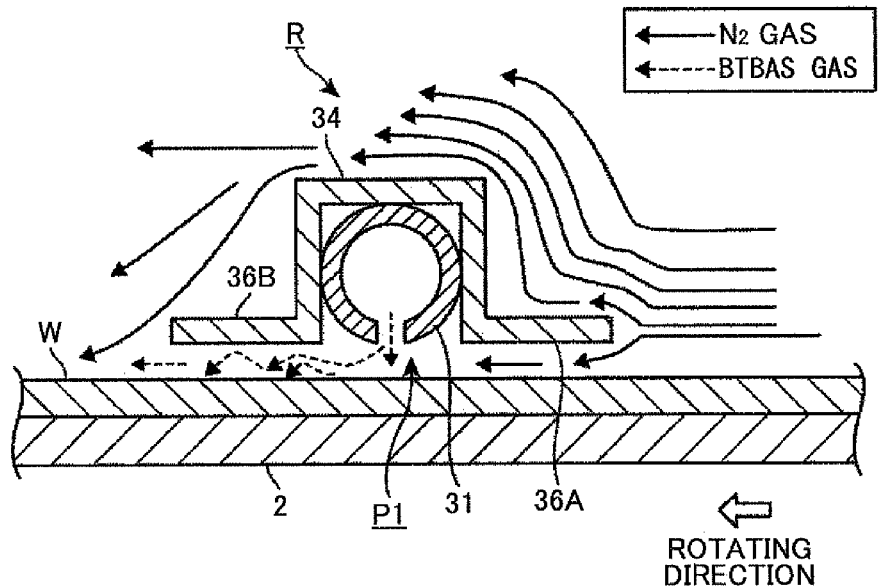
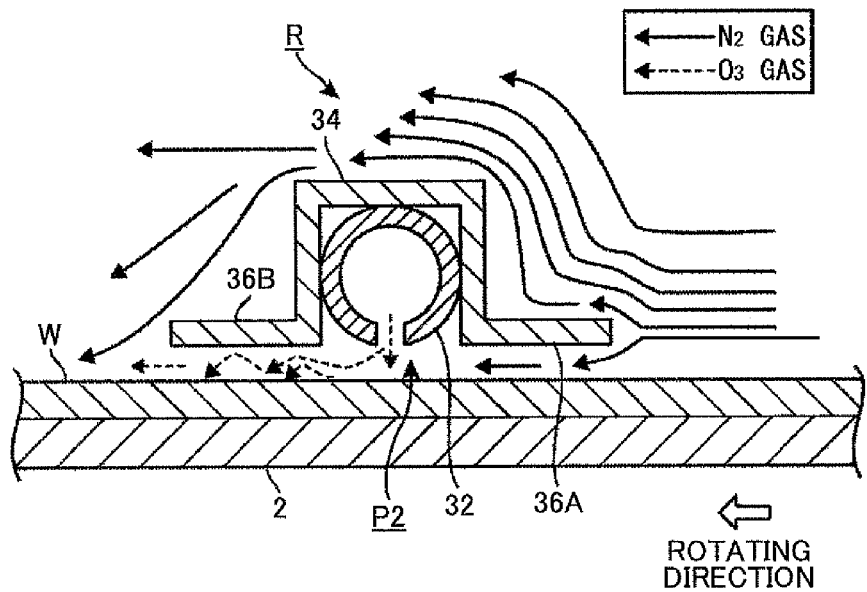
FIG.15

(a)
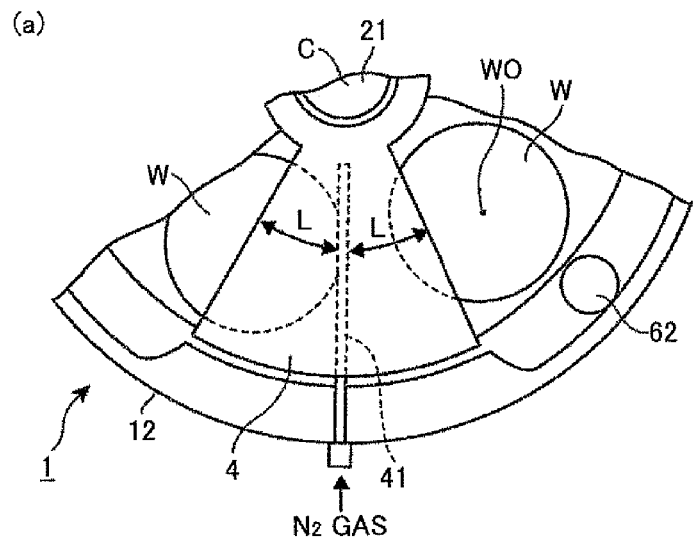
FIG.16
(b)
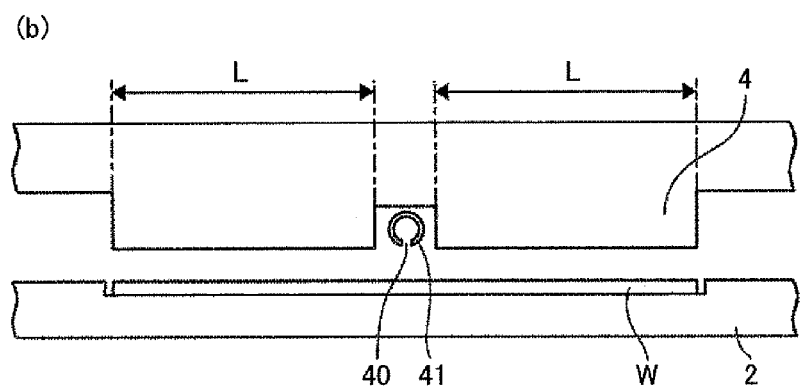

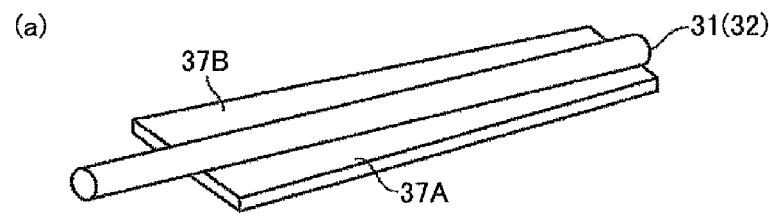
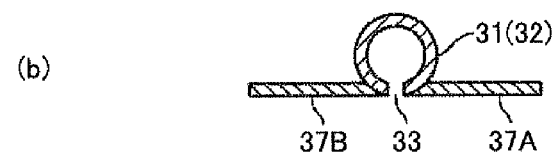
FIG.17
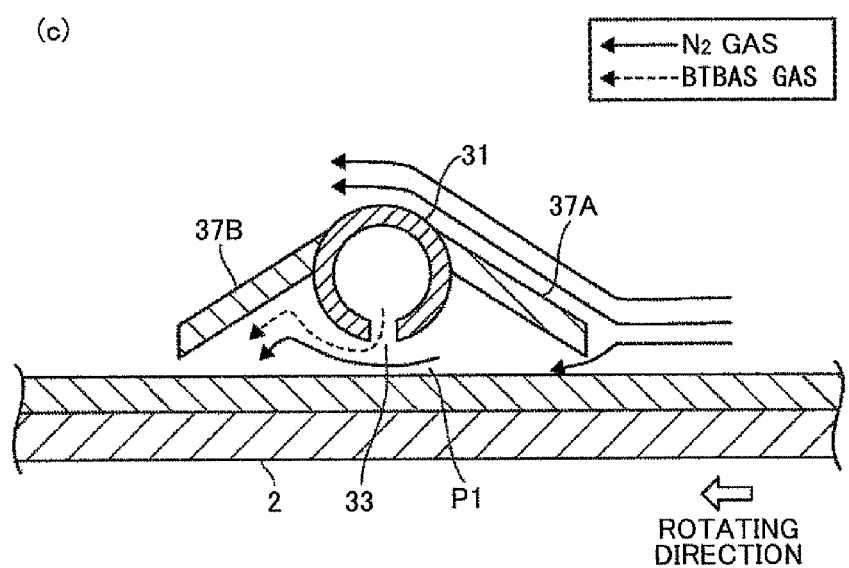

(a)
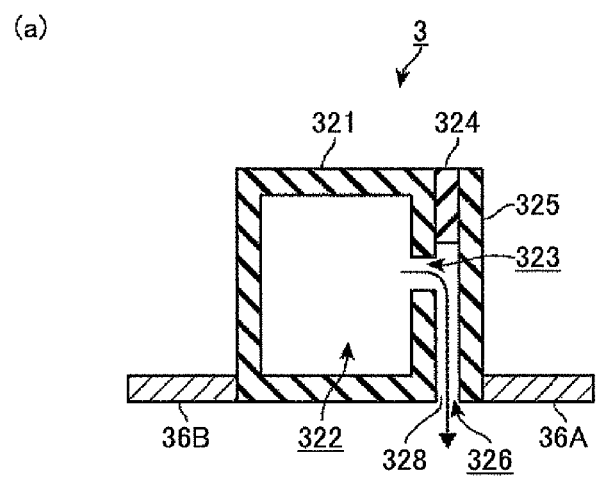
FIG.19 (b)
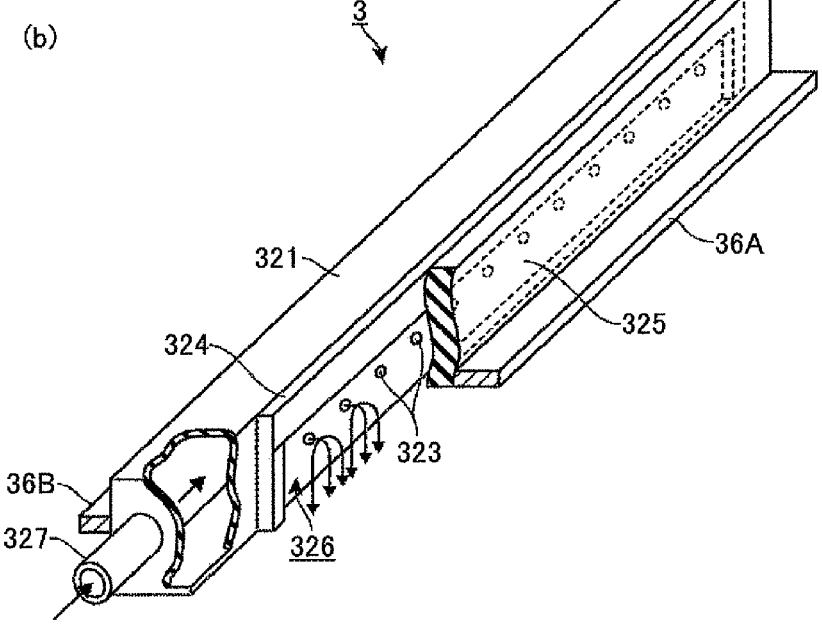

(a)
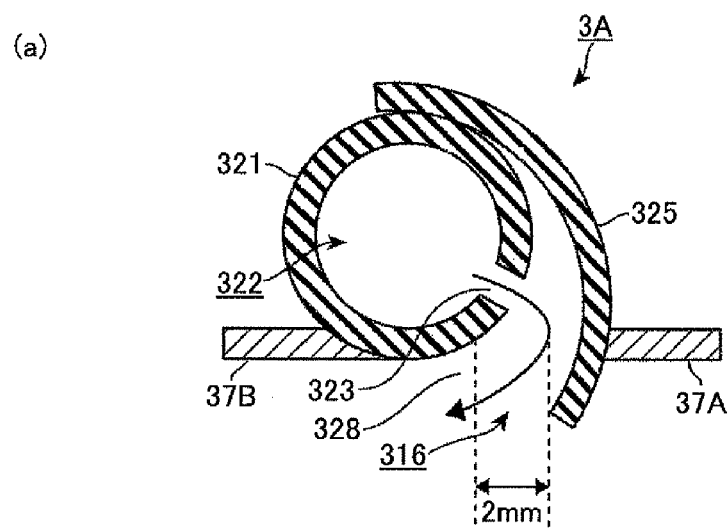
FIG.21
(b)
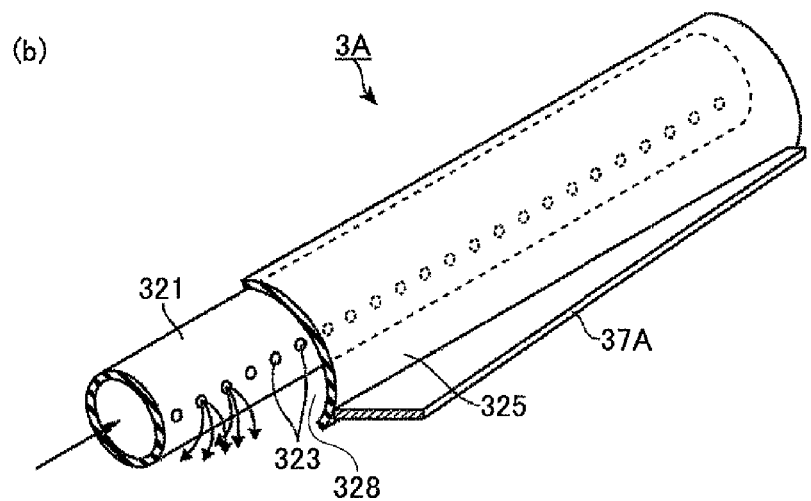

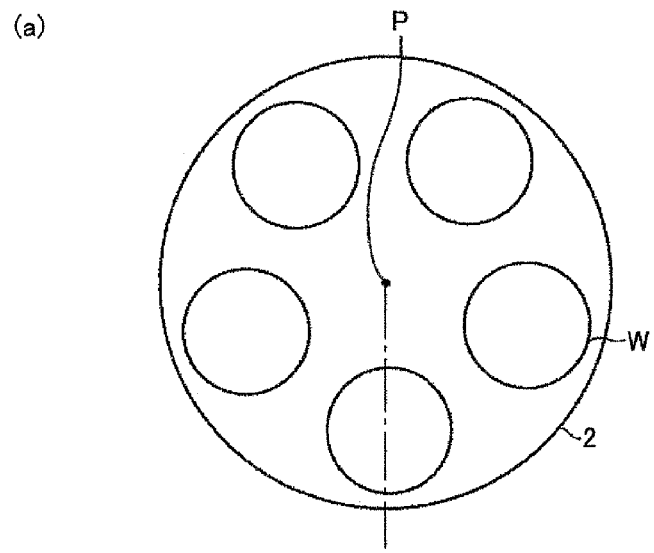
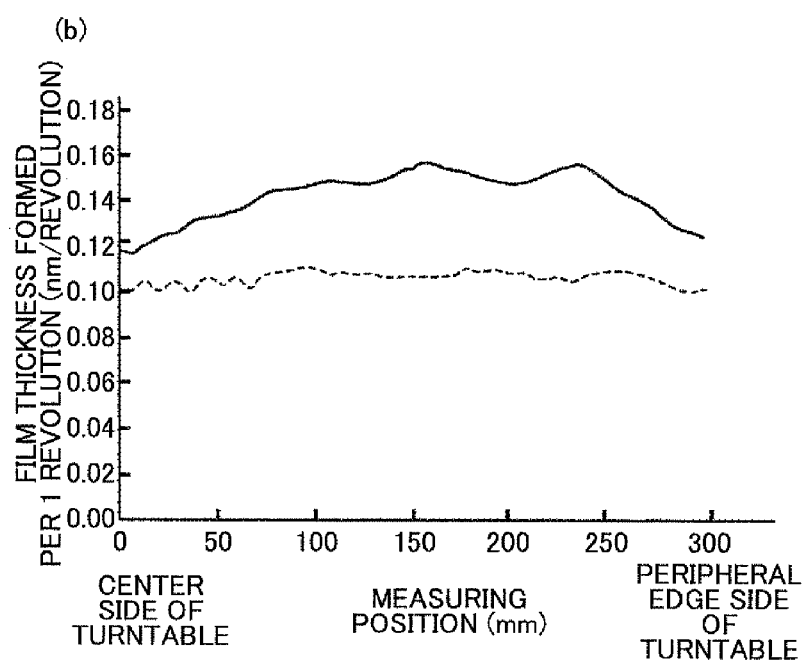
FIG.29

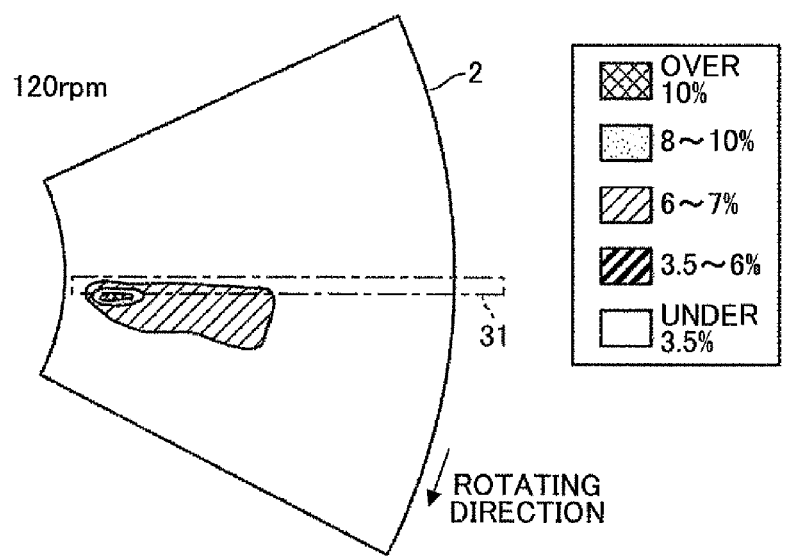
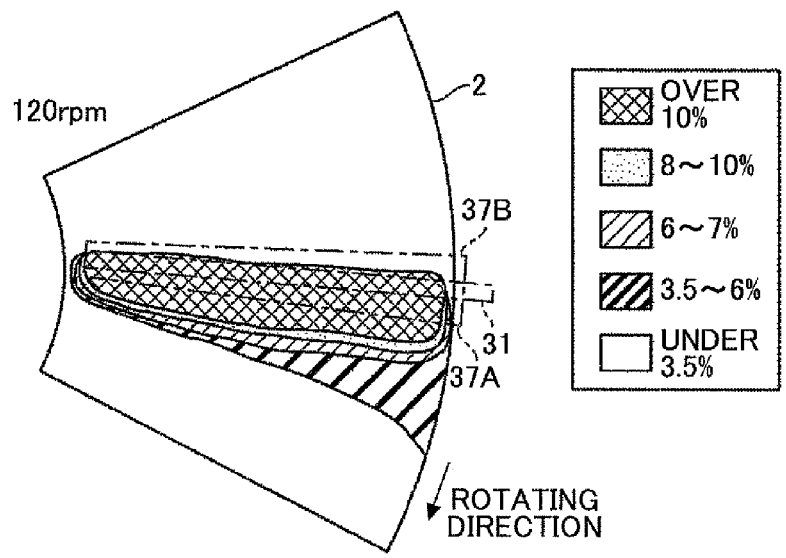
FIG.30

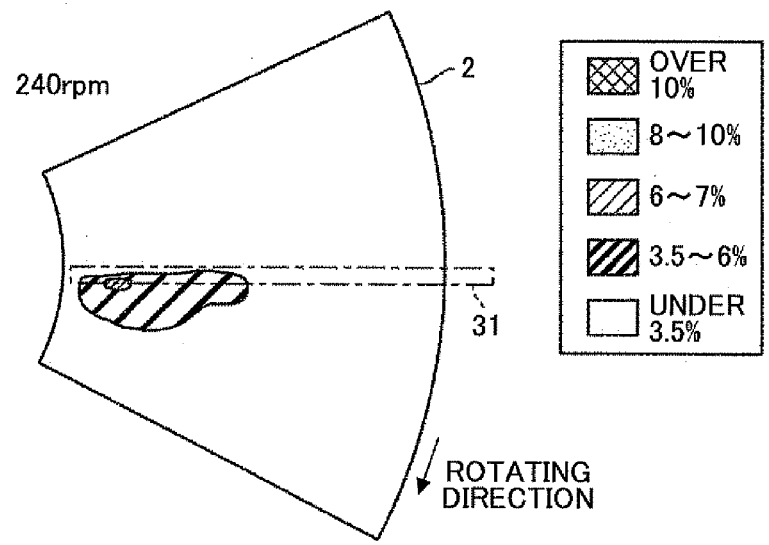
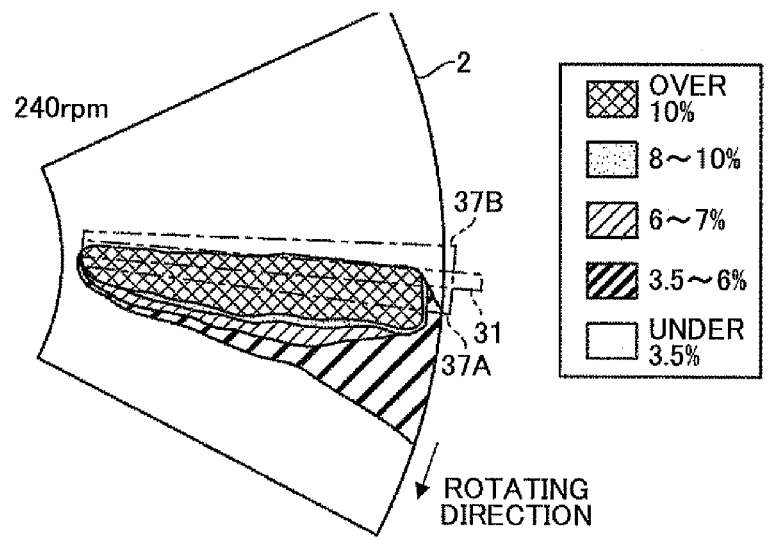
FIG.31

FILM DEPOSITION APPARATUS

TECHNICAL FIELD

The present invention relates to film deposition apparatuses for forming a thin film by sequentially supplying at least two kinds of reaction gases to a surface of a substrate and performing such a gas supply cycle a plurality of times to stack multiple layers of a reaction product.

BACKGROUND ART

As a film deposition method of a semiconductor fabrication process, there is a known process which causes a first reaction gas to be adsorbed on a surface of a semiconductor wafer (hereinafter simply referred to as a "wafer"), which is used as a substrate, under a vacuum environment, and thereafter switches the gas that is supplied to a second reaction gas, in order to form one or a plurality of atomic or molecular layers using the reaction of the two gases. Such a deposition cycle is performed a plurality of times to stack and deposit the layers on the substrate. This known process is referred to as the Atomic Layer Deposition (ALD) or Molecular Layer Deposition (MLD). According to this known process, the film thickness can be controlled with a high accuracy depending on the number of cycles performed, and a satisfactory in-plane uniformity of the film quality can be achieved. Therefore, this known process is a promising technique that can cope with further reduced film thicknesses of semiconductor devices.

Such a film deposition method may be used to deposit a dielectric film having a high dielectric constant for use as a gate oxide film, for example. When silicon dioxide ($SiO_2$) is deposited as the gate oxide film, a bis tertiary-butylamino Silane (BTBAS) gas or the like is used as a first reaction gas (or source gas) and an ozone gas or the like is used as a second gas (or oxidation gas).

As an apparatus for carrying out such a film deposition method, the use of a single-wafer deposition apparatus having a vacuum chamber and a shower head at a top center portion of the vacuum chamber has been under consideration. In such a film deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long processing time because the number of cycles may reach several hundred. Therefore, a film deposition method and a film deposition apparatus that can achieve a high throughput are desired.

Under these circumstances, film deposition apparatuses having a vacuum chamber and a turntable that holds a plurality of wafers along a rotation direction have been considered to perform the ALD or MLD. More particularly, in such film deposition apparatuses, for example, a plurality of process areas are located at mutually separated positions in the rotation direction of the turntable within the vacuum chamber, and different reaction gases are supplied to the process areas to perform the film deposition process. In addition, a separating region is provided between the process areas in the rotation direction, and this separating region includes a separation gas supply means for supplying a separation gas which separates or isolates the atmospheres or environments of the process areas.

When performing the film deposition process, the separation gas is supplied from the separation gas supply means and spreads on both sides in the rotation direction of the turntable, to thereby form a separation space which avoids mixing of the reaction gases by the separating region. For example, the reaction gases supplied to the process areas are exhausted via an evacuation port that is provided within the vacuum chamber, together with the separation gas which spreads on both sides in the rotation direction. By supplying the process gases to the process areas and supplying the separation gas to the separating region, while rotating the turntable to alternately repeat a process of moving the wafers on the turntable from one process area to the other and vice versa, the ALD or MLD is performed. In such film deposition apparatuses, it is unnecessary to switch the gases in the processing atmosphere, and a high throughput can be expected because the film deposition can be made simultaneously on a plurality of wafers.

For example, Patent Document 1 proposes a film deposition apparatus with a vacuum chamber which has a flat cylinder shape and is divided into right and left areas. A separation gas outlet port is provided between the right semi-circular contour of the right area and the left semi-circular contour of the left area, that is, at a diametrical area of the vacuum chamber. In addition, Patent Document 2, for example, proposes a film deposition apparatus having a wafer support member (or turntable) which supports four wafers at equal distances along the rotation direction thereof, a first reaction gas ejection nozzle and a second reaction gas ejection nozzle which oppose the wafer support member and are arranged at equal distances along the rotation direction, and a separation gas nozzle is arranged between the first and second reaction gas nozzles. The film deposition process is performed by rotating the wafer support member horizontally. However, according to these proposed film deposition apparatuses, there is a problem in that the concentration of the reaction gas and the contact time with respect to the wafer are reduced in the process area as will be described later, to thereby reduce the film deposition rate with respect to the wafer; such a problem is not recognized, and a solution to this problem is not provided.

Furthermore, Patent Documents 3, 4, and 5 propose film deposition apparatuses that perform an atomic layer Chemical Vapor Deposition (CVD) to cause a plurality of gases to alternately be adsorbed on a target (corresponding to wafer), by rotating a susceptor which supports the wafer and supplying the source gas and the purge gas from above the susceptor. Patent Document 3 also proposes providing partition walls that extend in a radial direction from a center of the chamber, and gas ejection holes that are provided below the partition walls in order to supply the source gases or the purge gas to the susceptor, so that an inert gas is ejected from gas ejection holes to generate a gas curtain. However, even in this example, a problem of a reduced film deposition rate is not recognized, and thus cannot be solved.

Moreover, Patent Document 6 proposes an ALD apparatus that is provided with a turntable on the surface of which plural wafers are arranged along a rotation direction, and a chamber upper body that opposes the turntable. Plural suction zones (or supplying holes) that extend in radial directions of the turntable and supply different gases are provided on a lower surface of the chamber upper body and arranged with circumferential intervals. Between the adjacent supplying holes, there are provided two evacuation zones (or evacuation holes) that extend in the radius direction and arranged along a circumferential direction. In the lower surface of the chamber upper body, distances of the suction zones and the evacuation holes from the turntable are equal to each other, and a flat ceiling surface is formed. Reaction gases supplied from the suction zones during rotation of the turntable flow into a gap between the ceiling surface and the turntable and are evacuated from the evacuation zones adjacent to the suction zone that supplies the corresponding reaction gas. With this, the reaction gases are partitioned in corresponding areas where the corresponding gases are supplied, thereby carrying out the ALD process or the MLD process. However, the evacuation zones adjacent to each other are positioned close to each other, so that the reaction gases that proceed from the suction zone to the corresponding evacuation zone are inter-mixed with each other, and thus by-products that cause particles in the chamber may be produced.

Patent Document 1: U.S. Pat. No. 7,153,542.
Patent Document 2: Japanese Patent Application Laid-Open Publication No. 2001-254181.
Patent Document 3: Japanese Patent Application Laid-Open Publication No. 2007-247066.
Patent Document 4: United States Patent Application Publication No. 2007/0218701.
Patent Document 5: United States Patent Application Publication No. 2007/0218702.
Patent Document 6: Published Japanese translations of PCT international publication for Patent Application No. 2008-516428 (or United States Patent Application Publication No. 2006/0073276.)

SUMMARY OF INVENTION

Problems to be Solved by the Invention

The present inventors have studied a conceivable structure of a film deposition apparatus illustrated in FIG. 1, in which a plurality of wafers are arranged on a turntable within a vacuum chamber in a rotation direction of the turntable. A description will be given of the conceivable structure of this film deposition apparatus, by referring to FIG. 1. FIG. 1 illustrates a development of the apparatus along the rotation direction of a turntable 2. In FIG. 1, a first reaction gas nozzle 31 forms a BTBAS gas supply means, and a region under the first reaction gas nozzle 31 forms a first process area P1. Separation gas nozzles 41 and 42 form separation gas supply means. The first reaction gas nozzle 31 and the separation gas nozzles 41 and 42 are provided above the turntable 2 and extend in a radial direction of the turntable 2. The first reaction gas nozzle 31 ejects the BTBAS gas downwards as a deposition gas, and the separation gas nozzles 41 and 42 eject $N_2$ gas downwards as the separation gas.

In order to prevent a pressure at a separation area D from decreasing, the ejected $N_2$ gas is not directly exhausted from the separation area D, but is exhausted after flowing towards the first process area P1. More particularly, the $N_2$ gas that flows from the separation area D towards the first process area P1 by flowing in a downstream side along the rotation direction of the turntable 2, as indicated by solid arrows in FIG. 1, rides over above the first reaction gas nozzle 31 and passes a gap R between the first reaction gas nozzle 31 and a first ceiling surface 45 above the first reaction gas nozzle 31. The $N_2$ gas further flows from the first reaction gas nozzle 31 to an evacuation port located on an outer side of the turntable 2 in the downstream side along the rotation direction, and is exhausted together with the BTBAS gas that is ejected from the first reaction gas nozzle 31.

However, the present inventors have found the following as a result of studying this film deposition apparatus. That is, in a case where the rotation speed of the turntable 2 is low, it may be regarded that molecules of the BTBAS gas saturate below the first reaction gas nozzle 31 and are caused to be adsorbed onto a wafer W due to the saturation, and thus, the turntable 2 needs to be rotated at a high rotation speed of 120 rpm, for example, in order to obtain a high throughput. But if the rotation speed of the turntable 2 is set high, the $N_2$ gas flows as indicated by solid arrows in FIG. 2. In other words, the high flow rate causes the $N_2$ gas to flow under the first reaction gas nozzle 31 and decreases the BTBAS gas concentration at the first process area P1. As a result, the adsorption of the BTBAS gas due to the saturation will not occur, and the amount of adsorption of the BTBAS molecules onto the wafer W becomes proportional to the BTBAS gas concentration at the first process area P1 and a contact time. In this case, the amount of adsorption of the BTBAS gas molecules onto the wafer W decreases because of the decrease in the BTBAS gas concentration.

In addition, from the point of view of aeromechanics, a gas flowing towards a front side of an object which receives the gas flow has a tendency of flowing around to a back side of the object where the pressure is lower. In other words, the $N_2$ gas which flows towards the first reaction gas nozzle 31 flows under the first reaction gas nozzle 31, then flows upwards when viewed from the turntable 2, and flows around to the downstream side of the first reaction gas nozzle 31 in the rotation direction. In this state, as indicated by dotted or phantom arrows in FIG. 2, the BTBAS gas ejected from the first reaction gas nozzle 31 to the first process area 21 also follows the flow of the $N_2$ gas, and is blown upwards from the turntable 2. For this reason, the BTBAS gas concentration at the first process area 21 further decreases to shorten the contact time of the BTBAS gas with the wafer W. Consequently, the amount of adsorption of the BTBAS gas molecules onto the wafer W further decreases.

For the above reasons, it is necessary to restrict the rotation speed of the turntable 2 in order to secure a sufficient contact time of the reaction gas with the wafer W and prevent the reaction gas concentration from decreasing, so that the molecules included in the reaction gas are caused to be satisfactorily adsorbed on the wafer W. But this restriction on the rotation speed of the turntable 2 may make it difficult to sufficiently improve the throughput.

The present invention has been made from the above-mentioned circumstances, and one of objects thereof is to provide a film deposition apparatus that can suppress a film deposition rate from decreasing, in a film deposition apparatus which forms a thin film by sequentially supplying a plurality of reaction gases to a surface of a substrate within a vacuum chamber to stack multiple layers of a reaction product, and includes a first process area supplied with a first reaction gas and provided along a circumferential direction of a turntable on which the substrates are arranged, a second process area supplied with a second reaction gas, and a separation area which separates or isolates atmospheres of the first and second process areas.

Means of Solving the Problems

According to one aspect of the present invention, there is provided a film deposition apparatus for forming a thin film by sequentially supplying at least two kinds of reaction gases to a surface of a substrate and performing such a gas supply cycle a plurality of times to deposit multiple layers of a reaction product in a vacuum chamber, the film deposition apparatus comprising: a turntable provided in the vacuum chamber; a substrate receiving area provided in the turntable in order for the substrate to be placed therein; a first reaction gas supplying portion and a second reaction gas supplying portion that are provided above the turntable, away from each other in a rotation direction of the turntable, and supply a first reaction gas and a second reaction gas, respectively; a separation area that is positioned between a first process area where the first reaction gas is supplied and a second process area where the second reaction gas is supplied, in order to separate atmospheres of these process areas, and includes a separation gas supplying portion that supplies a separation gas; and an evacuation port that evacuates the vacuum chamber, wherein at least one of the first reaction gas supplying portion and the second reaction gas supplying portion extends in a direction intersecting a direction along which the substrate receiving area moves, and is configured as a gas nozzle in which ejection holes for ejecting a reaction gas toward the turntable are arranged along a longitudinal direction thereof, wherein a flow space for causing the separation gas to flow therethrough is formed above the gas nozzle, and wherein the gas nozzle is provided with a flow regulation member that extends outward in at least one direction of an upstream direction and a downstream direction from the gas nozzle.

The flow regulation member extends in both directions of the upstream direction and the downstream direction from the gas nozzle. The flow regulation member is wider in a position drawing away from a center portion of the turntable. The flow regulation member has a plan view shape of a sector. The separation area is provided with ceiling surfaces that create narrow spaces that allow the separation gas to flow therethrough between the ceiling surface and the turntable, the ceiling surfaces being positioned on both sides of the separation gas supplying portion along the rotation direction. The film deposition apparatus may further comprise a center area that is positioned in a center portion of the vacuum chamber in order to separate atmospheres of the first process area and the second process area, and is provided with an ejection hole that ejects the separation gas to the surface, with the substrate receiving portions formed in the turntable. The center area is an area partitioned by a rotation center portion of the turntable and an upper portion of the vacuum chamber. The evacuation port is provided so that the reaction gases are evacuated along with the separation gas that spreads toward both sides of the separation area and the separation gas ejected from the center area through the evacuation port. The evacuation ports are provided on both sides of the separation area along the rotation direction in the plan view. The separation gas supplying portion is provided with gas ejection holes that eject the separation gas, and wherein the ejection holes are arranged from one side to the other side of a rotation center portion and a circumferential portion of the turntable. A portion in a ceiling surface of the separation area, the portion being on the outer circumferential side of the vacuum chamber, is bent in order to oppose an outer circumferential surface of the turntable, thereby constituting a part of an inner circumferential wall of the vacuum chamber, and wherein a gap between the bent portion of the ceiling surface and the outer circumferential surface of the turntable is set to a size that can provide a preventive effect of the reaction gas flowing thereinto. A portion of a ceiling surface of the separation area on the upstream side of the rotation direction of the turntable with respect to the separation gas supplying portion has a greater width along the rotation direction toward an outer circumference thereof.

According to another aspect of the present invention, there is provided a film deposition apparatus wherein a turntable on which plural substrates are placed is rotated in a vacuum chamber so that the substrates contact in turn reaction gases that are supplied to plural different process areas, thereby forming a thin film on the substrates, the film deposition apparatus comprising: a separation area that is provided between the plural process areas and supplies a separation gas that impedes different reaction gases from reacting with each other in a space away from upper surfaces of the substrates; reaction gas supplying portions that supply the corresponding reaction gases toward the substrates in the vicinities of the substrates and that are away from a ceiling of the process areas; a flow regulation member that suppresses a concentration of the reaction gas from being lowered by the separation gas that flows into the process area from the separation area and further flows into a gap between the reaction gas supplying portion and the substrate; and a gas flow passage that is provided between the ceiling of the process area and the reaction gas supplying portion, and to which the flow regulation member guides the separation gas. A height of the ceiling of the process area, from an upper surface of the substrate placed on the turntable is greater than that of a ceiling of the separation area from the substrate placed on the turntable. Heights of the ceilings of the process areas in the plural different reaction areas are determined depending on kinds of their reaction gases supplied to the process areas and amounts of gases.

Effects of the Invention

According to a film deposition apparatus of the present invention is provided with a gas nozzle serving as a reaction gas supplying portion that is provided with ejection holes formed along a longitudinal direction thereof and extends a direction intersecting a direction along which a substrate receiving portion of a turntable is moved, and a flow regulation member that extends out from the gas nozzle in at least one of an upstream and a downstream directions along a rotation direction of the turntable. A separation gas is guided by the flow regulation member to a gas flow passage that allows the separation gas to flow from one side to the other of an upstream side and a downstream side. As a result, because reduction of the reaction gas concentration due to the separation gas is suppressed, the reaction gas can be adsorbed on the substrate in the process area even when a rotation speed of the turntable is increased. Therefore, reduction in a film deposition rate can be suppressed. Alternatively, a film having high thickness uniformity can be obtained on the substrate, and film quality can be improved.

BRIEF DESCRIPTION OF THE DRAWINGS

FIG. 8 illustrates diagrams of structures of a reaction gas nozzle and a distribution member.

FIG. 15 illustrates diagrams for explaining a more detailed gas flow restricted by the distribution member.

FIG. 16 illustrates diagrams for explaining examples of dimensions of a protrusion portion used for the separation area.

FIG. 17 illustrates a perspective view and diagrams in vertical cross section of other examples of the reaction gas nozzle.

FIG. 19 illustrates a diagram in vertical cross section and a perspective view in partial cross section of a structure of still another reaction gas nozzle.

FIG. 21 illustrates a diagram in vertical cross section and a perspective view in partial cross section of a structure of still another reaction gas nozzle.

FIG. 29 illustrates diagrams for explaining a film thickness measuring range on a wafer used in the evaluation test and evaluation test results.

FIG. 30 illustrates diagrams of a gas concentration distribution in the evaluation test.

FIG. 31 illustrates diagrams for explaining the gas concentration distribution in the evaluation test.

MODE(S) FOR CARRYING OUT THE INVENTION

Figure 1:
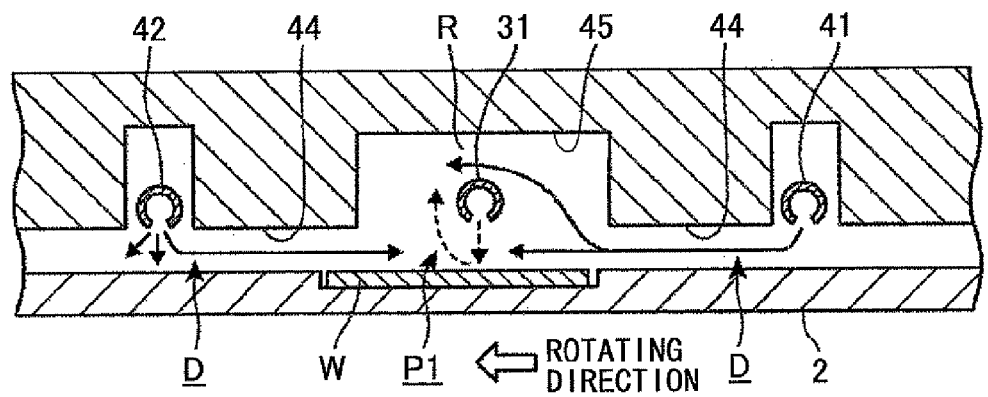
FIG. 1 is a diagram for explaining a flow of gas in a conceivable film deposition apparatus.
Figure 2:
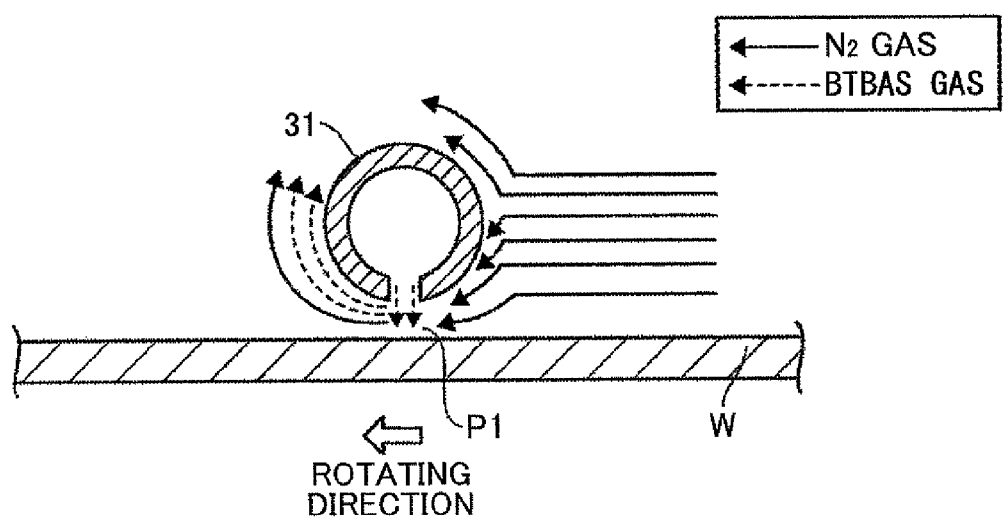
FIG. 2 is a diagram for explaining a flow of gas around a gas nozzle in more detail.
Figure 3:
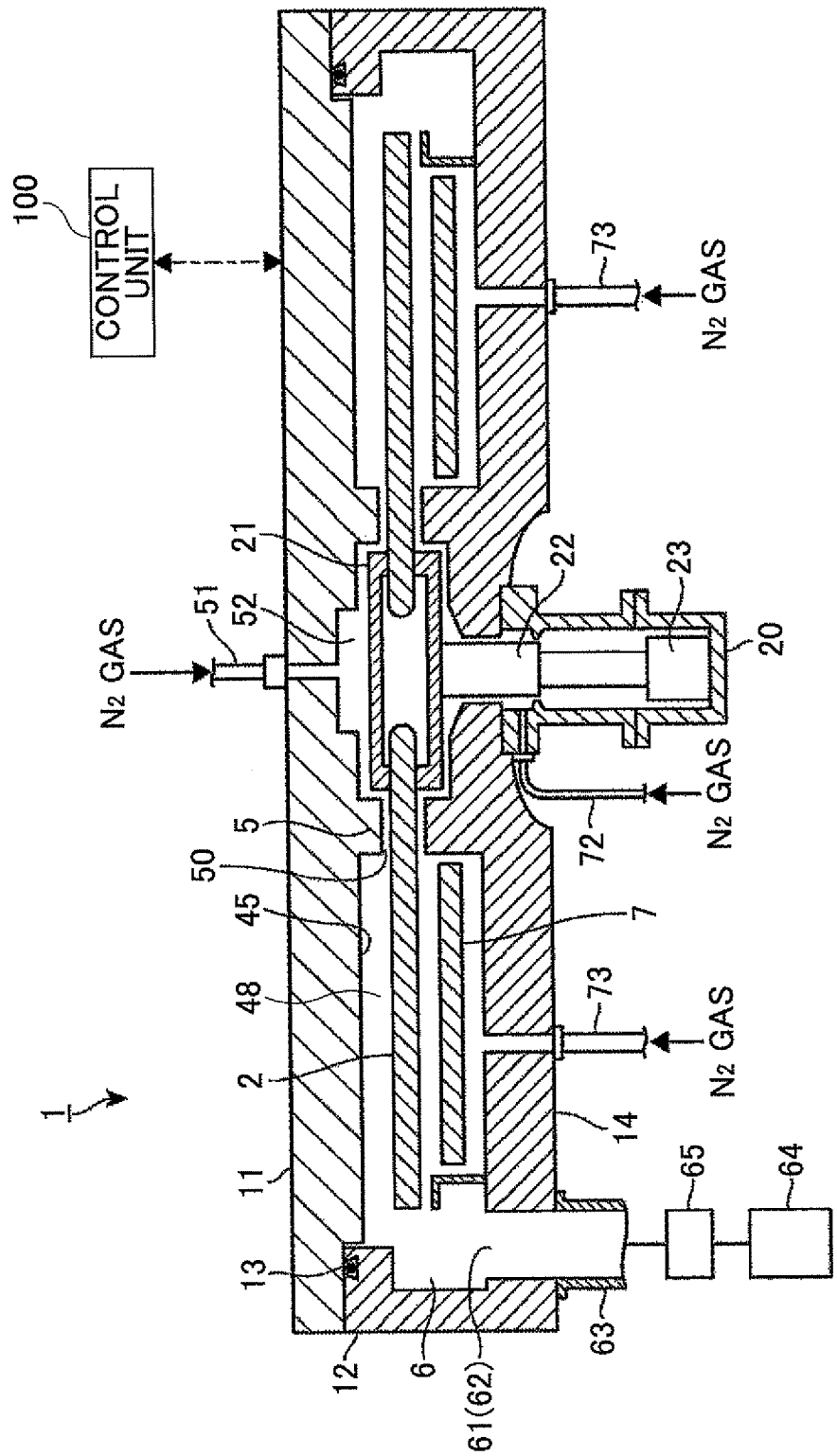
FIG. 3 is a diagram in vertical cross section illustrating a film deposition apparatus in an embodiment of the present invention.

As illustrated in FIG. 3 (cross section along a line I-I' in FIG. 5 which will be described later), a film deposition apparatus in an embodiment of the present invention includes a vacuum chamber 1 which has a flat cylinder shape which is approximately circular in the plan view and a turntable 2 which is accommodated within the vacuum chamber 1 and has a center of rotation at a central portion within the vacuum chamber 1. The vacuum chamber 1 includes a ceiling plate 11 which is removable from a chamber body 12. The ceiling plate 11 is pushed against the chamber body 12 via a suitable sealing member, such as an O-ring 13, due to the decompression state within the vacuum chamber 1, and maintains an air-tight state. When removing the ceiling plate 11 from the chamber body 12, the ceiling plate 11 is lifted upwards by a driving mechanism (not illustrated).

A center part of the turntable 2 is fixed to a cylindrical core part 21, and the core part 21 is fixed to a top end of a rotary shaft 22 that extends in a vertical direction. The rotary shaft 22 penetrates a bottom surface portion 14 of the vacuum chamber 1, and a lower end of the rotary shaft 22 is fixed to a driving part 23 that rotates the rotary shaft 22 clockwise. The rotary shaft 22 and the driving part 23 are housed in a cylindrical case body 20 which is open at a top thereof.

Figure 4:
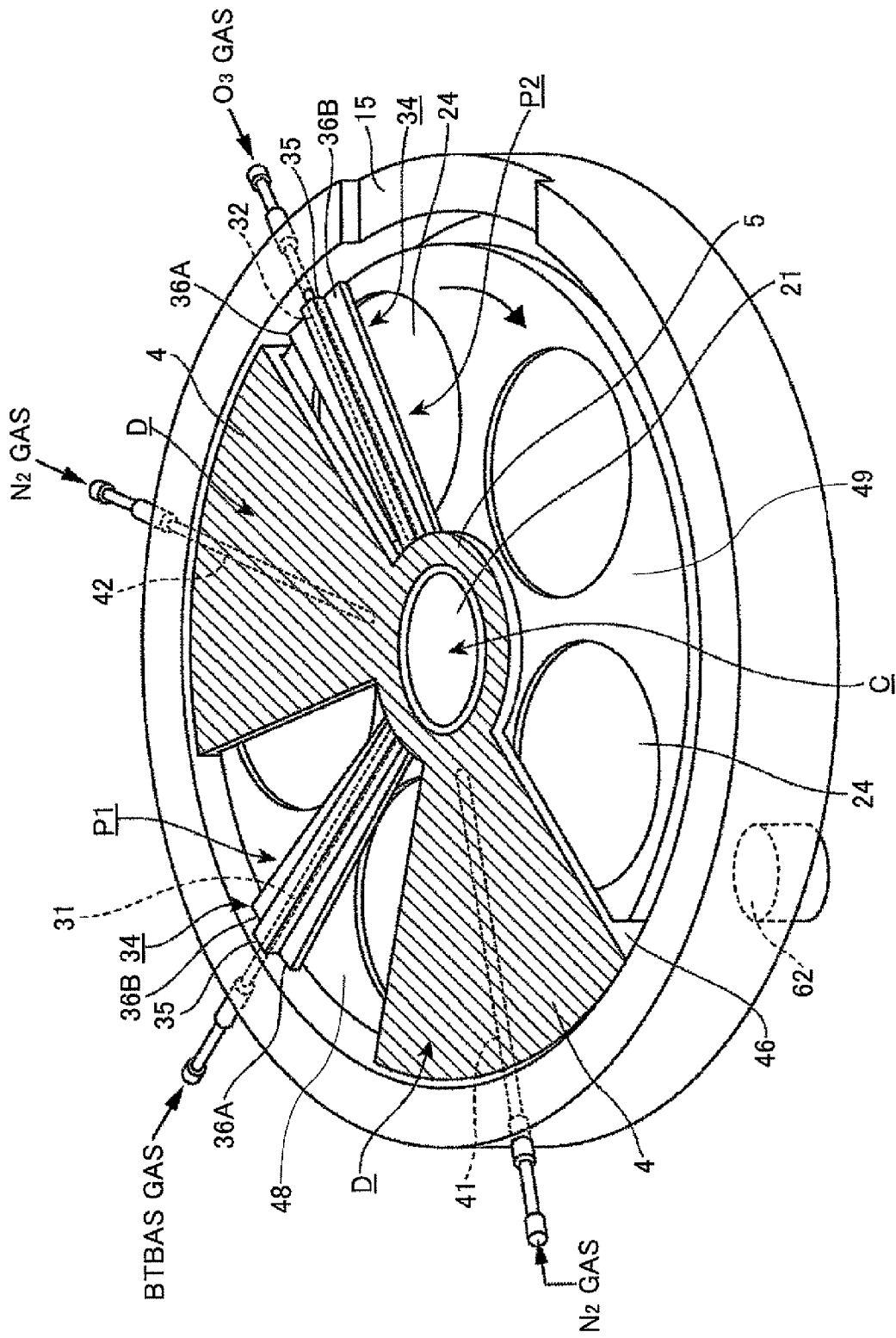
FIG. 4 is a perspective view illustrating a general structure within the film deposition apparatus of FIG. 3.
Figure 5:
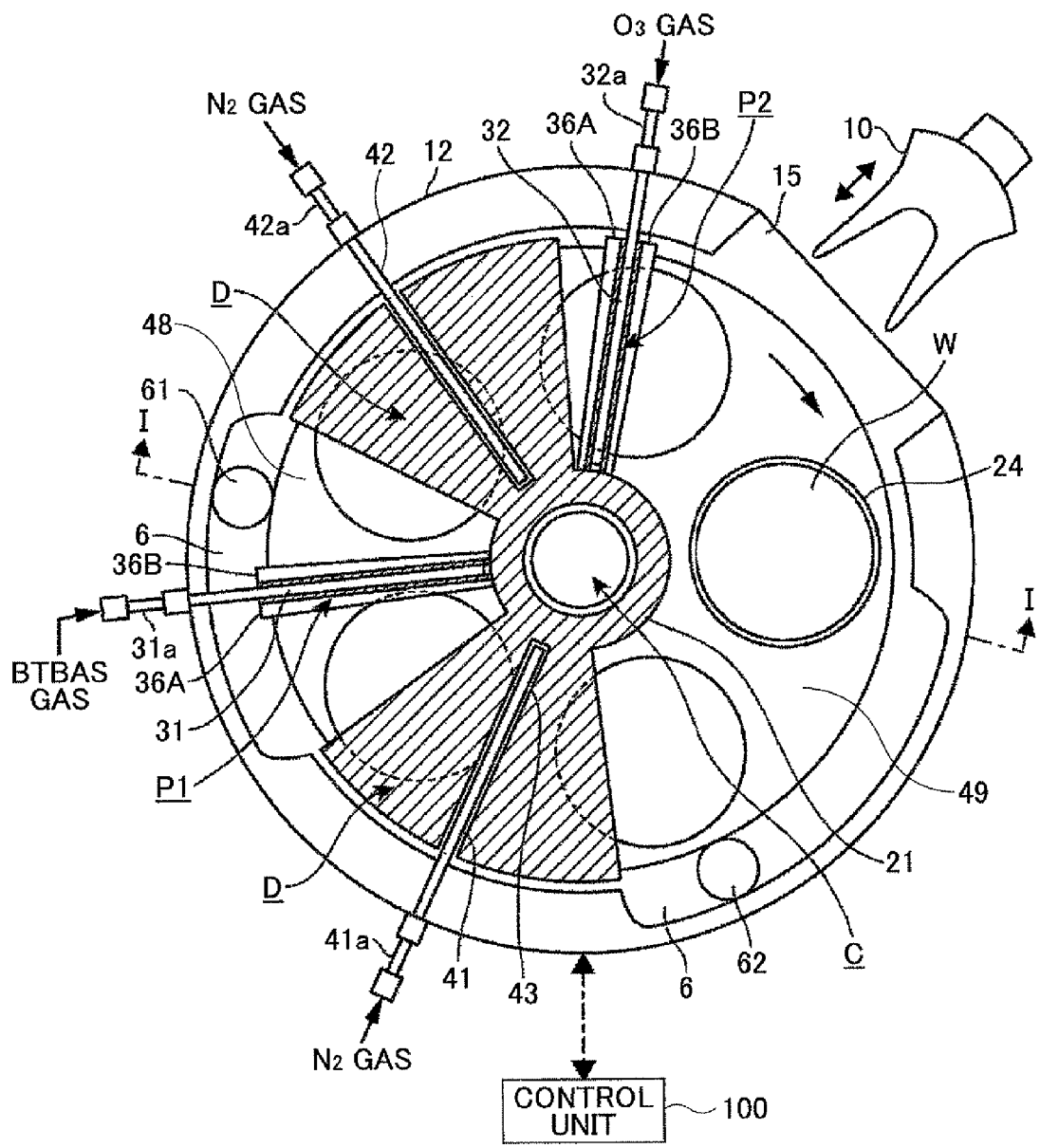
FIG. 5 is a plan view illustrating the film deposition apparatus of FIG. 3.

As illustrated in FIGS. 4 and 5, plural concave portions 24, each of which receives a wafer W as the substrate, are formed in an upper surface portion of the turntable 2 along the rotation direction (or circumferential direction). In this example, the concave portions 24 have a circular shape, and five concave portions 24 are provided. The concave portion 24 has a diameter slightly larger than that of the wafer W, and positions the wafer W to prevent the wafer W from falling off the turntable 2 due to centrifugal force when the turntable 2 rotates. For the sake of convenience, the wafer W is only illustrated within one of the concave portions 24 in FIG. 5. The plural wafers W are placed on the common substantially flat turntable 2. The turntable 2 is configured so that a height of an upper surface of the wafer W is substantially in agreement with a height of an upper surface of the turntable 2 when the wafer W is placed in the concave portion 24. The height being substantially in agreement indicates that the height difference between them is within, for example, 5 mm. Use of such a turntable 2 suppresses turbulence in the flow current flowing over the upper surfaces of the wafer W and the turntable 2, compared with a case when using a turntable configured by combining plural separate members, or a turntable configured in such a manner that the heights of the upper surfaces of the upper surface of the turntable and the wafer W are not in agreement with each other.

Figure 6:
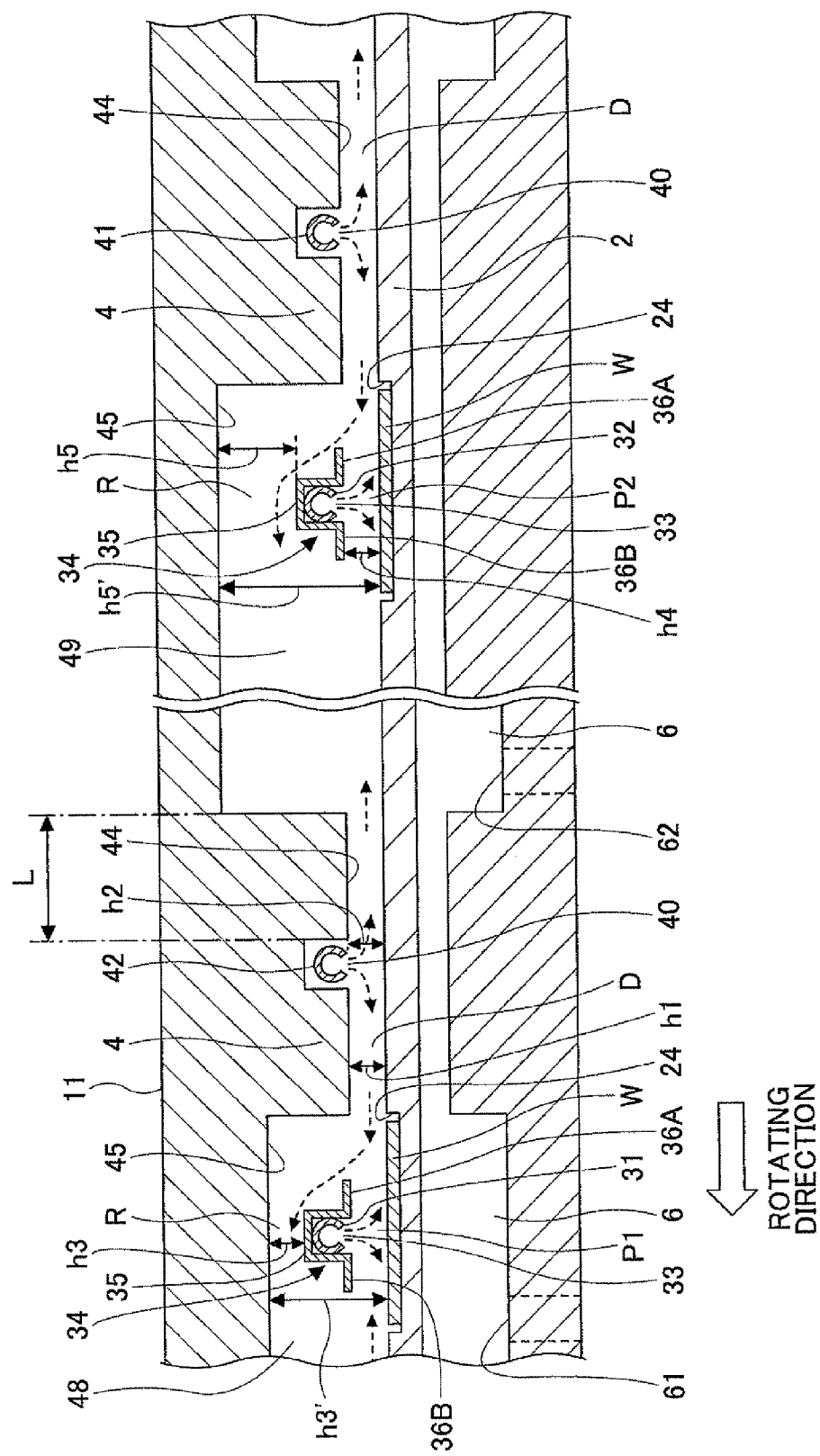
FIG. 6 is a vertical cross-sectional view illustrating an example of a process area and a separation area.

FIG. 6 illustrates projected diagrams obtained by cutting the turntable 2 along concentric circles and developing the cross sections horizontally. The concave portion 24 is formed so that when the wafer W is set into the concave portion 24 as illustrated in FIG. 6, a difference between the top surface of the wafer W and the top surface of the turntable 2 (that is, the region not set with the wafer W) becomes approximately zero. Hence, a pressure deviation caused by the height difference between the top surface of the wafer W and the top surface of the turntable 2 is suppressed, and the in-plane uniformity of the thin film that is formed can be achieved. Penetration holes (not illustrated) are formed in the bottom surface of the concave portion 24. For example, three elevator pins (refer to FIG. 12 which will be described later), that support the back surface of the wafer W to raise and lower the wafer W, penetrate the penetration holes in the bottom surface of the concave portion 24, in order to transfer the wafer W between the elevator pins and a transport mechanism 10.

As illustrated in FIGS. 4 and 5, a first reaction gas nozzle 31, a second reaction gas nozzle 32, and two separation gas nozzles 41 and 42 are provided at positions opposing the concave portions 24 of the turntable 2 at predetermined intervals along the circumferential direction (or the rotation direction of the turntable 2), and extend radially from the central portion of the turntable 2. The first reaction gas nozzle 31, the second reaction gas nozzle 32, and the two separation gas nozzles 41 and 42 are mounted on the sidewall of the vacuum chamber 1, for example, and gas inlet ports 31a, 32a, 41a and 41b at base ends thereof penetrate the sidewall.

The reaction gas nozzles 31 and 32 are respectively connected to a gas supply source (not illustrated) which supplies bis tertiary-butylamino silane (BTBAS) gas as the first reaction gas, and a gas supply source (not illustrated) which supplies $O_3$ (ozone) gas as the second reaction gas. The separation gas nozzles 41 and 42 are connected to a gas supply source (not illustrated) which supplies $N_2$ (nitrogen) gas as the separation gas. In this example, the second reaction gas nozzle 32, the separation gas nozzle 41, the first reaction gas nozzle 31, and the separation gas nozzle 42 are arranged clockwise in this sequence.

The reaction gas nozzles 31 and 32 have a plurality of ejection holes 33 to eject the corresponding reaction gases downwards. The ejection holes 33 are arranged in the longitudinal direction of each of the reaction gas nozzles 31 and 32 at predetermined intervals. In this example, the ejection holes 33 have a bore diameter of 0.5 mm, and are arranged at intervals of 10 mm along the longitudinal direction of each of the reaction gas nozzles 31 and 32. The first and second reaction gas nozzles 31 and 32 respectively form first and second reaction gas supply parts or means. A first process area P1 in which the BTBAS gas is caused to be adsorbed onto the wafer W is located below the first reaction gas nozzle 31, and a second process area P2 in which the $O_3$ gas is caused to be adsorbed onto the wafer W is located below the second reaction gas nozzle 32.

Incidentally, The BTBAS gas remaining above the wafer W is adsorbed on the wafer W after the wafer W passes through the process area P1, and the O3 gas remaining above the wafer W reacts with the BTBAS gas on the wafer W after the wafer W passes through the process area P2, strictly speaking. The separation gas nozzles 41 and 42 belong to corresponding two separation areas D formed by a first ceiling surface 44, as described later. The separation areas D have a sector-shape in the plan view, and are formed away from each other along the rotation direction of the turntable 2. Areas 48, 49, each of which has a sector-shape in the plan view, are provided adjacent to the separation areas D. In order to distinguish the areas 48, 49 from other areas, the areas 48, 49 are referred to as spreading areas 48, 49. The spreading areas 48, 49 are defined by second ceiling surfaces 45 that are higher than the first ceiling surfaces 44 that form the separation areas D. The process areas P1, P2 belong to the corresponding spreading areas 48, 49.

Sizes of the spreading areas 48, 49, namely, a height position of the second ceiling surfaces 45 and lengths of the spreading areas 48, 49 along the rotation direction, are optimally designed in order to carry out an optimal process taking account of an adsorptive property of the reaction gases, a reaction time, a rotation speed of the turntable 2 (or process speed), or the like. In addition, the reaction gas nozzles 31, 32 are preferably arranged in the center positions along the rotation direction in the corresponding spreading areas 48, 49, or in positions upstream along the rotation direction with respect to the center positions, in order to cause the reaction gases supplied to the wafer W to be sufficiently adsorbed on the wafer W, or in order to cause the reaction gas that has been adsorbed on the wafer W to sufficiently react with the other reaction gas supplied to the wafer W. In this embodiment, the second reaction gas nozzle 42 is arranged in an upstream position with respect to the center position along the rotation direction in the spreading area 49, as illustrated in FIG. 3, in order to cause the BTBAS gas adsorbed on the wafer W in a film deposition process described later. In addition, a length of the spreading area 49 to which the second reaction gas nozzle 42 belongs along the rotation direction is greater than a length of the spreading area 48 to which the second reaction gas nozzle 41 belongs along the rotation direction. A flow rate of the O3 gas from the second reaction gas nozzle 42 is set to, for example, 10,000 sccm in order to assuredly carry out oxidization, while a flow rate of the BTBAS gas from the first reaction gas nozzle 41 is set to, for example, 100 sccm. Because a relatively large amount of the O3 gas is supplied in such a manner, the ceiling surface 45 in the spreading area 49 is higher than the ceiling surface 45 in the spreading area 48.

Figure 7:
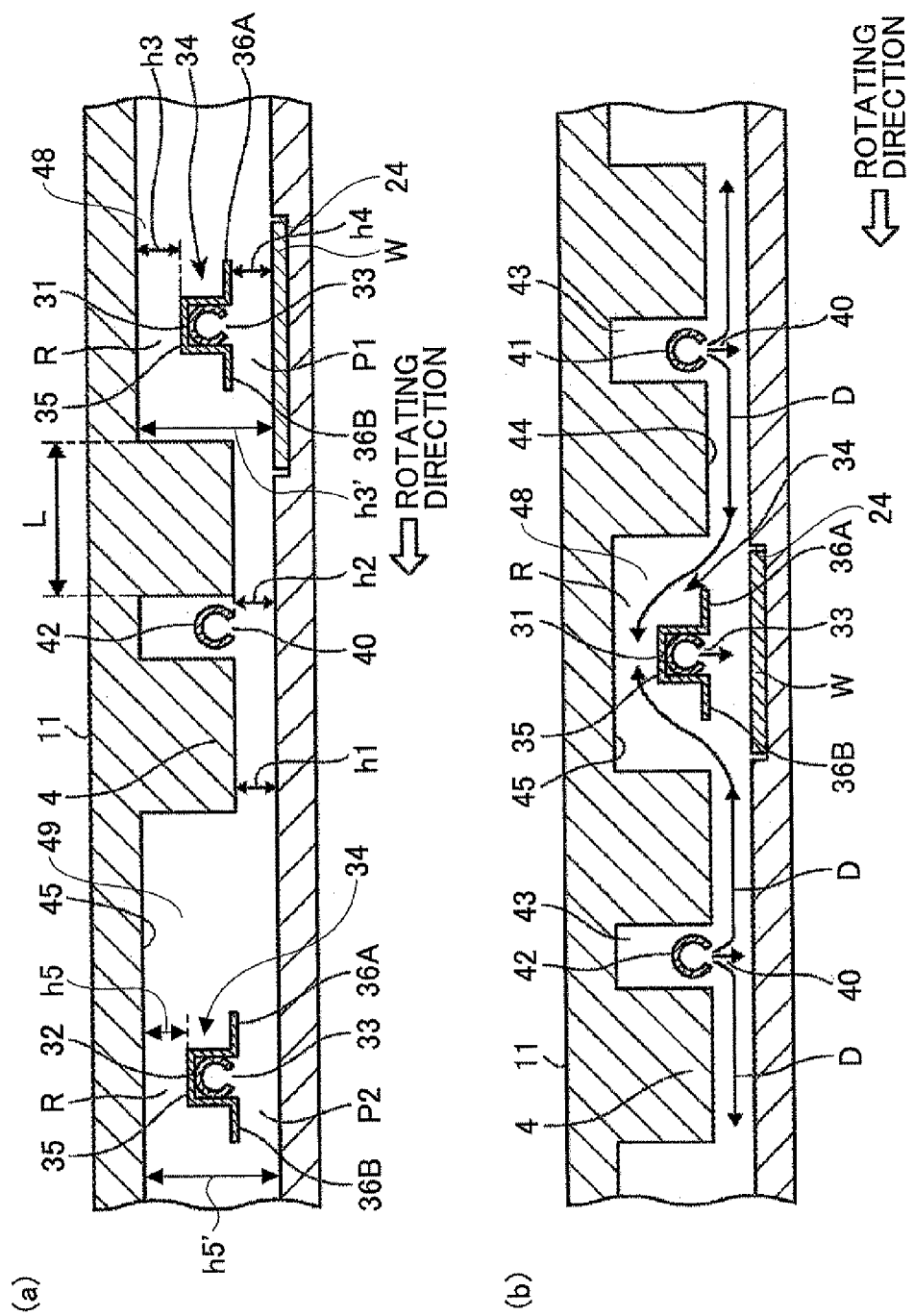
FIG. 7 illustrates diagrams in vertical cross section of process areas and a separation area in the film deposition apparatus of FIG. 3.

Incidentally, FIG. 7(a) and FIG. 7(b) illustrate an example where the ceiling surfaces 45 in the spreading areas 48, 49 are the same. The film deposition apparatus may be configured in such a manner. In FIG. 7(b), a flow of the separation gas is illustrated by solid arrows. The same reference symbols are given to the same components in FIG. 6, and the explanations thereof are omitted.

A nozzle cover 34 illustrated in FIG. 8(a) is provided on each of the reaction gas nozzles 31 and 32. The nozzle cover 34 extends along the longitudinal direction of each of the reaction gas nozzles 31 and 32, and has a base part 35 with an approximate U-shaped cross section. This base part 35 covers the top and sides of each of the reaction gas nozzles 31 and 32. Flow regulation plates 36A and 36B extend in the horizontal direction to the left and right of the base part 35, that is, towards the upstream side and the downstream side along the rotation direction of the turntable 2. As illustrated in FIGS. 4 and 5, each of the flow regulation plates 36A and 36B projects from the base part 35 so that a sector-shaped area thereof increases from the central portion of the turntable 2 towards the peripheral portion of the turntable 2 in the plan view. In this example, the flow regulation plates 36A and 36B, which form distribution members, are formed symmetrically to the left and right with respect to the base part 35. An angle (or fan opening angle) θ that is formed by extensions of the contours of the flow regulation plates 36A and 36B indicated by dotted lines in FIG. 8(b) is 10°, for example. Here, the angle θ is arbitrarily designed by taking into consideration the sizes of the spreading areas 48, 49 along the circumferential direction and the sizes of the separation areas D where the N2 gas is supplied along the circumferential direction, and may be, for example, 5° or more and 90° or less.

As illustrated in FIG. 5, the nozzle cover 34 is provided with an arrangement such that, in the plan view, the tip ends (or narrow ends) of the flow regulation plates 36A and 36B are adjacent to a protrusion portion 5 and rear ends (or wide ends) of the flow regulation plates 36A and 36B extend towards the outer edge of the turntable 2. In addition, the nozzle cover 34 is separated from a separation area D, and a gap R is formed between the nozzle cover 34 and the first ceiling surface 45. In FIG. 6, flows of each gas are indicated by dotted arrows, and the gap R forms a flow passage for the $N_2$ gas flowing from the separation area D towards the process areas P1 and P2. A height, which is indicated by h3 in FIG. 6, of the gap R in the spreading area 48 (the area where the reaction gas nozzle 31 is arranged) is, for example, 10 mm through 70 mm, and a height, which is indicated by h5, of the gap R in the spreading area 49 (the area where the reaction gas 32 is arranged) is, for example, 10 mm through 100 mm. In addition, a height, which is indicated by h3' in FIG. 6, of the second ceiling surface 45 from the upper surface of the wafer W in the spreading area 48 is, for example, 15 mm through 100 mm, for example, 32 mm, and a height, which is indicated by h5' in FIG. 6, of the second ceiling surface 45 from the upper surface of the wafer W in the spreading area 49 is, for example, 15 mm through 150 mm. Here, the heights h3, h5 of the gaps R may be arbitrarily altered depending on kinds of gas species and process conditions, and may be set to a magnitude so that a flow-controlling effect of suppressing the flow of the separation gas (or N2 gas) into the process areas P1, 22 by way of the nozzle cover 34 guiding the separation gas to the gaps R becomes as effective as possible. In order to provide such a flow-controlling effect, the heights h3, h5 may preferably be greater than the heights of the lower ends of the reaction gas nozzles 31, 32 from the turntable 2. In addition, as illustrated in FIG. 6, the lower surfaces of the flow regulation plates 36A and 36B may be at the same height the ejection holes 33 of the reaction gas nozzles 31, 32, and the height of the flow regulation plates 36A and 36B from the upper surface of the turntable 2 (or the upper surface of the wafer W), which is indicated by h4 in FIG. 6, may be 0.5 mm through 4 mm. Incidentally, the height h4 is not limited to 0.5 mm through 4 mm, but may be set to a height of, for example, 0.2 mm through 10 mm, in order to guide the $N_2$ gas to the gaps R and assuredly maintain a high reaction gas concentration as much as possible in the process areas P1, P2 so that the process can be carried out with respect to the wafer W. The flow regulation plates 36A and 36B of the nozzle cover 34 have a function of reducing a flow rate of the N2 gas that comes from the separation area D and flows under the reaction gas nozzles 31, 32, and restricting the BTBAS gas supplied from the reaction gas nozzle 31 or the $O_3$ gas supplied from the reaction gas nozzle 32 from flowing upward from the turntable 2. As long as such functions are provided, the nozzle cover 34 is not necessarily provided in the illustrated position.

Incidentally, because a linear speed of the turntable 2 becomes greater toward the circumferential portion of the turntable 2 from the center of the turntable 2, a gas concentration tends to be lower in the center side of the turntable 2 than in the circumferential side of the turntable 2 when the gas is supplied at the same flow rate. However, in this film deposition apparatus, the reaction gas nozzle 31, 32 and the separation gas nozzle 41, 42 are provided to extend from the outer circumference of the vacuum chamber to the rotation center of the turntable 2, and the reaction gases and the separation gases are supplied to the corresponding gas nozzles from the outer circumference of the vacuum chamber 1. Therefore, a gas pressure becomes higher in the circumferential side of the turntable 2, and thus the flow rates of the gases can become greater in the circumferential side of the turntable 2 when the diameters of the ejection holes are the same along the longitudinal direction of the gas nozzles. Although not so limited, setting the diameters of the ejection holes to be the same is preferable in that such flow rate distribution can be easily realized. Such flow rate distribution along the longitudinal direction of the gas nozzles can suppress reduction in the reaction gas concentration in the circumferential side, and is preferable in that the gas concentration can be equal along the circumferential direction of the turntable 2.

In addition, while effects of the flow regulation plates 36A, 36B are described in detail later, the flow regulation plates 36A, 36B extend in the rotation direction of the turntable 2. With the flow regulation plates 36A, 36B, an amount of the N2 gas flowing under the flow regulation plates 36A, 36B can be reduced, and the reaction gas concentration below the flow regulation plates 36A, 36B can be increased. Moreover, by adjusting a length of the flow regulation plates 36A, 36B along the rotation direction, an area of a region where the reaction gas concentration is controlled and the amount of the $N_2$ gas to be guided to the gap R can be adjusted.

The separation gas nozzles 41 and 42 have a plurality of ejection holes 40 to eject the separation gas downwards. The ejection holes 40 are arranged in the longitudinal direction of each of the separation gas nozzles 41 and 42 at predetermined intervals. In this example, the ejection holes 40 have a bore diameter of 0.5 mm, and are arranged at intervals of 10 mm along the longitudinal direction of each of the separation gas nozzles 41 and 42. The separation gas nozzles 41 and 42 form the separation area D for separating the first and second process areas P1 and P2. As illustrated in FIGS. 4 through 6, the ceiling plate 11 of the vacuum chamber 1 in the separation area D is provided with a convex portion 4 which projects downwards. The convex portion 4 has a sector-shape in the plan view, which segments a circle extending in a vicinity of and along the inner wall of the vacuum chamber 1 about a center matching the center of rotation of the turntable 2, in a circumferential direction of the circle. Each of the separation gas nozzles 41 and 42 is accommodated within a groove part 43 that is formed in the convex portion 4 and extends in the radial direction of the circle in a central portion of the sector shape along the circumferential direction. In other words, distances from a center axis of the separation gas nozzle 41 (or 42) to both ends of the sector-shaped protrusion portion (or edges along both the upstream and downstream sides along the rotation direction) are set to the same value. In this embodiment, the groove part 43 bisects the sector-shaped convex portion 4. However, when viewed from the groove part 43 in the plan view, the area of the convex portion 4 on the upstream side along the rotation direction of the turntable 2 may be larger than the area of the convex portion 4 on the downstream side along the rotation direction.

A first ceiling surface 44 that is flat, for example, is formed by the lower surface of the convex portion 4 on both side of each of the separation gas nozzles 41 and 42 along the circumferential direction. The second ceiling surface 45 which is higher than the first ceiling surface 44 is located on both sides of the first ceiling surface 44 along the circumferential direction, and the first and second ceiling surfaces 44 and 45 form the lower surface of the ceiling plate 11. A function of the convex portion 4 is to form a separation space, which is a narrow space, for impeding the first reaction gas and the second reaction gas from entering between the convex portion 4 and the turntable 2 and being intermixed with each other.

In other words, in the case of the separation gas nozzle 41, for example, the convex portion 4 impedes the $O_3$ gas from the upstream side along the rotation direction of the turntable 2 from entering, and impedes the BTBAS gas from the downstream side along the rotation direction from entering. The expression "impedes gas from entering" means that the $N_2$ gas ejected from the separation gas nozzle 41 as the separation gas spreads between the first ceiling surface 44 and the top surface of the turntable 2, and blows into the space under the second ceiling surface 45 which is adjacent to the first ceiling surface 44 in this example, so that gas is prevented from entering from an adjacent space. The expression "gas is prevented from entering" not only refers to a case where the gas is completely prevented from entering the space under the second ceiling surface 45 from the adjacent space, and also refers to a case where the gas from the adjacent space slightly enters the space under the convex portion 4 but it is possible to maintain a state where the $O_3$ gas and the BTBAS gas entering from both sides will not mix within the space under the convex portion 4. As long as the above function of the convex portion 4 is obtained, it is possible to achieve the function of separating the atmosphere of the first process area P1 and the atmosphere of the second process area P2 by the separation area D.

Accordingly, the narrow separation space has dimensions which cause a pressure difference between the narrow separation space (space under the convex portion 4) and the adjacent space (in this example, space under the second ceiling surface 45) to have a magnitude such that the "gas is prevented from entering" function described above is secured. Hence, the dimensions of the narrow separation space may differ depending on the area of the convex portion 4 and the like. In addition, the gas adsorbed onto the wafer W may naturally pass within the separation area D, and the "impedes gas from entering" function is referring to the gas within the vapor phase. Of course, the separation gas is not limited to the N₂ gas, and any kind of gas may be used for the separation gas as long as the separation gas does not adversely affect the film deposition process.

On the other hand, a protrusion portion 5 is provided on the lower surface of the ceiling plate 11 along the outer periphery of the core part 21 to oppose a portion of the turntable 2 on the outer peripheral side than the core part 21. The protrusion portion 5 is formed continuously to the portion of the convex portion 4 on the side of the center of rotation of the turntable 2. The lower surface of the protrusion portion 5 is formed to the same height as the lower surface of the convex portion 4 (that is, the first ceiling surface 44). FIGS. 4 and 5 illustrate the ceiling plate 11 cut horizontally along a height position lower than that of the second ceiling surface 45 and higher than those of the separation gas nozzles 41 and 42. Of course, the protrusion portion 5 and the convex portion 4 do not need to be formed integrally, and the protrusion portion 5 and the convex portion 4 may be formed by separate parts.

In this example, the substrate to be processed is a wafer W having a diameter of 300 mm. Hence, at a boundary portion between the convex portion 4 and the protrusion portion 5, that is 140 mm from the center of rotation of the turntable 2, the length of the convex portion 4 in the circumferential direction (that is, the length of an arc concentric to the turntable 2) is 146 mm, for example. At an outermost portion of the wafer setting region (that is, the concave portion 24), the length of the convex portion 4 in the circumferential direction is 502 mm, for example. At this outermost portion, a length L of the convex portion 4 in the circumferential direction from each of the right and left sides of the separation gas nozzle 41 (or 42) is 246 mm.

As illustrated in FIG. 6, a height h1 of the lower surface of the convex portion 4, that is, the first ceiling surface 44, from the top surface of the turntable 2 is 0.5 mm to 4 mm, for example. A height h2 of the lower end of the separation gas nozzle 41 (or 42) from the top surface of the turntable 2 is 0.5 mm to 4 mm, for example.

Figure 9:
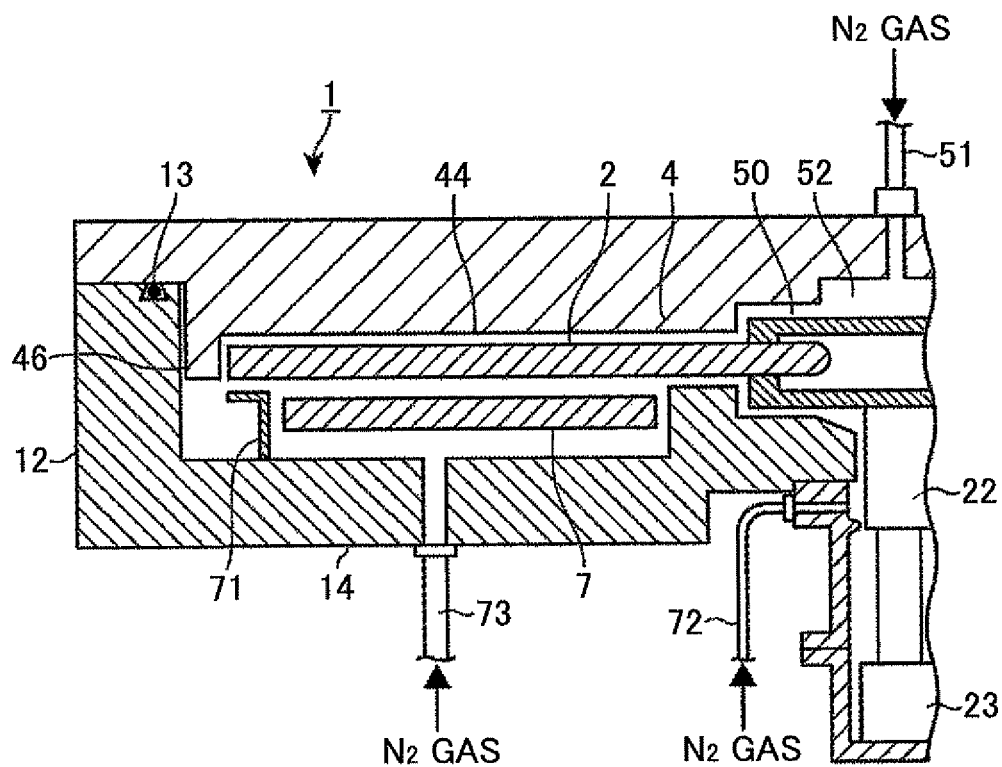
FIG. 9 is a diagram in vertical cross section illustrating the film deposition apparatus of FIG. 3.

FIGS. 3 and 9 illustrate the vertical cross sections only for the regions where the higher second ceiling surface 45 and the lower first ceiling surface 44 are provided. The peripheral edge portion of the sector-shaped convex portion 4 (that is, the outer edge portion of the vacuum chamber 1) forms a bent portion 46 that is bent in an L-shape to oppose the outer end surface of the turntable 2 as illustrated in FIGS. 4 and 9. This bent portion 46 is also provided for the purpose of preventing the reaction gases from entering from both sides and preventing mixing of the reaction gases, similarly to the convex portion 4. A gap between the inner peripheral surface of the bent portion 46 and the outer end surface of the turntable 2, and a gap between the outer circumferential surface of the bent portion 46 and the chamber body 12 are respectively set to the same value as the height h1 of the first ceiling surface 44 from the top surface of the turntable 2.

The inner circumferential wall of the chamber body 12 is formed as a vertical surface adjacent to the outer circumferential surface of the bent portion 46 in the separation area D, as illustrated in FIG. 9. However, at regions other than the separation area D, the inner circumferential wall of the chamber body 12 has a cutout, with a rectangular cross section, that is cut out towards the outer side to extend from the portion opposing the outer end surface of the turntable 2 to the bottom surface portion 14 as illustrated in FIG. 3, for example. This cutout in the inner circumferential wall of the chamber body 12 will be referred to as an evacuation area 6. A bottom part of the evacuation area 6 is provided with, for example, two evacuation ports 61 and 62 as illustrated in FIGS. 3 and 5. The evacuation ports 61 and 62 are connected to a common vacuum pump 64 which forms a vacuum exhaust part or means, via an exhaust pipe 63. A pressure controller 65 illustrated in FIG. 3, which forms a pressure adjusting means, may be provided with respect to each of the evacuation ports 61 and 62 or may be provided in common with respect to the two evacuation ports 61 and 62. With these configurations, an evacuation flow toward the outer side of the turntable 2 is formed and thus the gas supplied to the vacuum chamber 1 can be evacuated.

Incidentally, when the evacuation ports 61, 62 are provided in outer areas of the turntable 2 in order to evacuate the gases, the evacuation ports 61, 62 are not necessarily open downward, but may be open on an upper or a side portion. In addition, when the evacuation ports 61, 62 are provided in an inner area from the circumferential end of the turntable 2, the evacuation ports 61, 62 may be provided in order to be open on an upper or a side portion. However, taking generation of particles into consideration, the evacuation ports 61, 62 are preferably open downward. Moreover, the vacuum chamber 1 is normally provided in a position away from a floor in order to easily carry out maintenance. Therefore, when the evacuation ports 61, 62 are open downward, the evacuation pipes 63 can be drawn downward and laid out in the space between the vacuum chamber 1 and the floor, so that an installation space of the film deposition apparatus can be reduced.

Moreover, the evacuation port 61 (or 62) or a region through which a large amount of the gas within the vacuum chamber 1 is evacuated is preferably positioned in the downstream side of the rotation direction of the turntable 2 in relation to the reaction gas nozzle 31 (or 32), and the position is preferably within the spreading area 48 (or 49) to which the reaction gas nozzle 31 (or 32) belong, or in the outer area within the spreading area 48 (or 49). With such positioning, the gas is impeded from flowing in the counter direction of the rotation direction, or from flowing inward rather than outward. In addition, with the flow-controlling effect by the flow regulation plates 36A, 36B, the separation gas smoothly flows through the gaps R into the evacuation ports 61, 62. The evacuation ports 61, 62 are provided in the corresponding evacuation areas 6. Moreover, the evacuation areas 6 are arranged in an outer side along the radius direction of the turntable 2 in the corresponding spreading areas 48, 49, but no evacuation areas are provided in an outer side along the radius direction in the separation area. Therefore, because of the flow-controlling effect by the flow regulation plates 36A, 36B and the positioning of the evacuation ports 61, 62, the gases supplied from the corresponding gas nozzles smoothly flow into the evacuation ports 61, 62, and thus a flow that separates the first and the second reaction gases above the turntable 2 in the spreading areas 48, 49 is created.

The evacuation ports 61 and 62 are provided one on each side of the separation area D in the rotation direction in the plan view in order to exclusively exhaust the respective reaction gases (BTBAS gas and O₃ gas), so that the separating function of the separation area D is positively performed. The evacuation port 61 is provided between the first reaction gas nozzle 31 and the separation area D which is adjacent to the first reaction gas nozzle 31 on the downstream side in the rotation direction. On the other hand, the second evacuation port 62 is provided between the second reaction gas nozzle 32 and the separation area D which is adjacent to the second reaction gas nozzle 32 on the downstream side in the rotation direction. For example, the evacuation port 61 may be provided between the first reaction gas nozzle 31 and the separation area D which is adjacent to the first reaction gas nozzle 31 on the upstream side in the rotation direction, and the second evacuation port 62 may be provided between the second reaction gas nozzle 32 and the separation area D which is adjacent to the second reaction gas nozzle 32 on the upstream side in the rotation direction.

Figure 10:
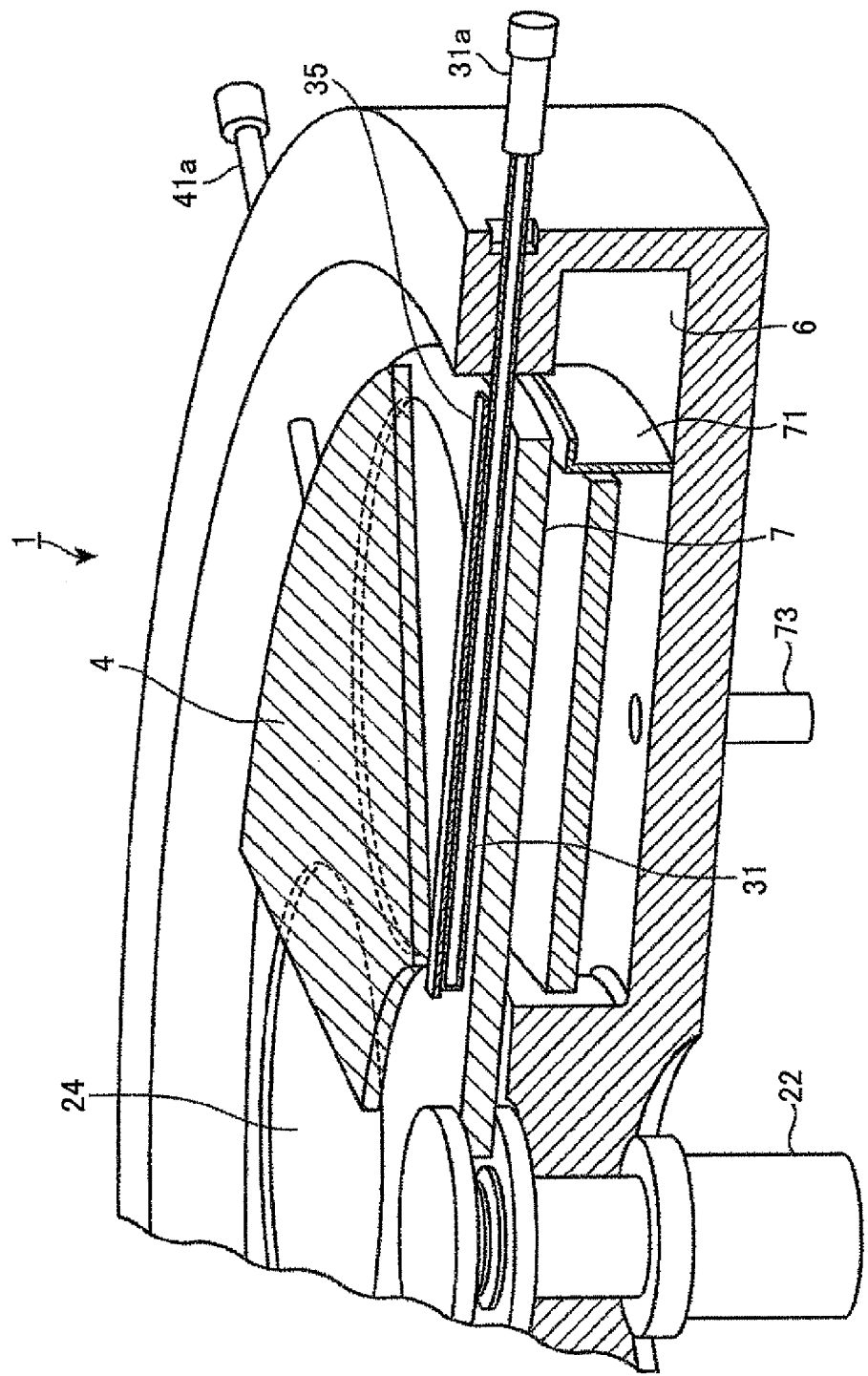
FIG. 10 is a diagram in vertical cross section illustrating the reaction gas nozzle.

A heater unit 7 is provided in a space between the turntable 2 and the bottom surface portion 14 of the vacuum chamber 1, as illustrated in FIGS. 3 and 10, and the heater unit 7 heats the wafer W set on the turntable 2 to a temperature that is determined by the process recipe. In FIG. 10, a cover member 71 has a flange shape with an upper edge thereof bent towards the outer side, in order to prevent the gas from entering inside the cover member 71 from the outside. The bottom surface portion 14 at a portion closer to the center of rotation of the turntable 2 than the space in which the heater unit 7 is provided forms a narrow space between the lower surface of the turntable 2 in a vicinity of the central portion thereof and adjacent to the core part 21. In addition, a narrow gap is formed between the inner peripheral surface defining the penetration hole in the bottom surface portion 14 and the rotary shaft 22 which penetrates the penetration hole. The narrow space and the narrow gap are purged by the $N_2$ gas which is supplied as the purge gas from a purge gas supply pipe 72. Further, a reference symbol 73 in FIG. 10 is a purge gas supply pipe that purges the space in which the heater unit 7 is provided.

Figure 11:
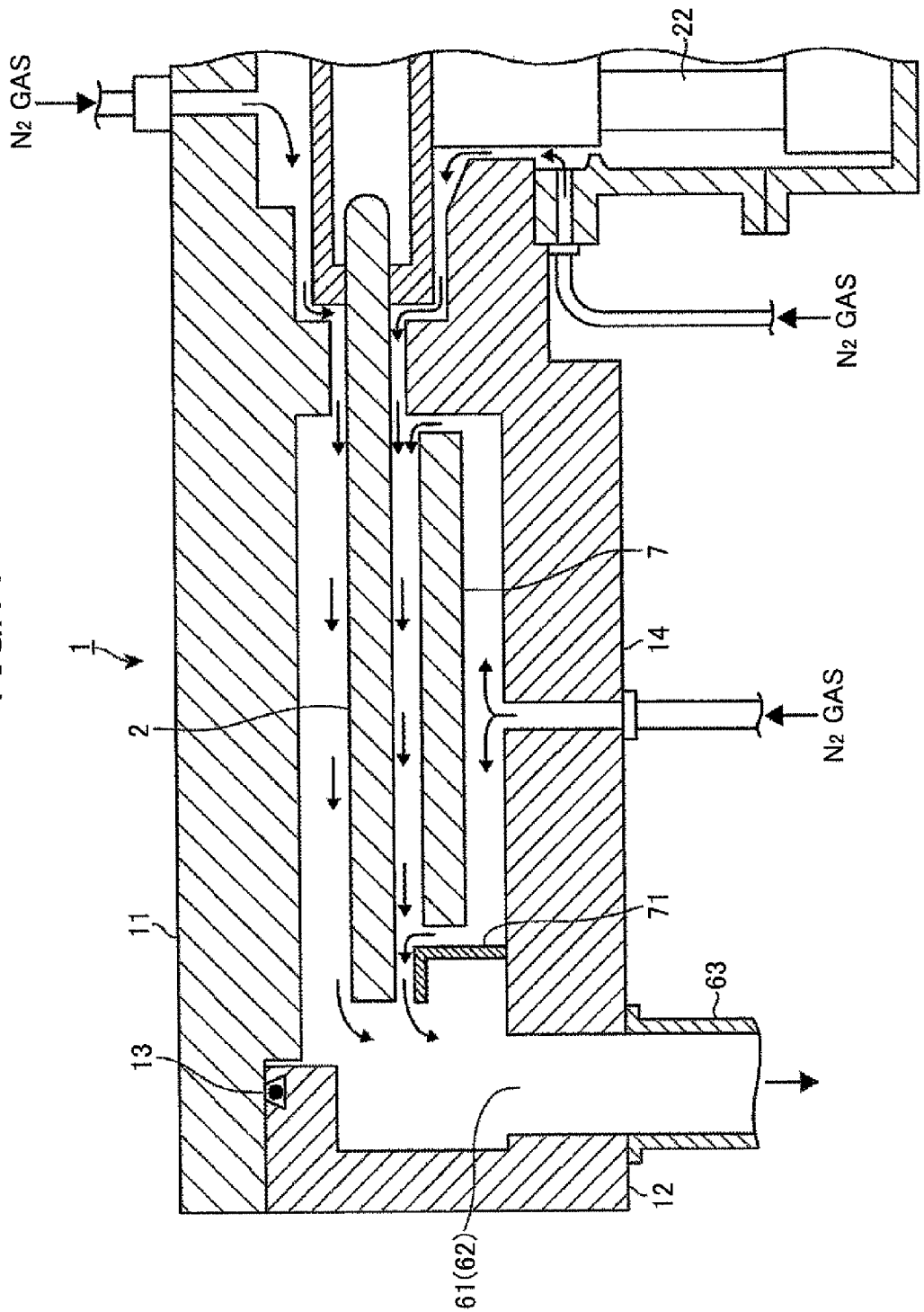
FIG. 11 is a diagram for explaining a state where a separation gas or a purge gas flows.

The flow of the purge gas is indicated by solid arrows in FIG. 11. The space from inside the case body 20 to the space in which the heater unit 7 is provided is purged by the $N_2$ gas, and this purge gas is exhausted from the evacuation ports 61 and 62 via the gap between the turntable 2 and the cover member 71 and the evacuation area 6. Hence, the BTBAS gas or the $O_3$ gas is prevented from flowing from one of the first and second process areas P1 and P2 to the other of the first and second process areas P1 and P2 by flowing under the turntable 2, and the purge gas also functions as the separation gas.

A separation gas supply pipe 51 is connected to the central portion of the ceiling plate 11 of the vacuum chamber 1, in order to supply as the separation gas the $N_2$ gas to the space 52 between the ceiling plate 11 and the core part 21. The separation gas supplied to the space 52 is ejected towards the peripheral edge of the turntable 2 along the surface of the turntable 2 in the wafer setting region of the turntable 2, via a narrow space 50 between the protrusion portion 5 and the turntable 2. Because the space surrounded by the protrusion portion 5 is filled with the separation gas, the reaction gas (BTBAS gas or $O_3$ gas) is prevented from mixing with the other reaction gas between the first and second process areas P1 and P2 via the central portion of the turntable 2. In other words, the film deposition apparatus is segmented into the vacuum chamber 11 and the central portion in the vicinity of the center of rotation of the turntable 2, in order to separate the atmospheres of the first and second process areas P1 and P2, and is formed with a center area C to which the separation gas is purged and in which an ejection hole for ejecting the separation gas onto the top surface of the turntable 2 is formed along the rotation direction. The ejection hole in the center area C corresponds to the narrow space 50 between the protrusion portion 5 and the turntable 2.

Figure 12:
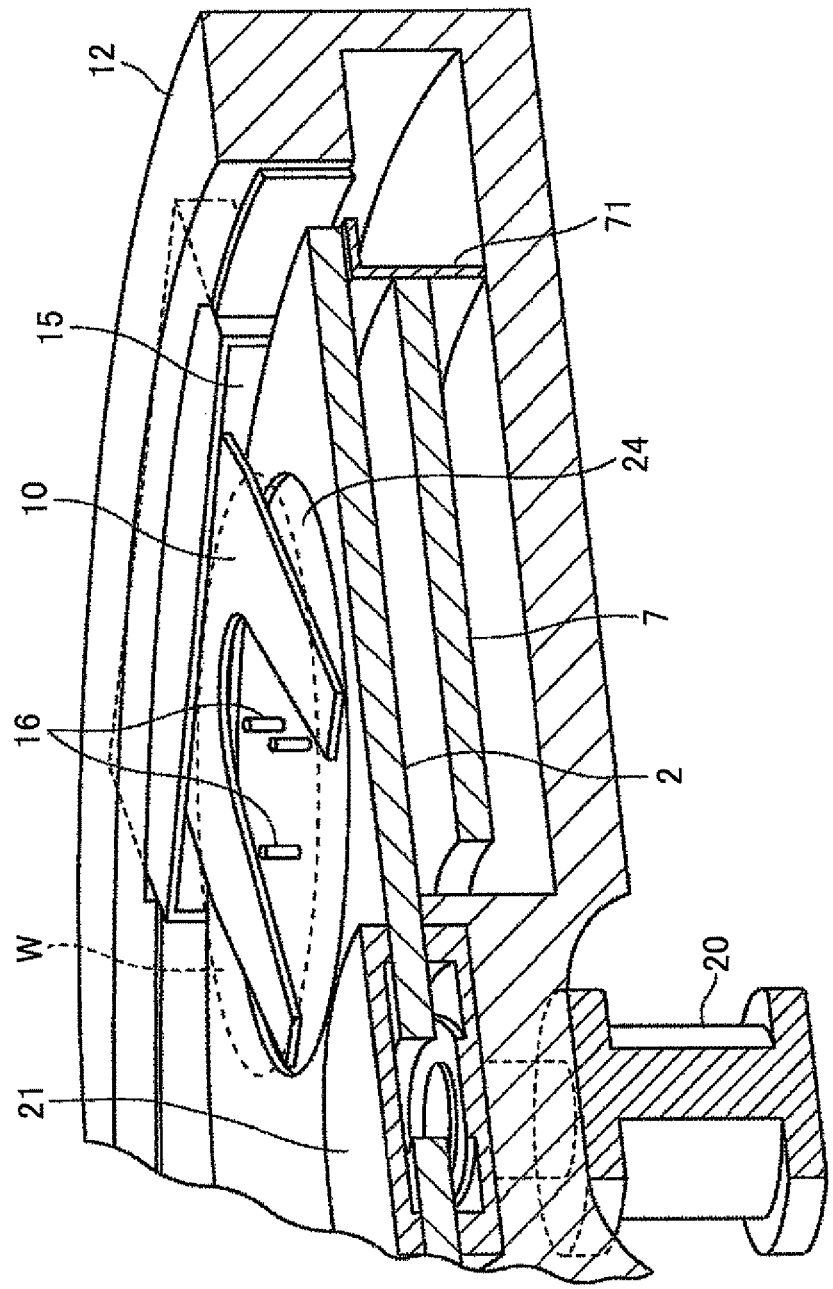
FIG. 12 is a perspective view, in partial cross section, illustrating the film deposition apparatus of FIG. 3.

A transfer opening 15 is formed in the sidewall of the vacuum chamber 1 as illustrated in FIGS. 4, 5 and 12, and the wafer W is exchanged between an external transfer arm 10 and the turntable 2 via the transfer opening 15. The transfer opening 15 is opened and closed by a gate valve which is not illustrated in the figures.

The film deposition apparatus according to this embodiment is provided with a control unit 100 including a computer for controlling the operation of the entire film deposition apparatus. A program for operating the film deposition apparatus is stored in a memory of the control unit 100. The program includes a group of instruction steps that carry out the operation (described later) of the apparatus, may be stored in a computer-readable storage medium such as a hard disk, a compact disc, a magneto-optical disk, a memory card, a flexible disk, and the like, and may be installed into the control unit 100.

Next, a description will be given of the operation of this embodiment. First, the gate valve which is not illustrated is opened, and the wafer W is transferred from the outside by the transfer arm 10 to the turntable 2 via the transfer opening 15, to be received by the concave portion 24 of the turntable 2. Such transferring is carried out by moving the elevation pins 16 upward/downward through penetration holes in the bottom surface of the recess when the convex portion 24 stops at the position corresponding to the transport port 15, as illustrated in FIG. 12. Such a process of receiving the wafer W into the concave portion 24 is performed while intermittently rotating the turntable 2, and as a result, one of the wafers W is received in each of the five concave portions 24 of the turntable 2.

Next, the vacuum chamber 1 is evacuated to vacuum by the vacuum pump 64 to a preset pressure, and the wafer W is heated by the heater unit 7 while rotating the turntable 2 clockwise. More particularly, the turntable 2 is preheated by the heater unit 7 to a temperature of 300° C., for example, and the wafer W is heated by being set on this preheated turntable 2. The BTBAS gas and the $O_3$ gas are ejected as the reaction gases from the first and second reaction gas nozzles 31 and 32, respectively, and the $N_2$ gas is ejected as the separation gas from the separation gas nozzles 41 and 42, after confirming by a temperature sensor that is not illustrated that the temperature of the wafer W has reached a set temperature. In this state, the $N_2$ gas is also ejected as the separation gas from the separation gas supply pipe 51. As a result, the ejected $N_2$ gas flows from the center area C, that is, from between the protrusion portion 5 and the central portion of the turntable 2, along the top surface of the turntable 2.

Incidentally, because the evacuation ports 61, 62 arranged in such a manner in this embodiment, the $N_2$ gas supplied from the separation gas nozzles 41, 42 flows into the evacuation ports 61, 62, passing through the areas where the reaction gas nozzles 31, 32 are provided, respectively. Once such a flow of the $N_2$ gas is created, the N2 gas flows under the reaction gas nozzles 31, 32 as described in the section of Problems to be Solved by the Invention. The inventors have vigorously investigated this problem, and the flow regulation plates 36A, 36B are attached on the reaction gas nozzles 31, 32 in order to suppress the gas flow under the reaction gas nozzles.

The $N_2$ gas ejected downwards from the separation gas nozzles 41 and 42 hits the top surface of the turntable 2 (both the surface of the wafer W and the surface of the turntable 2 not set with the wafer W), and flows along the top surface of the turntable 2 in the upstream side and the downstream side along the rotation direction of the turntable 2. Moreover, the BTBAS gas and the $O_3$ gas ejected downwards from the reaction gas nozzles 31 and 32 hit the top surface of the turntable 2, and flow in the downstream side along the rotation direction of the turntable 2 by riding on the flow of the separation gas.

In this example, the cutout is formed in the inner circumferential wall of the chamber body 12 along the space under the second ceiling surface 45 where the reaction gas nozzles 31 and 32 are arranged. Because the evacuation ports 61 and

62 are located under the space that is widened by the cutout, the pressure within the space under the second ceiling surface 45 becomes lower than the pressure within the narrow space under the first ceiling surface 44 and the pressure within the center area C.

Figure 13:
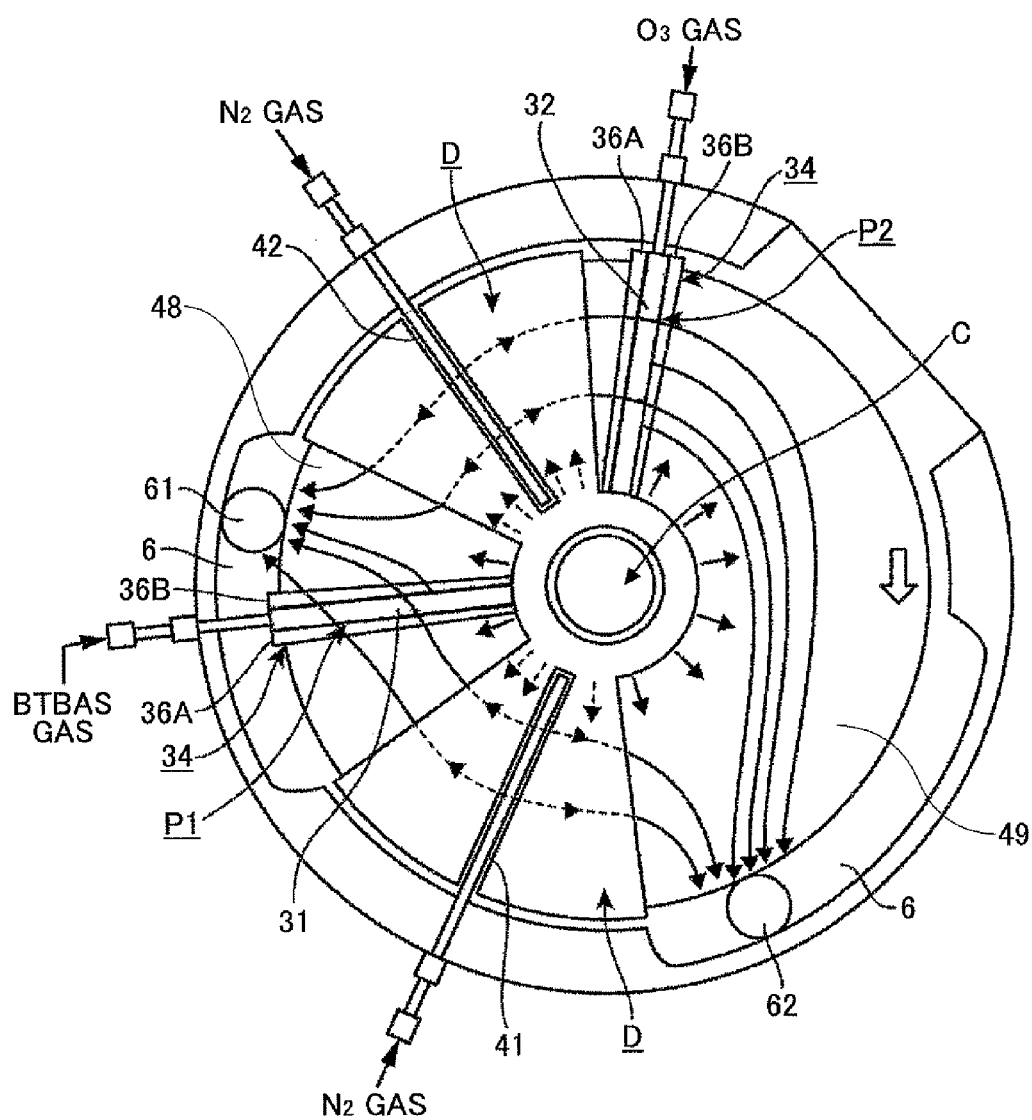
FIG. 13 is a diagram for explaining a state where a first reaction gas and a second reaction gas are separated by the separation gas.
Figure 14:
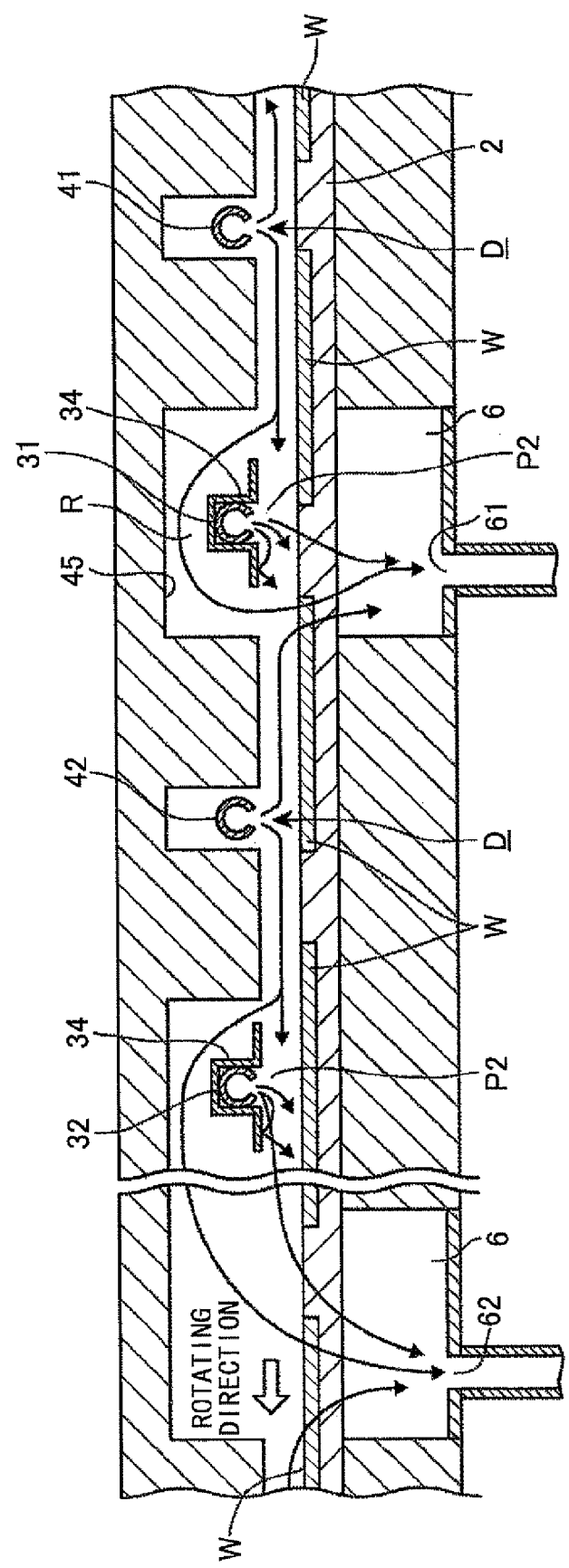
FIG. 14 is a diagram for explaining a gas flow above a turntable in the film deposition apparatus of FIG. 3.

FIG. 13 schematically illustrates the state of the gas flow on the turntable 2 with respect to the gasses ejected from various parts, and FIG. 14 is a projected diagram of the apparatus cut vertically along the circumferential direction of the turntable 2. In this film deposition apparatus, the evacuation ports 61 and 62 are provided in an outer region on the outer side than the process areas P1 and P2 and the separation area D. However, in order to illustrate the flow of each of the gasses, FIG. 14 illustrates the process areas P1 and P2, the separation area D, and the evacuation ports 61 and 62 on the same plane for the sake of convenience. However, FIG. 14 illustrates an apparatus configured in such a manner that the heights of the second ceiling surfaces 45 of the spreading areas 48, 49 are the same, in the same manner as FIG. 7(*a*), for the sake of convenience. Each of the gases flows in the same manner as shown in FIG. 14 even when the heights of the second ceiling plates 45 are different as shown in FIG. 6.

A description will now be given of the flow of each of the gases on the turntable 2, by referring to FIGS. 13 and 14. The $N_2$ gas ejected from the separation gas nozzle 41 flows towards the downstream side in the rotation direction of the turntable 2, and flows from the separation area D to under the second ceiling surface 45. Further, the $N_2$ gas is exhausted from the evacuation port 61 provided on the downstream side of the first reaction gas nozzle 31. Hence, the $N_2$ gas flows under the second ceiling surface 45 towards the first reaction gas nozzle 31.

FIG. 15(*a*) illustrates the flow of the $N_2$ gas in a vicinity of the first reaction gas nozzle 31 by solid arrows. The BTBAS gas is ejected to the first process area P1 under the first reaction gas nozzle 31, and flows as indicated by dotted arrows. Because the ejected BTBAS gas is restricted by the flow regulation plates 36A and 36B, and the $N_2$ gas is restricted from being blown upwards from under the flow regulation plates 36A and 36B, the pressure within the region under the flow regulation plates 36A and 36B is higher than the pressure within the region above the flow regulation plates 36A and 36B to generate a pressure difference. With respect to the $N_2$ gas flowing from the upstream side in the rotation direction towards the first reaction gas nozzle 31, the flow is restricted by the pressure difference and the flow regulation plate 36A which projects in the upstream side along the rotation direction, and the $N_2$ gas is prevented from flowing into the process area P1 and flows over the nozzle cover 34 towards the downstream side. The $N_2$ gas thereafter passes the gap R between the nozzle cover 34 and the second ceiling surface 45, and flows towards the downstream side of the first reaction gas nozzle 31 in the rotation direction. In other words, with respect to the $N_2$ gas flowing from the upstream side towards the downstream side of the first reaction gas nozzle 31, the flow regulation plate 36A is arranged at a position so that most of the $N_2$ gas is guided towards the gap R by bypassing the space under the first reaction gas nozzle 31. Consequently, the amount of $N_2$ gas flowing into the first process area P1 is suppressed.

In addition, as described above in conjunction with the conceivable structure, the $N_2$ gas flowing to the first process area P1 has a lower pressure on the downstream side (or back surface side) than on the upstream side (or front surface side) of the first reaction gas nozzle 31 which receives the $N_2$ gas. For this reason, the $N_2$ gas tends to flow upwards towards the downstream side of the first reaction gas nozzle 31, and the BTBAS gas ejected from the second reaction gas nozzle 32 and flowing towards the downstream side in the rotation direction of the turntable 2 also tends to flow upwards from the turntable 2. However, the BTBAS gas and the $N_2$ gas are restricted and prevented from being blown upwards from the turntable 2 by the flow regulation plate 36B that is provided on the downstream side in the rotation direction. As a result, the BTBAS gas and the $N_2$ gas flow between the flow regulation plate 36B and the turntable 2 towards the downstream side, and pass the gap R above the first reaction gas nozzle 31 on the downstream side of the first process area 21, to thereby join the $N_2$ gas which flowed to the downstream side.

The BTBAS gas and the $N_2$ gas supplied from the separation gas nozzle 41 are pushed by the $N_2$ gas which is supplied from the separation gas nozzle 42 located on the downstream side of the first process area P1 and flows towards the upstream side. Accordingly, the BTBAS gas and the $N_2$ gas supplied from the separation gas nozzle 41 are prevented from entering the space under the convex portion 4 where the separation gas nozzle 42 is provided, and are exhausted from the evacuation port 61 via the evacuation area 6 together with the $N_2$ gas from the separation gas nozzle 42 and the $N_2$ gas ejected from the center area C.

In addition, the $N_2$ gas ejected from the separation gas nozzle 42 and flowing towards the downstream side in the rotation direction, flows from the separation area D towards the space under the second ceiling surface 45, and is exhausted from the evacuation port 62 provided on the downstream side of the second reaction gas nozzle 32. Hence, the $N_2$ gas ejected from the second gas nozzle 42 flows under the second ceiling surface 45 towards the second reaction gas nozzle 32. The $O_3$ gas is ejected to the second process area P2 under the second reaction gas nozzle 32, and flows as indicated by dotted arrows in FIG. 15(*b*). Because the flow regulation plates 36A and 36B restrict the ejected $O_3$ gas from being blown upwards from under the flow regulation plates 36A and 36B, the region under the flow regulation plates 36A and 36B has a pressure higher than that of the region above the flow regulation plates 36A and 36B to generate a pressure difference. Furthermore, with respect to the $N_2$ gas flowing from the upstream side in the rotation direction towards the second reaction gas nozzle 32, the flow is restricted by the pressure difference and the flow regulation plate 36A which projects in the upstream side along the rotation direction, and the $N_2$ gas is prevented from flowing into the process area P2 and flows over the nozzle cover 34 towards the downstream side. The $N_2$ gas thereafter passes the gap R between the nozzle cover 34 and the second ceiling surface 45, and flows towards the downstream side of the second process area P2. In other words, with respect to the $N_2$ gas flowing from the upstream side towards the downstream side of the second reaction gas nozzle 32, the flow regulation plate 36A is arranged at a position so that most of the $N_2$ gas is guided towards the gap R by bypassing the space under the second reaction gas nozzle 32. Consequently, the amount of $N_2$ gas flowing into the second process area P2 is suppressed.

In addition, the $N_2$ gas flowing to the second process area P2 has a lower pressure on the downstream side (or back surface side) than on the upstream side (or front surface side) of the second reaction gas nozzle 32 which receives the $N_2$ gas. For this reason, the $N_2$ gas tends to flow upwards towards the downstream side of the second reaction gas nozzle 32, and the $O_3$ gas ejected from the second reaction gas nozzle 32 and flowing towards the downstream side in the rotation direction of the turntable 2 also tends to flow upwards from the turntable 2. However, the $O_3$ gas and the $N_2$ gas are restricted and prevented from being blown upwards from the turntable 2 by the flow regulation plate 36B that is provided on the downstream side in the rotation direction. As a result, the $O_3$ gas and the $N_2$ gas flow between the flow regulation plate 36B and the turntable 2 towards the downstream side, and pass the gap R above the second reaction gas nozzle 32 on the downstream side of the second process area P2, to thereby join the $N_2$ gas which flowed to the downstream side.

The $O_3$ gas and the $N_2$ gas supplied from the separation gas nozzle 42 are pushed by the $N_2$ gas which is supplied from the separation gas nozzle 41 located on the downstream side of the second process area P2 and flows towards the upstream side. Accordingly, the $O_3$ gas and the $N_2$ gas supplied from the separation gas nozzle 41 are prevented from entering the space under the convex portion 4 where the separation gas nozzle 41 is provided, and are exhausted from the evacuation port 62 via the evacuation area 6 together with the $N_2$ gas from the separation gas nozzle 41 and the $N_2$ gas ejected from the center area C.

The wafer W alternately passes the first process area P1 where the first reaction gas nozzle 31 is provided and the second process area P2 where the second reaction gas nozzle 32 is provided, as the turntable 2 rotates. Hence, the BTBAS gas is adsorbed onto the wafer W, and the $O_3$ gas is then adsorbed onto the wafer W to oxidize the BTBAS molecules, to thereby form one or a plurality of molecular layers made of silicon oxide. A silicon oxide thin film having a predetermined film thickness is deposited on the wafer W by successively stacking the molecular layers made of silicon oxide.

In the film deposition apparatus described above, the height of the first ceiling surface 44 and the length of the convex portion 4 in the circumferential direction are set to dimensions depending on process parameters during operation of the film deposition apparatus, such as the flow rate of each gas, so that the gas is prevented from entering under the first ceiling surface 44. Accordingly, the BTBAS gas and the $O_3$ gas virtually do not flow to the space under the convex portion 4, or will not reach the vicinity of the separation gas nozzle 41 even if a small amount does flow to the space under the convex portion 4. The BTBAS gas and the $O_3$ gas are pushed back towards the upstream side and the downstream side in the rotation direction by the $N_2$ gas ejected from the separation gas nozzle 41, and are exhausted as described above. In addition, the reaction gas, namely, the BTBAS gas or the $O_3$ gas, flowing within the atmosphere is prevented from entering the separation areas D, and the gas molecules adsorbed on the wafer W pass the separation areas D, that is, the space under the lower first ceiling surface 44 of the sector-shaped convex portion 4, as they are, to thereby contribute to the film deposition.

When the film deposition process ends, each wafer W is successively transferred by the transfer arm 10 by an operation that is in reverse to the operation performed when starting the film deposition process. Examples of the process parameters include the rotation speed of the turntable 2 that is 1 rpm to 500 rpm in the case of the wafer W having a diameter of 300 mm; the processing pressure that is 1067 Pa (or 8 Torr), for example; the heating temperature of the wafer W that is 350° C., for example; the flow rates of the BTBAS gas and the $O_3$ gas that are respectively 100 sccm and 10000 sccm, for example; the flow rate of the $N_2$ gas ejected from the separation gas nozzles 41 and 42 that is 20000 sccm, for example; and the flow rate of the $N_2$ gas supplied from the separation gas supply pipe 51 at the central portion of the vacuum chamber 1 that is 5000 sccm, for example. In addition, the number of reaction gas supply cycles with respect to one wafer W, that is, the number of times the wafer W passes each of the process areas P1 and P2, varies depending on a target film thickness to be deposited, and may be a relatively large number such as 6000 times, for example. What can be said from the above-mentioned gas flow ratio is that the gas flows in the first process area P1 and the second process area P2 are greatly affected by the $N_2$ gases supplied from the separation areas D. Therefore, it is important to suppress the flow of the $N_2$ gases into the first process area P1 and the second process area P2, and it is effective to provide the flow regulation plates 36A, 36B as described above.

This embodiment is provided with the gap R above the first reaction gas nozzle 31 located above the turntable 2 that is set with the wafer W, which forms the flow passage for the $N_2$ gas flowing from the separation area D towards the downstream side from the upstream side in the rotation direction of the turntable 2. Further, the nozzle cover 34, which has the flow regulation plate 36A projecting towards the upstream side in the rotation direction, is provided with respect to the first reaction gas nozzle 31. The flow regulation plate 36A causes most of the $N_2$ gas flowing from the separation area D, where the separation gas nozzle 41 is provided, towards the first process area P1 to pass through the gap R towards the downstream side of the first process area P1 to enter the evacuation port 61, to suppress the $N_2$ gas from entering the first process area P1. Hence, it is possible to suppress the BTBAS gas concentration in the first process area P1 from decreasing, and cause the BTBAS gas molecules to be positively adsorbed onto the wafer W and perform the film deposition in a normal manner even in a case where the rotation speed of the turntable 2 is increased. As a result, the film deposition rate with respect to the wafer W is improved, and the throughput of the film deposition apparatus is improved. Moreover, the thin film can be formed on the wafer W with a high in-plane uniformity, to improve the film quality. In other words, it is possible to form a thin film having desired properties.

In addition, the nozzle cover 34, which has the flow regulation plate 36B projecting towards the downstream side in the rotation direction, is provided with respect to the first reaction gas nozzle 31. The flow regulation plate 36B suppresses the $N_2$ gas flowing from the separation area D on the upstream side towards the first process area P1 from being blown upwards, together with the BTBAS gas ejected from the first reaction gas nozzle 31 in the first process area P1, from the turntable 2 towards the back surface of the first reaction gas nozzle 31 on the downstream side of the first reaction gas nozzle 31 in the rotation direction. Accordingly, it is possible to suppress the BTBAS gas concentration in the first process area P1 from decreasing, and to suppress the contact time of the BTBAS gas molecules with respect to the wafer W from decreasing. As a result, it is possible to cause the BTBAS gas molecules to be positively adsorbed onto the wafer W and perform the film deposition in a normal manner even in a case where the rotation speed of the turntable 2 is increased. Thus, the film deposition rate with respect to the wafer W is improved, and the throughput of the film deposition apparatus is improved. Moreover, the thin film can be formed on the wafer W with a high in-plane uniformity, to improve the film quality.

This embodiment is also provided with the gap R above the second reaction gas nozzle 32 located above the turntable 2 that is set with the wafer W, which forms the flow passage for the $N_2$ gas flowing from the upstream side towards the downstream side in the rotation direction of the turntable 2, similarly to the gap R provided above the first reaction gas nozzle 31. Further, the nozzle cover 34, which has the flow regulation plate 36A projecting towards the upstream side in the rotation direction, is provided with respect to the second reaction gas nozzle 32. The flow regulation plate 36A causes most of the N₂ gas flowing from the separation area D, where the separation gas nozzle 41 is provided, towards the second process area P2 to pass through the gap R towards the downstream side of the second process area P2 to enter the evacuation port 62, to suppress the N₂ gas from entering the second process area P2. Hence, it is possible to suppress the O₃ gas concentration in the second process area P2 from decreasing. Thus, the BTBAS molecules can be oxidized sufficiently even in a case where the rotation speed of the turntable 2 is relatively high, and it is possible to form a thin film only having a small amount of impurities, to thereby improve the film deposition rate with respect to the wafer W. The throughput of the film deposition apparatus is hence improved. Moreover, the thin film can be formed on the wafer W with a high in-plane uniformity, to improve the film quality.

In addition, the nozzle cover 34, which has the flow regulation plate 36B projecting towards the downstream side in the rotation direction, is provided with respect to the second reaction gas nozzle 32, similarly to the nozzle cover 34 provided with respect to the first reaction gas nozzle 31. The flow regulation plate 36B suppresses the N₂ gas flowing from the separation area D on the upstream side towards the second process area P2 from being blown upwards, together with the O₃ gas ejected from the second reaction gas nozzle 32 in the second process area 22, from the turntable 2 towards the downstream side of the second reaction gas nozzle 32 in the rotation direction. Accordingly, it is possible to suppress the O₃ gas concentration in the second process area P2 from decreasing, and to suppress the contact time of the O₃ gas molecules with respect to the wafer W from decreasing. As a result, it is possible to cause the BTBAS gas molecules to be oxidized sufficiently even in a case where the rotation speed of the turntable 2 is relatively high. Thus, it is possible to form a thin film only having a small amount of impurities, to thereby improve the film deposition rate with respect to the wafer W. The throughput of the film deposition apparatus is hence improved. Moreover, the thin film can be formed on the wafer W with a high in-plane uniformity, to improve the film quality.

In order to generate the pressure difference between the spaces above and below the reaction gas nozzles 31 and 32, and to suppress the N₂ gas that is the separation gas from entering between the turntable 2 and the reaction gas nozzles 31 and 32 due to the pressure difference, the flow regulation plate 36A may be provided to project only towards the upstream side in the rotation direction from each of the reaction gas nozzles 31 and 32. However, by providing the flow regulation plate 36B which projects towards the downstream side in the rotation direction, the effects described above can be achieved more positively because it is possible to more positively generate the pressure difference described above. In addition, in order to restrict and prevent the reaction gas from being blown upwards, the flow regulation plate 36B may be provided to project only towards the downstream side in the rotation direction from each of the reaction gas nozzles 31 and 32. However, by providing the flow regulation plate 36A which projects towards the upstream side in the rotation direction, this flow regulation plate 36A can restrict and prevent the reaction gas, which hits the turntable 2 and first flows towards the upstream side of the reaction gas nozzles 31 and 32 before flowing towards the downstream side, from being blown upwards due to the separation gas. Accordingly, by providing the flow regulation plates 36A and 36B which respectively project towards the upstream side and the downstream side in the rotation direction, it is possible to more positively restrict and prevent the reaction gas from being blown upwards.

In the example described above, the separation gas flows to the reaction gas nozzles 31 and 32 from the upstream side in the rotation direction of the turntable 2. However, depending on the arrangements of the separation nozzles 41 and 42, the reaction gas nozzles 31 and 32, and the evacuation ports 61 and 62 or, the pressure of the gas ejected from each gas nozzle, the separation gas may flow towards the reaction gas nozzles 31 and 32 from both the upstream side and the downstream side in the rotation direction. In a case where the separation gas also flows from the downstream side in the rotation direction towards the reaction gas nozzles 31 and 32, the flow regulation plate 36B which projects towards the downstream side forms the pressure difference between the spaces above and below thereof, to guide the separation gas flowing from the downstream side towards the reaction gas nozzles 31 and 32 to the gap R. In other words, with respect to the separation gas flowing from the downstream side in the rotation direction towards the reaction gas nozzles 31 and 32, the flow regulation plate 36B has the same function as the flow regulation plate 36A with respect to the separation gas flowing from the upstream side in the rotation direction. Moreover, when the separation gas also flows from the downstream side in the rotation direction towards the reaction gas nozzles 31 and 32, the flow regulation plate 36A which projects towards the upstream side can restrict and prevent the reaction gas from being blown upwards by the separation gas towards the upstream side in the rotation direction of the reaction gas nozzles 31 and 32. That is, with respect to the separation gas flowing from the downstream side in the rotation direction, the flow regulation plate 36A has the same function as the flow regulation plate 36B with respect to the separation gas flowing from the upstream side in the rotation direction. In addition, the flow regulation plate may be provided in the downstream side along the rotation direction. When the flow regulation plate is provided only in the downstream side, the separation gas form the downstream side toward the reaction gas nozzles 31, 32 can be guided to the gaps R, thereby suppressing decrease in the concentrations of the reaction gases in the process areas P1, P2.

The reaction gases or process gases usable in this embodiment, other than the above-mentioned gases, include DCS (dichlorosilane), HCD (hexachlorodisilane), TMA (trimethyl aluminum), 3DMAS (tris (dimethyl amino) silane), TEMAZ (tetrakis-ethyl-methyl-amino-zirconium), TEMAH (tetrakis-ethyl-methyl-amino-hafnium), Sr(THD)₂ (bis(tetra methyl heptandionate) strontium), Ti(MPD)(THD)₂ (methyl-pentadionate)(bis-tetra-methyl-heptandionate) titanium), monoamino-silane, and the like.

In the first ceiling surface 44 in the separation area D, the portion on the upstream side in the rotation direction of the turntable 2 with respect to the separation gas nozzles 41 and 42 preferably has a width along the rotation direction that is larger towards the outer edge. This is because the gas flow from the upstream side towards the separation area D is faster towards the outer edge due to the rotation of the turntable 2. From this point of view, it is advisable to form the convex portion 4 in the sector shape as described above.

The first ceiling surface 44 which forms the narrow space located on both sides of the separation gas nozzle 41 (or 42) preferably has the length L along the rotation direction of the turntable 2, which is 50 mm or greater, in a portion passing a center WO of the wafer W, in a case where the wafer W to be processed has a diameter of 300 mm, for example, as illustrated for the separation gas nozzle 41 in FIGS. 16(a) and 16(b). In order to effectively prevent the reaction gas from entering the narrow space under the convex portion 4 from both sides of the convex portion 4, it is necessary to reduce the distance between the first ceiling surface 44 and the turntable 2 depending on the length L if the length L is relatively short.

Furthermore, if the distance between the first ceiling surface 44 and the turntable 2 is set to a predetermined value, the length L required to obtain the effect of preventing the reaction gas from entering the narrow space under the convex portion 4 becomes greater for the portion further away from the center of rotation of the turntable 2, because the linear speed of the turntable 2 becomes faster for the portion further away from the center of rotation. From this point of view, if the length L at the portion passing the center WO of the wafer W is less than 50 mm, it becomes necessary to considerably reduce the distance between the first ceiling surface 44 and the turntable 2, which in turn requires measures to suppress vibration of the turntable 2 as much as possible in order to prevent collision of the turntable 2 or the wafer W and the first ceiling surface 44 when the turntable 2 rotates.

In addition, as the rotation speed of the turntable 2 becomes higher, the reaction gas more easily enters the narrow space under the convex portion 4 from the upstream side of the convex portion 4. For this reason, if the length L is smaller than 50 mm, the rotation speed of the turntable 2 needs to be reduced, which is undesirable from the point of view of achieving a satisfactory throughput. Therefore, it is preferable that the length L is 50 mm or greater, but this does not mean that the effects of this embodiment are not obtainable if the length L is less than 50 mm. In other words, it is preferable that the length L is 1/10 to 1/1 the diameter of the wafer W, and more preferably that the length L is approximately 1/6 the diameter of the wafer W or greater.

As illustrated in FIG. 17(a) and FIG. 17(b), only sector-shaped flow regulation plates may be provided on each of the reaction gas nozzles 31 and 32, without providing the base part 34. FIG. 17(a) is a perspective view of the reaction gas nozzle 31 (or 32) provided with sector-shaped flow regulation plates 37A and 37B which are formed similarly to the flow regulation plates 36A and 36B and respectively project towards the upstream side and the downstream side in the rotation direction, from underneath the reaction gas nozzle 31 (or 32). FIG. 17(b) is a view in vertical cross section of the reaction gas nozzle 31 (or 32). The moving distance of the turntable 2 becomes longer and the gas flow on the turntable 2 becomes faster from the center of rotation of the turntable 2 towards the outer edge of the turntable 2. Accordingly, in order to positively restrict each gas flow by the flow regulation plates provided on the reaction gas nozzles 31 and 32, the flow regulation plates 36A, 36B, 37A and 37B preferably have the sector shape in the plan view because it is preferable for the flow regulation plates to project more towards the upstream side and the downstream side in the rotation direction at positions further away from the center of rotation of the turntable 2.

Of course, the projecting direction of the flow regulation plate is not limited to the horizontal direction as in the case of the examples described above. For example, the flow regulation plates 37A and 37B may project downward at an angle or inclination from the reaction gas nozzle 31 as illustrated in FIG. 17(c).

Figure 18:
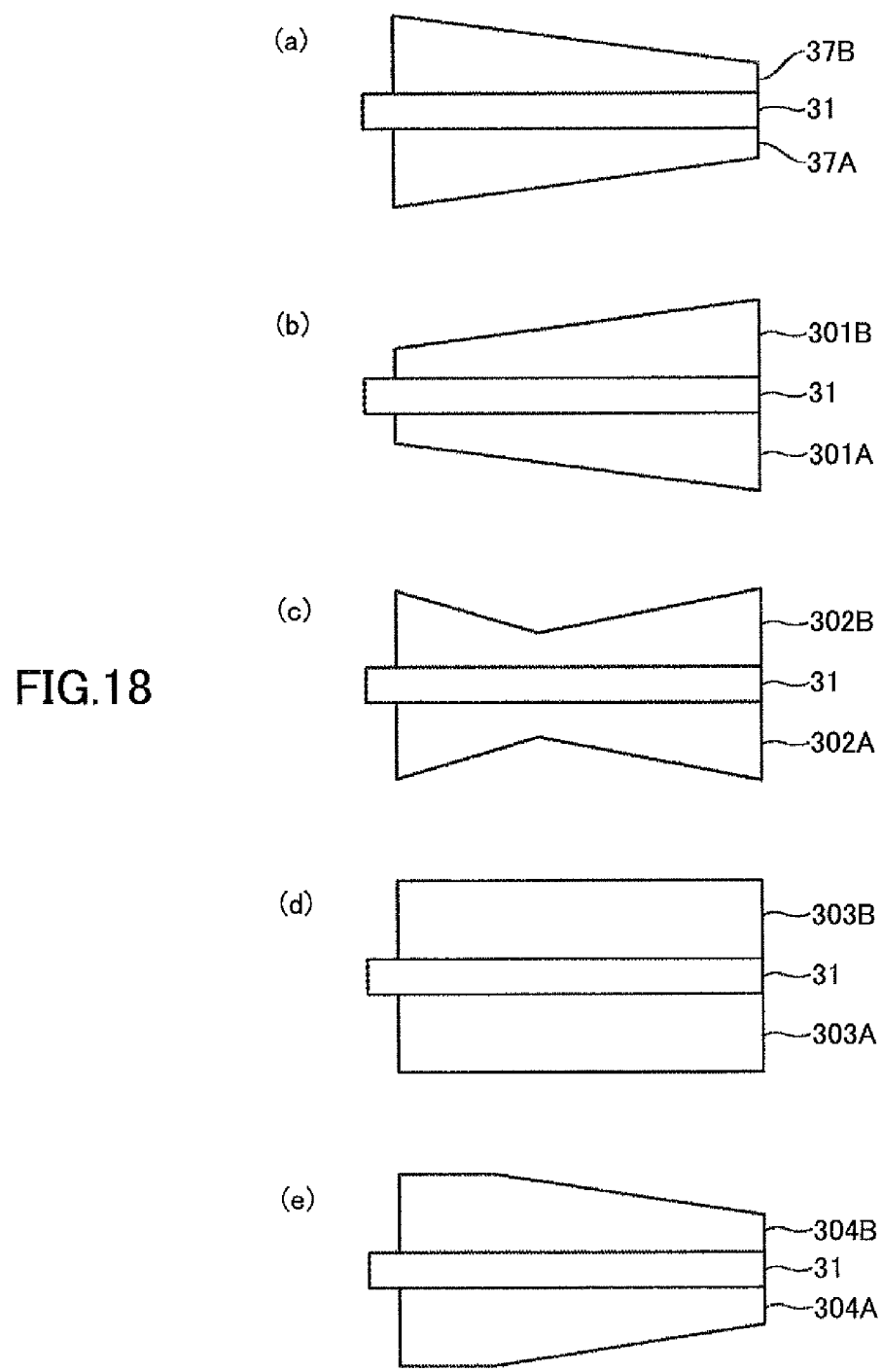
FIG. 18 illustrates top views of other examples of the distribution members.
Figure 20:
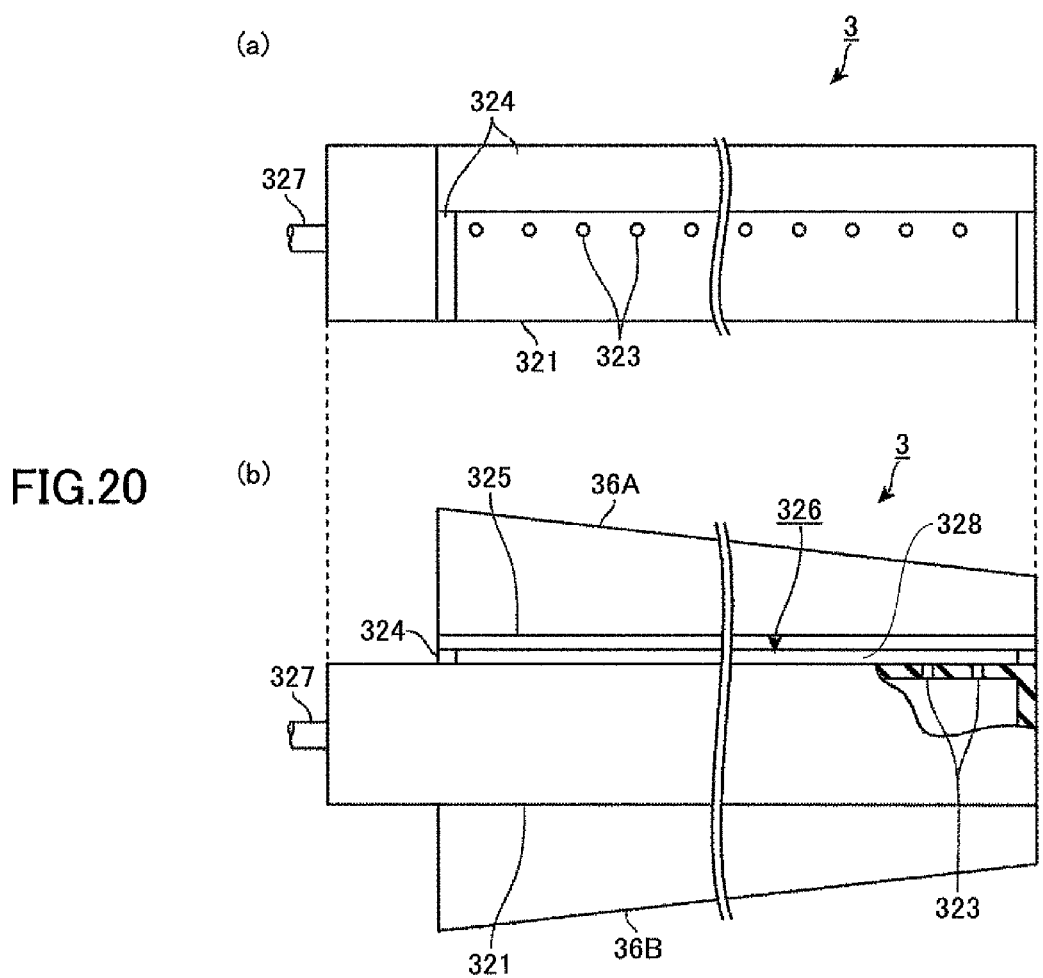
FIG. 20 illustrates a side view and a top view of the reaction gas nozzle.

The gas flow above the turntable 2 becomes fast when the rotation speed of the turntable 2 is high, and for this reason, the flow regulation plate preferably has the sector shape. However, the function of the flow regulation plate may be achieved if the flow regulation plate can cover a portion of the process area where the gas concentration becomes low, and the shape of the flow regulation plate may be freely modified depending on the gas concentration. FIG. 18(a) illustrates the top surface side of the reaction gas nozzle 31 with the flow regulation plates 37A and 37B mounted as illustrated in FIG. 17(a). FIGS. 18(b) through 18(d) respectively illustrate the top surface side of the reaction gas nozzle 31 with flow regulation plates 301A through 304A mounted and flow regulation plates 301E through 304B having shapes that are different from the shape of the flow regulation plates 37A and 37B, in place of the flow regulation plates 37A and 37B. As may be seen from FIGS. 18(b) through 18(d), the shape of the flow regulation plate is not limited to the sector shape.

Incidentally, the flow regulation plates may be formed integrally to provide the flow-controlling effect. In addition, the flow regulation plates may be formed as a separate part that is away from the reaction gas nozzle.

Next, a description will be given of another example of the reaction gas nozzle provided in the film deposition apparatus described above, by referring to FIGS. 19(a) through 20(b). A reaction gas nozzle 3 includes a nozzle body 321 having an elongated rectangular pipe shape, and a guide plate 325 provided on a side surface of the nozzle body 321. The flow regulation plates 37A and 37B are provided on the lower ends of the nozzle body 321 and the guide plate 325, with an arrangement sandwiching the nozzle body 321 and the guide plate 325. The inside of the nozzle body 321 is hollow and forms a flow space 322 for passing the reaction gas that is supplied from a gas introducing pipe 327 which is provided on a base part of the nozzle body 321.

As illustrated in FIGS. 19(b) and 20(a), plural reaction gas ejection holes 323 having a bore diameter of 0.5 mm, for example, are arranged at intervals of 5 mm, for example, along the longitudinal direction of the nozzle body 321, in one sidewall of the nozzle body 321, such as the sidewall on the upstream side when viewed from the rotation direction of the turntable 2, for example. The guide plate 325 is fixed on the sidewall of the nozzle body 321 via a gap adjusting member 324, to extend parallel to the sidewall. FIG. 19(a) illustrates the side view of the reaction gas nozzle 3 in a state where the guide plate 325 is removed. As illustrated in FIG. 20(a), the gap adjusting member 324 is formed by a plurality of plate members having the same thickness, and is arranged on the upper side, the right side and the left side of a region of the sidewall of the nozzle body 321 provided with the reaction gas ejection holes 323, for example, in order to surround this region.

Accordingly, the space surrounded by the outer surface of the sidewall, the gap adjusting member 324, and the guide plate 325 forms a flat band-shaped gas flow space 326 for passing the reaction gas ejected from the reaction gas ejection holes 323. Because the gap adjusting member 324 is not arranged on the lower side of the region in which the reaction gas ejection holes 323 are provided, a gas ejection hole 328 illustrated in FIG. 20(a) is formed in the gas flow space 326 in a slit shape as illustrated in the bottom view of FIG. 20(b), and the reaction gas nozzle 3 is arranged along the radial direction of the turntable 2, similarly to the reaction gas nozzles 31 and 32, in a state where the gas ejection hole 328 faces the turntable 2. In addition, the gap adjusting member 324 has a thickness of 0.3 mm, for example, and the width of the gas flow space 326 from the gas ejection hole 328 which is the outlet for the reaction gas outlet holes 323 to the guide plate 325 is also 0.3 mm.

When ejecting the reaction gas from the reaction gas nozzle 3, the reaction gas ejected from the reaction gas ejection holes 323 is caused to hit the guide plate 325 opposing the reaction gas ejection holes 323 before being supplied into the vacuum chamber 1. Hence, it is possible to spread the flow of the reaction gas in the direction in which the gas flow space 326 spreads between the nozzle body 321 and the guide plate 325, that is, in the direction in which the nozzle body 321 extends. As a result, compared to the case where the reaction gas ejected from each of the reaction gas ejection holes is directly sprayed onto the wafer W on the turntable 2, it is possible to suppress a corrugated phenomenon in which the deposited film thickness varies depending on the positions where the reaction gas ejection holes are arranged. In other words, it is possible to deposit the film with a uniform film thickness in the in-plane direction of the wafer W.

Next, a description will be given of still another example of the reaction gas nozzle provided in the film deposition apparatus described above. A reaction gas nozzle 3A illustrated in FIGS. 21(a) and 21(b) differs from the reaction gas nozzle 3 in that the reaction gas nozzle 3A includes a nozzle body 321 having an elongated cylindrical pipe shape, and a guide plate 325 provided on a side surface of the nozzle body 321. Plural reaction gas ejection holes 323 having a bore diameter of 0.5 mm, for example, are arranged at intervals of 10 mm, for example, in the sidewall of the nozzle body 321 along the longitudinal direction of the nozzle body 321. For example, the guide plate 325 is obtained by cutting a cylindrical pipe member having a larger outer diameter than that of the nozzle body 321 along the radial direction, and has an arcuate shape in a vertical cross section. One end of the guide plate 325 extending in a longitudinal direction thereof is fixed on the upper end of the nozzle body 321. Flow regulation plates 37A and 37B are provided with an arrangement sandwiching the nozzle body 321 and the guide plate 325, in a manner similar to the reaction gas nozzle 3.

A gas flow space 326 for passing the reaction gas is formed between the guide plate 325 and the outer wall surface of the nozzle body 321 provided with the reaction gas ejection holes 323. As illustrated in FIG. 21(b), for example, the reaction gas ejected from the reaction gas ejection holes 323 is caused to hit the guide plate 325 and flow downwards in the gas flow space 326 while spreading to the right and left. Hence, the reaction gas is supplied from a gas ejection hole 328 to the process area while being mixed along the longitudinal direction of the reaction gas nozzle 3A. Therefore, it is possible to supply the reaction gas to the process area in a state where the difference in the gas concentration is small, and it is possible to deposit the film with a uniform film thickness in the in-plane direction of the wafer W.

Figure 22:
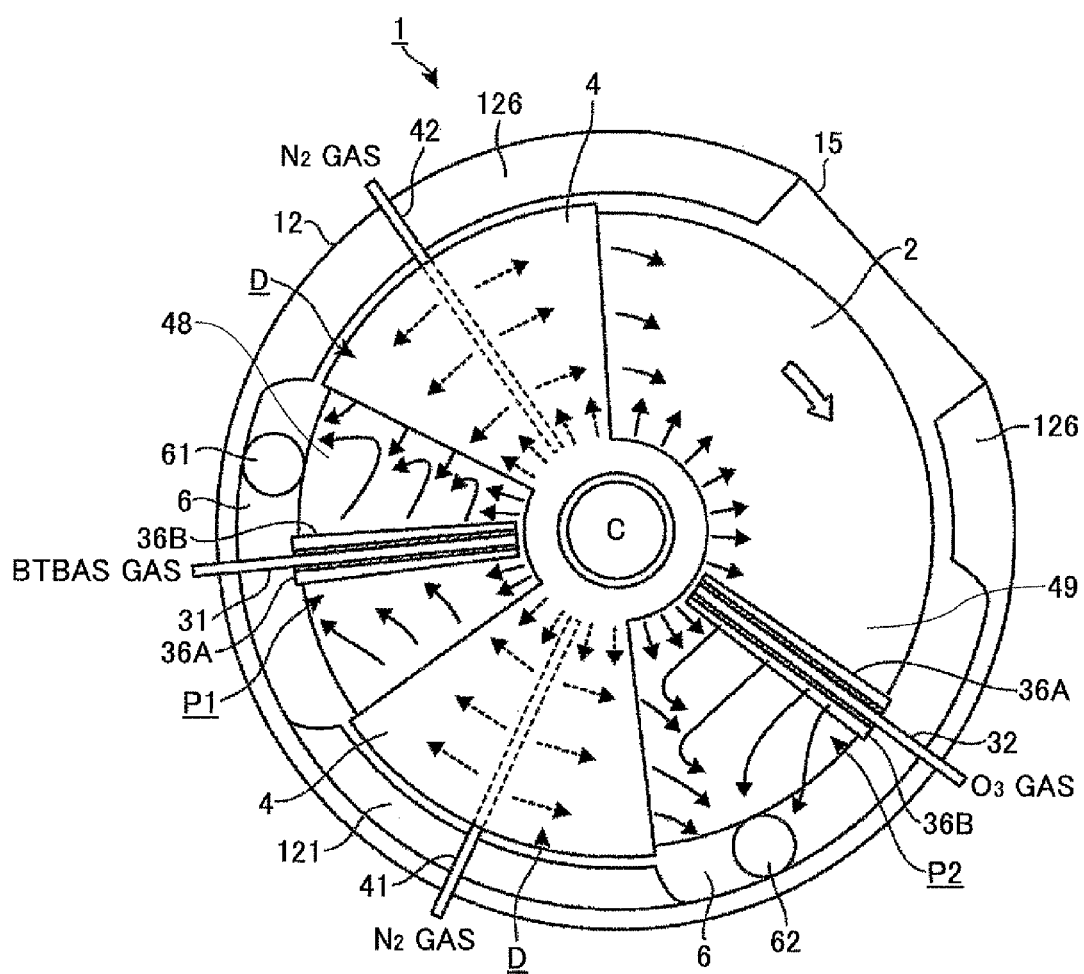
FIG. 22 is a side view illustrating a film deposition apparatus in another embodiment of the present invention.
Figure 23:
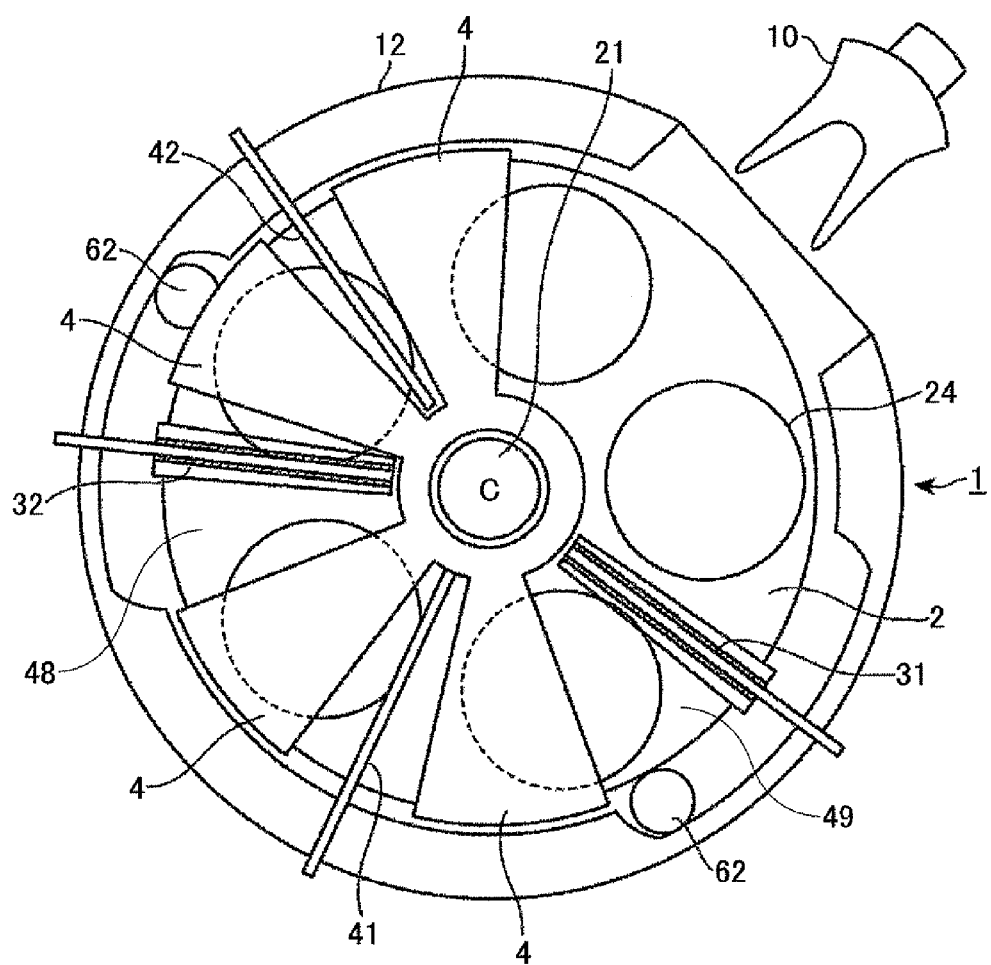
FIG. 23 is a side view illustrating a film deposition apparatus in the other embodiment of the present invention.

Next, a description will be given of an example of the layout of each of the process areas P1 and P2 and the separation area D, other than that of the embodiment described above. FIG. 22 illustrates an example where the second reaction gas nozzle 32 is arranged at a position on the downstream side in the rotation direction of the turntable 2 than the position of the transfer opening 15. Effects similar to those of the embodiment described above are also obtainable by such a layout. In addition, the separation area D may be arranged by dividing the convex portion 4 into two in the circumferential direction, and providing the separation gas nozzle 41 (or 42) between the two, as described above. FIG. 23 is a plan view of an example employing such a layout. In this case, the distance between the convex portion 4 and the separation gas nozzle 41 (or 42) and the size of the convex portion 4 may be set by taking into consideration the separation gas ejection flow rate, the reaction gas ejection flow rate and the like, in order for the separation area D to achieve an effective separating function. Of course, the number of process areas including the reaction gas nozzle may be three or more, and the flow regulation plates described above may be provided on each reaction gas nozzle other than the first and second reaction gas nozzles 31 and 32. For example, when sequentially supplying three kinds of reaction gasses onto the wafer W, a first reaction gas nozzle, a separation gas nozzle, a second reaction gas nozzle, a separation gas nozzle, a third reaction gas nozzle, and a separation gas nozzle may be arranged in this order along the circumferential direction of the vacuum chamber 1, for example, and the nozzles may be arranged similarly when sequentially supplying more than three kinds of reaction gases, and further, each separation area including the separation gas nozzle may have the structure of the embodiment described above. Each of the first, second and third reaction gas nozzles may be provided with the flow regulation plates described above.

In the embodiment described heretofore, the rotary shaft 22 of the turntable 2 is located at the central portion of the vacuum chamber 1, and the separation gas is purged into the space between the central portion of the turntable 2 and the ceiling surface portion of the vacuum chamber 1. However, the present invention is also applicable to a structure illustrated in FIG. 23, for example. In the film deposition apparatus having the structure illustrated in FIG. 24, the bottom surface portion 14 in the center area of the vacuum chamber 1 projects downwards to form an accommodating space 80 for the driving part. In addition, a recess 80a is formed in the ceiling surface in the center area of the vacuum chamber 1. A column 81 is inserted between the bottom of the accommodating space 80 and the top surface of the recess 80a in the center area of the vacuum chamber 1, in order to prevent the BTBAS gas from the first reaction gas nozzle 31 from mixing with the $O_3$ gas from the second reaction gas nozzle 32 via the center area of the vacuum chamber 1.

Figure 24:
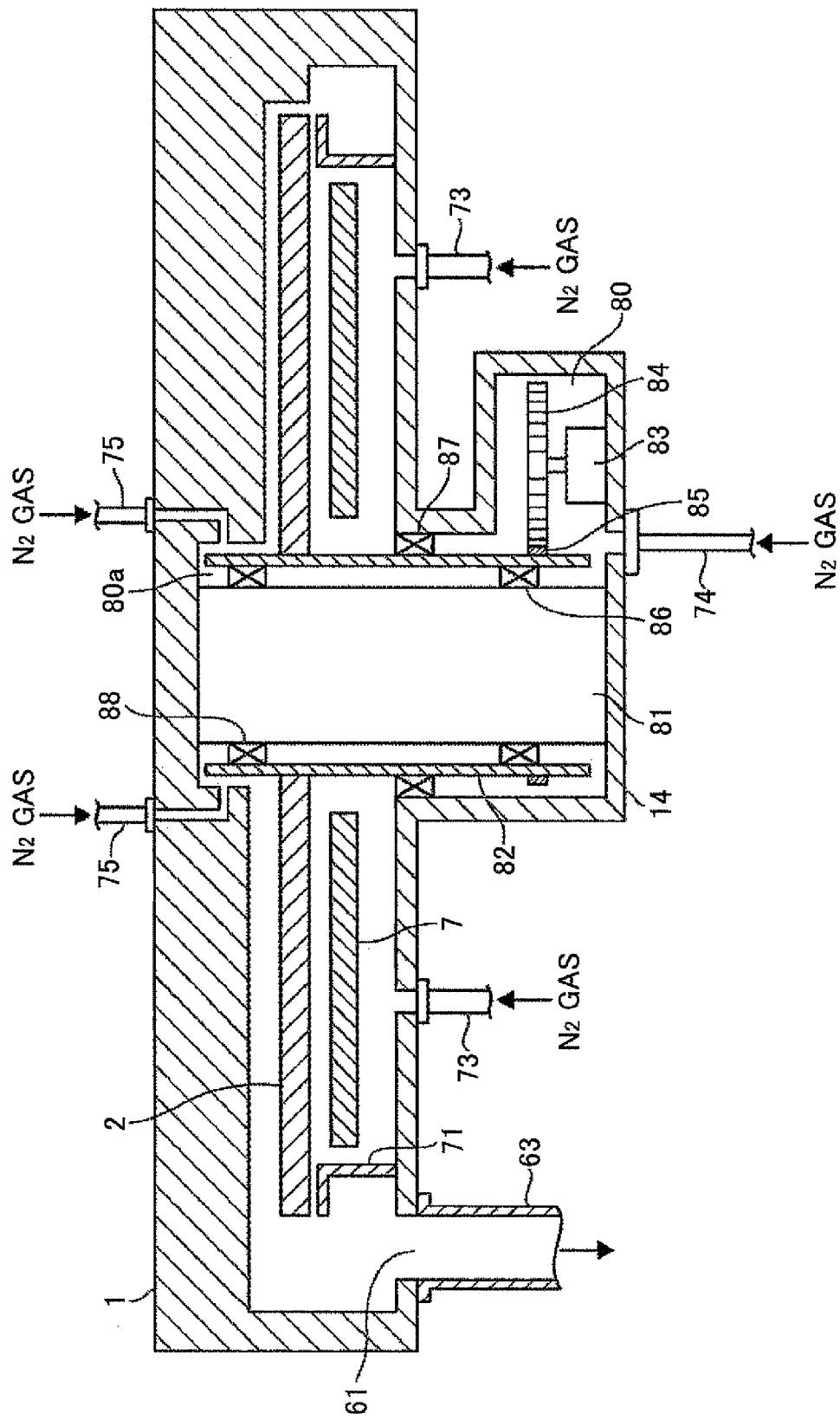
FIG. 24 is a side view illustrating a film deposition apparatus in still another embodiment of the present invention.

The mechanism for rotating the turntable 2 includes a rotary sleeve 82 surrounding the column 81, and the ring-shaped turntable 2 is arranged along the rotary sleeve 82. In addition, the accommodating space 80 accommodates a driving gear part 84 which is driven by a motor 83, and the driving gear part 84 rotates the rotary sleeve 82 via a gear portion 85 that is formed on an outer periphery in the lower portion of the rotary sleeve 82. Bearing parts 86, 87 and 88 are also provided to support the rotary sleeve 82. A purge gas supply pipe 74 is connected to the bottom of the accommodating space 80, and a purge gas supply pipe 75 is connected to the top of the vacuum chamber 1 to supply the purge gas into the space between the side surface of the recess 80a and the upper end of the rotary sleeve 82. In FIG. 24, an opening for supplying the purge gas into the space between the side surface of the recess 80a and the upper end of the rotary sleeve 82 is provided at two locations, that is, on the right and left. Preferably, the number of the openings (namely, the purge gas supplying opening) for supplying the purge gas into the above space may be designed in order to prevent the BTBAS gas and the $O_3$ gas from being inter-mixed via the region in the vicinity of the rotary sleeve 82.

In the embodiment illustrated in FIG. 24, the space between the side surface of the recess 80a and the upper end of the rotary sleeve 82, when viewed from the side of the turntable 2, corresponds to the separation gas ejection hole. This separation gas ejection hole, formed by the space, together with the rotary sleeve 82 and the column 81, form the center area located at the center portion of the vacuum chamber 1.

Figure 25:
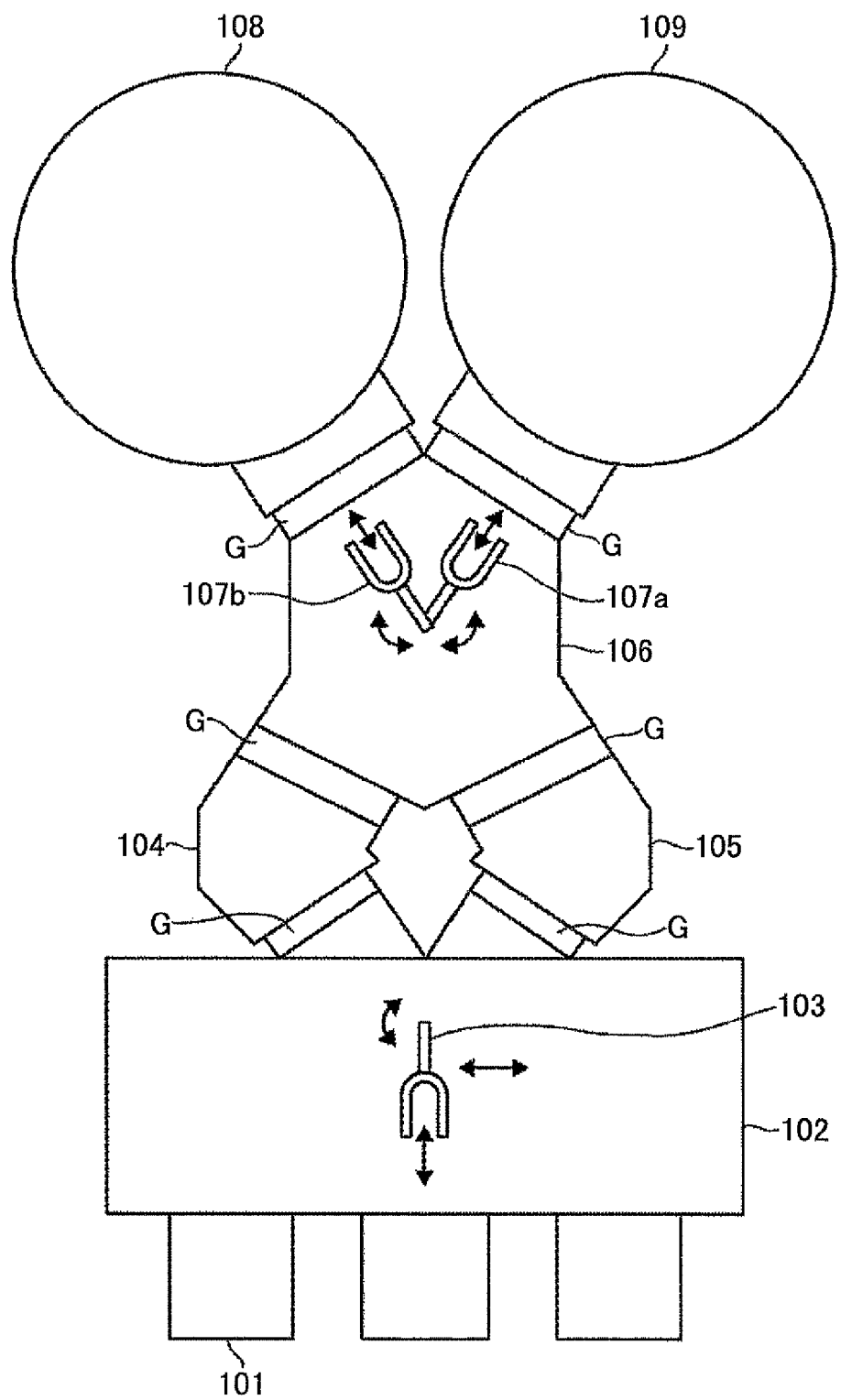
FIG. 25 is a plan view illustrating an example of a substrate processing system using a film deposition apparatus in accordance with the present invention.

Next, a description will be given of a substrate processing apparatus using the film deposition apparatus described above, by referring to FIG. 25. As illustrated in FIG. 25, the substrate processing apparatus includes an enclosure type transport container 101 which is also referred to as a FOUP for accommodating 25 wafers, for example, an atmosphere transport chamber 102 including a transfer arm 103, load lock chambers (or preliminary vacuum chambers) 104 and 105, a vacuum transport chamber 106 including transport arms 107a and 107b, and film deposition apparatuses 108 and 109 of this embodiment. The atmosphere of the load lock chambers 104 and 105 may be switched between the atmosphere and vacuum, that is, an atmospheric environment and a vacuum environment. The transport container 101 is transferred from the outside to a transfer opening having a stage, which is not illustrated. After the transport container 101 is placed on the stage, a lid of the atmosphere transport chamber 102 is opened by an open-close mechanism which is not illustrated, and the wafer is taken out of the transport container 101 by the transfer arm 103. The wafer taken out of the transport container 101 is transferred into the load lock chamber 104 or 105. Then, the inside the load lock chamber 104 or 105 is changed from the atmospheric environment to the vacuum environment. Next, the wafer is taken out of the load lock chamber 104 or 105 by the transfer arm 107a or 107b, and is transferred to the film deposition apparatus 108 or 109. Thereafter, the film deposition process is performed in the film deposition apparatus 108 or 109 according to the film deposition method described above in conjunction with the embodiment. Because the substrate processing apparatus includes a plurality of film deposition apparatuses (two film deposition apparatuses 108 and 109 in this example), and each film deposition apparatus can process five wafers at a time; for example, the film deposition process according to ALD or MLD can be performed with a high throughput.

(Evaluation Test 1)

Figure 26:
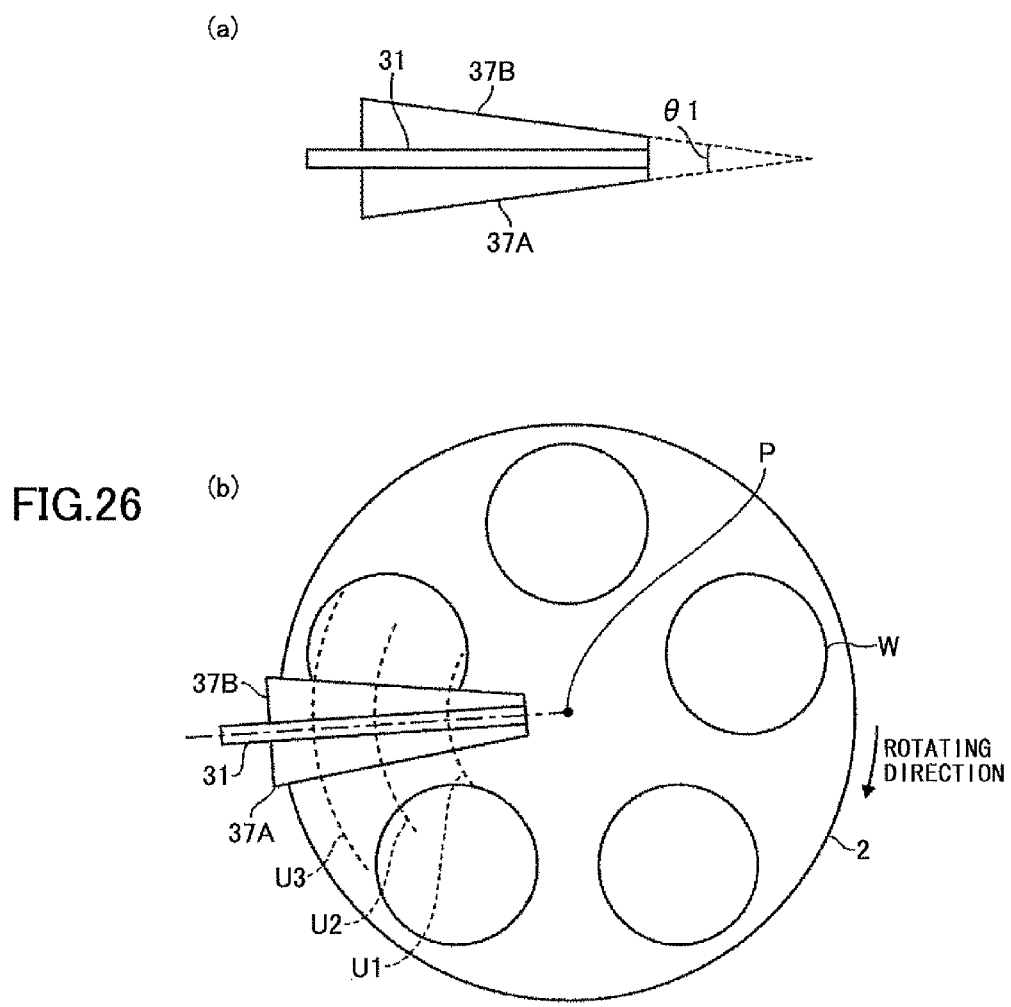
FIG. 26 illustrates top views of a reaction gas nozzle set by a simulation for performing an evaluation test.

Computer simulations have been conducted in order to confirm the effects of the embodiment described above. First, the reaction gas nozzle 31 was provided above the turntable 2 in a manner similar to the embodiment, by simulation. Two reaction gas nozzles 31, one provided with the flow regulation plates 37A and 37B on the lower end thereof as described above in conjunction with FIGS. 17(a) and 17(b), and another not provided with the flow regulation plates 37A and 37B. The rotation speed of the turntable 2 was set to 120 rpm, and the distribution of the reaction gas concentration on the turntable 2 when the reaction gas is ejected from the reaction gas nozzle 31 was observed for the case where the flow regulation plates 37A and 37B are provided and the case where the flow regulation plates 37A and 37B are not provided. An angle θ1 that is formed by extensions of the contours of the flow regulation plates 37A and 37B projecting towards the upstream side and the downstream side in the rotation direction as illustrated in FIG. 26(a) was set to 10°. In addition, measuring regions where the reaction gas concentration was measured were set to regions U1, U2, and U3 indicated by dotted lines in FIG. 26(b) and extending along the rotation direction. These regions U1, U2, and U3 respectively were 160 mm, 310 mm, and 360 mm from a center point P of the turntable 2 towards the peripheral edge of the turntable 2 along the radial direction. Furthermore, the longitudinal direction of the reaction gas nozzle 31 indicated by a one-dot chain line in FIG. 26(b) was regarded as 0°, and the regions U1, U2, and U3 respectively were shifted in a range of 30° or less in the upstream side and the downstream side along the rotation direction about the center point P.

Figure 27:
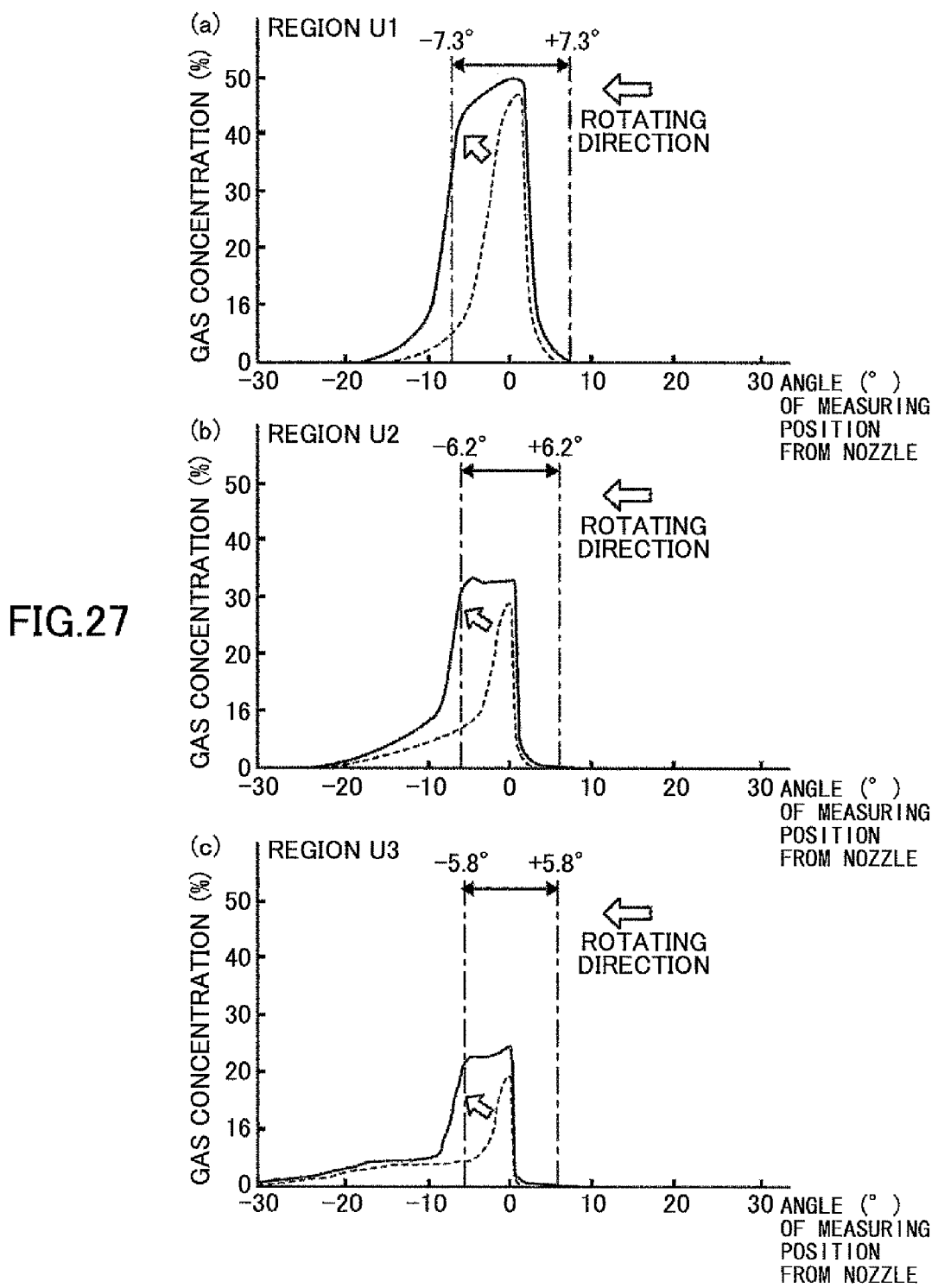
FIG. 27 illustrates graphs of evaluation test results.

Measurement results for the measuring regions U1, U2, U3 are illustrated in FIG. 27(a), 27(b), 27(c), respectively. In each graph, a vertical axis represents a gas concentration (%) of the reaction gas in each measurement points, and a horizontal axis represents the measurement points. A further explanation will be given regarding the horizontal axis. The horizontal axis represents an angle formed between the reaction gas nozzles 31 and a line connecting a point P and the measurement point, assuming that a length direction of the reaction gas nozzle 31 shown by a chain line is set to 0°, where a symbol "+" is given when a measurement point is positioned in the upstream side along the rotation direction in relation to the reaction gas nozzle 31, and a symbol "−" is given when a measurement point is positioned in the downstream side along the rotation direction. In addition, an arrow connecting the chain lines in each graph indicates a region that is covered by the flow regulation plates 37A, 37B and the reaction gas nozzle 31, and corresponds to a range from −7.3° to +7.3° in the region U1, a range from −6.2° to +6.2° in the region U2, and a range from −5.8° to +5.8° in the region U3. Moreover, solid lines indicate measurement results in a case where the flow regulation plates 37A, 37B are provided, and dotted lines indicate measurement results in a case where the flow regulation plates 37A, 37B are not provided.

As clearly understood from each graph, the reaction gas concentration in a region located downstream relative to the rotation direction of the turntable 2 in relation to the reaction gas nozzle 31 becomes increased in each region where the flow regulation plates 37A, 37B are provided, compared to a case where the flow regulation plates 37A, 37B are not provided. Therefore, the effects of the embodiments according to the present invention were verified from the results of the evaluation test 1.

(Evaluation Test 2)

Figure 28:
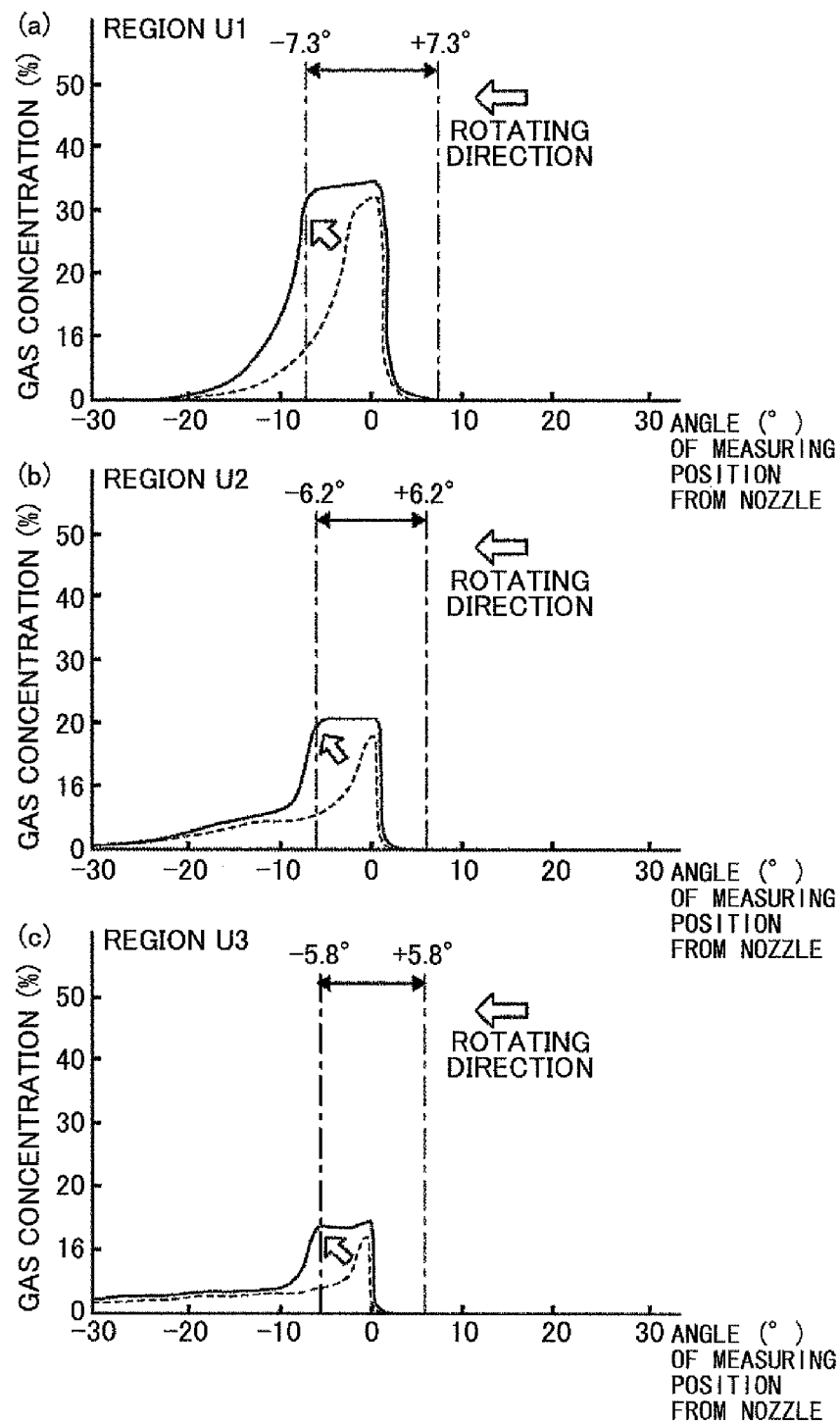
FIG. 28 illustrates graphs of evaluation test results.

Simulation similar to the evaluation test 1 was carried out, with an altered rotation speed of 240 rpm of the turntable 2. FIG. 28(a), 28(b), and FIG. 28(c) illustrate the gas concentrations in the regions U1, U2, U3, respectively. As shown in these graphs, the reaction gas concentration is increased in a region located downstream relative to the rotation direction of the turntable 2 in relation to the reaction gas nozzle 31 in each measurement regions by providing the flow regulation plates 37A, 37B. Therefore, it has been found from the results of the evaluation test 2 that the gas concentration can be effectively increased even at an increased rotation speed of the turntable 2 by providing the flow regulation plates 37A, 37B.

(Evaluation Test 3)

A film deposition was carried out in the film deposition apparatus of the embodiment shown in FIG. 3, and a film thickness was measured along the diameter direction of the turntable 2 from the center to the circumference of the turntable 2 shown by a dotted line as shown in Section (a) of FIG. 30. In addition, a film deposition was carried out without providing the flow regulation plates 36A, 36B to the first reaction gas nozzle 31 and the second reaction gas nozzle 32, and the film thickness was measured along the diameter direction of the turntable 2. In each measurement, the rotation speed of the turntable 2 was 240 rpm and a temperature of the turntable 2 was 350° C.

FIG. 29(b) illustrates a graph of the measurement results of the film thickness. The horizontal axis represents measurement points of the film thickness in the wafer W. The center point P of the turntable 2 is set to 0 mm, and the circumferential edge of the turntable 2 is set to 300 mm. Positions between these points are shown in the horizontal axis. The vertical axis represents a value obtained by dividing a film thickness by the number of the rotations, therefore a film thickness per rotation (nm/the number of rotations). In addition, solid lines in the graph indicate the measurement results when the flow regulation plates 36A, 36B are provided, and dotted lines indicate the measurement results when the flow regulation plates 36A, 36B are not provided. From the graph, it has been found that the film thickness per rotation was increased in every portion of the wafer W when the flow regulation plates 36A, 36B are provided. Therefore, is has been found that a normal film deposition can be carried out even when the rotation speed of the turntable 2 is increased, thereby increasing throughput. Incidentally, while film thickness uniformity is slightly degraded by providing the flow regulation plates 36A, 36B, the film thickness uniformity can be improved by adjusting shapes and intervals of the ejection holes 33 of the reaction gas nozzles 31, 32.

(Evaluation Test 4)

Next, in the same manner as evaluation test 1, the turntable 2 and the reaction gas nozzle 31 provided above the turntable 2 in the same manner in the above embodiment were set by simulation. Regarding the reaction gas nozzle 31, the reaction gas nozzle 31 provided at the bottom end with the flow regulation plates 37A, 37B, shown in FIG. 17(a) and FIG. 17(b), and the reaction gas nozzle 31 without the flow regulation plates 37A, 37B are set. The rotation speed is set to 120 rpm, and the reaction gas distributions above the turntable 2 when the reaction gas is ejected from the reaction gas nozzle 31 are investigated in the cases where the flow regulation plates 37A, 37B are provided and not provided.

FIG. 30(a) illustrates a concentration distribution of the reaction gas when the flow regulation plates 37A, 37B were not provided, and FIG. 30(b) illustrates a concentration distribution of the reaction gas when the flow regulation plates 37A, 37B were provided. Actual simulation results illustrate the reaction gas concentration distributions (unit of measure: %) in the form of computer graphics in a cooler display in a gradational manner. However, FIG. 30(a), FIG. 30(b), FIG. 31(a), and FIG. 31(b) described later outline the concentration distributions, for the sake of illustration. Namely, the concentration is not discretely distributed in FIG. 30(a), FIG. 30(b), FIG. 31(a), and FIG. 31(b) in fact, but there is an abrupt concentration gradient between the areas partitioned by iso-concentration lines in the graphs. It is apparent by comparing FIG. 30(a) and FIG. 30(b) that an atmosphere having high reaction gas concentration is created around the reaction gas nozzle 31 when the flow regulation plates 37A, 37B were provided, compared to a case where the flow regulation plates 37A, 37B are not provided. Therefore, the effects of embodiments of the present invention have been verified.

(Evaluation Test 5)

Next, the simulation was carried out in the same manner as evaluation test 4. However, the rotation speed of the turntable 2 was set to 240 rpm. In the same manner as evaluation test 4, FIG. 31(a) and FIG. 31(b) illustrate the reaction gas concentration distributions when the flow regulation plates 37A, 37B are provided and when the flow regulation plates 37A, 37B are not provided, respectively. It is apparent by comparing Sections FIG. 31(a) and FIG. 31(b), the reaction gas concentration around the reaction gas nozzle 31 is increased by providing the flow regulation plates 37A, 37B. It has been found from this result that an area having a high reaction gas concentration can be created around the reaction gas nozzle 31 even when the rotation speed of the turntable 2 is increased. Therefore, the effects of embodiments of the present invention are verified.

This international application claims priority based on Japanese Patent Applications No. 2008-292508 filed on Nov. 14, 2008 and No. 2009-233047 filed on Oct. 7, 2009 and No. 2009-258644 filed on Nov. 12, 2009 with the Japanese Patent Office, the disclosures of which are hereby incorporated by reference.

The present invention is not limited to these embodiments, but various variations and modifications may be made within the scope of the present invention.

DESCRIPTION OF THE REFERENCE NUMERALS

W wafer
1 vacuum chamber
2 turntable
21 core portion
24 concave portion (substrate receiving portion)
31 first reaction gas nozzle
32 second reaction gas nozzle
34 flow regulation member
35A, 35B flow regulation plates
P1 first process area
P2 second process area
D separation area
C center area
41, 42 separation gas nozzles
4 convex portion
61, 62 evacuation ports
63 evacuation pipe
65 pressure controller
7 heater unit
72, 73 purge gas supplying pipes
81 column

The invention claimed is:

1. A film deposition apparatus for forming a thin film by sequentially supplying at least two kinds of reaction gases to a surface of a substrate and performing such a gas supply cycle a plurality of times to deposit multiple layers of a reaction product in a vacuum chamber, the film deposition apparatus comprising:

a turntable provided in the vacuum chamber;

a substrate receiving area provided in the turntable in order for the substrate to be placed therein;

a first reaction gas supplying portion and a second reaction gas supplying portion that are provided above the turntable, away from each other in a rotation direction of the turntable, and supply a first reaction gas and a second reaction gas, respectively;

a separation area that is positioned between a first process area where the first reaction gas is supplied and a second process area where the second reaction gas is supplied, in order to separate atmospheres of these process areas, and includes a separation gas supplying portion that supplies a separation gas; and an evacuation port that evacuates the vacuum chamber, wherein at least one of the first reaction gas supplying portion and the second reaction gas supplying portion extends in a direction intersecting a direction along which the substrate receiving area moves, and is configured as a gas nozzle in which ejection holes for ejecting a reaction gas toward the turntable are arranged along a longitudinal direction thereof, wherein a flow space for causing the separation gas to flow therethrough is formed above the gas nozzle, and wherein the gas nozzle is provided with a flow regulation member that extends outward in at least one direction of an upstream direction and a downstream direction from the gas nozzle.

2. The film deposition apparatus of claim 1, wherein the flow regulation member extends in both directions of the upstream direction and the downstream direction from the gas nozzle.

3. The film deposition apparatus of claim 1, wherein the flow regulation member is wider in a position drawing away from a center portion of the turntable.

4. The film deposition apparatus of claim 3, wherein the flow regulation member has a fan shape in a plan view such that the flow regulation member increases a width thereof continuously from an inner end closer to a center of the turntable toward an outer end away from the inner end.

5. The film deposition apparatus of claim 1, wherein the separation area is provided with ceiling surfaces that create narrow spaces that allow the separation gas to flow therethrough between the ceiling surface and the turntable, and the ceiling surfaces are positioned on both sides of the separation gas supplying portion along the rotation direction.

6. The film deposition apparatus of claim 1, further comprising a center area that is positioned in a center portion of the vacuum chamber in order to separate the atmospheres of the first process area and the second process area, and is provided with an ejection hole that ejects the separation gas to the surface of the turntable, where the substrate receiving area is formed.

7. The film deposition apparatus of claim 6, wherein the center area is an area partitioned by a rotation center portion of the turntable and an upper portion of the vacuum chamber.

8. The film deposition apparatus of claim 7, wherein the evacuation port is provided so that the reaction gases are evacuated along with the separation gas that spreads toward both sides of the separation area and the separation gas ejected from the center area through the evacuation port.

9. The film deposition apparatus of claim 1, wherein the evacuation ports are provided one on each side of the separation area along the rotation direction in the plan view.

10. The film deposition apparatus of claim 1, wherein the separation gas supplying portion is provided with gas ejection holes that eject the separation gas, and
wherein the ejection holes are arranged from one side to the other side of a rotation center portion and a circumferential portion of the turntable.

11. The film deposition apparatus of claim 1, wherein a portion in a ceiling surface of the separation area, the portion being on the outer circumferential side of the vacuum chamber, is bent in order to oppose an outer circumferential surface of the turntable, thereby constituting a part of an inner circumferential wall of the vacuum chamber, and
wherein a gap between the bent portion of the ceiling surface and the outer circumferential surface of the turntable is set to a size that can provide a preventive effect of the reaction gas flowing thereinto.

12. The film deposition apparatus of claim 1, wherein a portion of a ceiling surface of the separation area on the upstream side of the rotation direction of the turntable with respect to the separation gas supplying portion has a greater width along the rotation direction toward an outer circumference thereof.

13. A film deposition apparatus wherein a turntable on which plural substrates are placed is rotated in a vacuum chamber so that the substrates contact in turn reaction gases that are supplied to plural different process areas, thereby forming a thin film on the substrates, the film deposition apparatus comprising:
a separation area that is provided between the plural process areas and supplies a separation gas that impedes different reaction gases from reacting with each other in a space away from upper surfaces of the substrates;
reaction gas supplying portions that supply the corresponding reaction gases toward the substrates in the vicinities of the substrates and that are away from a ceiling of the process areas;
a flow regulation member that suppresses a concentration of the reaction gas from being lowered by the separation gas that flows into the process area from the separation area and further flows into a gap between the reaction gas supplying portion and the substrate; and
a gas flow passage that is provided between the ceiling of the process area and the reaction gas supplying portion, and to which the flow regulation member guides the separation gas.

14. The film deposition apparatus of claim 13, wherein a height of the ceiling of the process area from an upper surface of the substrate placed on the turntable is higher than that of a ceiling of the separation area from the substrate placed on the turntable.

15. The film deposition apparatus of claim 13, wherein the plural process areas includes a first process area and a second process area having respective, mutually different heights of the ceilings, the reaction gases include a first reaction gas and a second reaction gas different from the first reaction gas, the first reaction gas and the second reaction gas being supplied respectively to the first process area and the second process area.

* * * * *